United States Patent
Yamazaki et al.

(10) Patent No.: US 11,929,416 B2
(45) Date of Patent: Mar. 12, 2024

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Ryo Tokumaru, Isehara (JP); Shinya Sasagawa, Chigasaki (JP); Tomonori Nakayama, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 334 days.

(21) Appl. No.: 17/272,399

(22) PCT Filed: Sep. 2, 2019

(86) PCT No.: PCT/IB2019/057373
§ 371 (c)(1),
(2) Date: Mar. 1, 2021

(87) PCT Pub. No.: WO2020/053697
PCT Pub. Date: Mar. 19, 2020

(65) Prior Publication Data
US 2021/0328037 A1 Oct. 21, 2021

(30) Foreign Application Priority Data
Sep. 13, 2018 (JP) .................. 2018-171617

(51) Int. Cl.
*H01L 29/45* (2006.01)
*H01L 21/441* (2006.01)
(Continued)

(52) U.S. Cl.
CPC .......... *H01L 29/45* (2013.01); *H01L 21/441* (2013.01); *H01L 29/24* (2013.01); *H01L 29/66969* (2013.01); *H01L 29/7869* (2013.01)

(58) Field of Classification Search
CPC H01L 29/24; H01L 29/66969; H01L 29/7869
See application file for complete search history.

(56) References Cited

U.S. PATENT DOCUMENTS 9,219,161 B2  12/2015  Yamazaki
9,780,220 B2  10/2017  Maeda et al.
(Continued)

FOREIGN PATENT DOCUMENTS

EP   3587350 A    1/2020
JP   2014-103388 A  6/2014
(Continued)

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
(Continued)

*Primary Examiner* — Vincent Wall
(74) *Attorney, Agent, or Firm* — Eric J. Robinson; Robinson Intellectual Property Law Office, P.C.

(57) ABSTRACT

A semiconductor device with favorable reliability is provided. The semiconductor device includes a first oxide, a second oxide over the first oxide, a first insulator over the second oxide, a first conductor over the first insulator, and a second conductor and a third conductor over the second oxide. The second conductor includes a first region and a second region, the third conductor includes a third region and a fourth region, the second region is positioned above the first region, the fourth region is positioned above the (Continued)

third region, and each of the second conductor and the third conductor contains tantalum and nitrogen. The atomic ratio of nitrogen to tantalum in the first region is higher than the atomic ratio of nitrogen to tantalum in the second region, and the atomic ratio of nitrogen to tantalum in the third region is higher than the atomic ratio of nitrogen to tantalum in the fourth region.

4 Claims, 21 Drawing Sheets

(51) Int. Cl.
*H01L 29/24* (2006.01)
*H01L 29/66* (2006.01)
*H01L 29/786* (2006.01)

(56) References Cited

U.S. PATENT DOCUMENTS

| | | |
|---|---|---|
| 9,917,207 B2 | 3/2018 | Yamazaki |
| 9,929,279 B2 | 3/2018 | Yamazaki et al. |
| 10,680,116 B2 | 6/2020 | Yamazaki et al. |
| 2006/0022270 A1 | 2/2006 | Boyd et al. |
| 2013/0087833 A1 | 4/2013 | Wang |
| 2014/0110706 A1 | 4/2014 | Yamazaki |
| 2014/0183530 A1 | 7/2014 | Yamazaki et al. |
| 2015/0221774 A1* | 8/2015 | Yamazaki ......... H01L 29/78606 257/43 |
| 2016/0372604 A1* | 12/2016 | Maeda ................. H01L 29/512 |
| 2017/0005168 A1 | 1/2017 | Doornbos et al. |
| 2017/0155003 A1 | 6/2017 | Tokunaga et al. |
| 2017/0186875 A1 | 6/2017 | Yamazaki |
| 2017/0294541 A1 | 10/2017 | Yamazaki |
| 2018/0301559 A1 | 10/2018 | Liaw |
| 2020/0035792 A1 | 1/2020 | Kikuchi et al. |
| 2020/0052127 A1 | 2/2020 | Yamazaki et al. |
| 2020/0075769 A1 | 3/2020 | Yamazaki et al. |

FOREIGN PATENT DOCUMENTS

| | | |
|---|---|---|
| JP | 2015-181151 A | 10/2015 |
| JP | 2015-195277 A | 11/2015 |
| JP | 2017-120896 A | 7/2017 |
| TW | 201831405 | 9/2018 |
| WO | WO-2014/065343 | 5/2014 |
| WO | WO-2015/151564 | 10/2015 |

OTHER PUBLICATIONS

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

International Search Report (Application No. PCT/IB2019/057373) dated Oct. 29, 2019.

Written Opinion (Application No. PCT/IB2019/057373) dated Oct. 29, 2019.

Taiwanese Office Action (Application No. 108131739) dated Mar. 9, 2023.

* cited by examiner

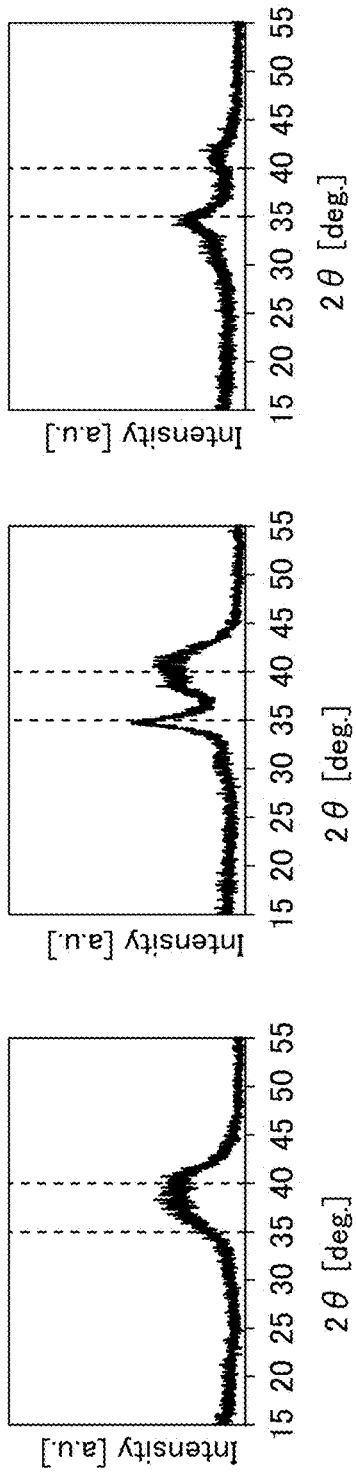

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (e.g. a liquid crystal display device and a light-emitting display device), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a semiconductor thin film that can be used in a transistor, and as another material, an oxide semiconductor has been attracting attention.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, pp. 183-186

[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

An object of one embodiment of the present invention is to provide a semiconductor device with favorable reliability. Another object of one embodiment of the present invention is to provide a semiconductor device having favorable electrical characteristics. Another object of one embodiment of the present invention is to provide a semiconductor device with high on-state current. Another object of one embodiment of the present invention is to provide a semiconductor device that can be miniaturized or highly integrated. Another object of one embodiment of the present invention is to provide a semiconductor device with low power consumption.

Note that the description of these objects does not preclude the existence of other objects. Note that one embodiment of the present invention does not necessarily achieve all of these objects. Other objects are apparent from the description of the specification, the drawings, the claims, and the like, and other objects can be derived from the description of the specification, the drawings, the claims, and the like.

Means for Solving the Problems

One embodiment of the present invention is a semiconductor device including a first oxide, a second oxide over the first oxide, a first insulator over the second oxide, a first conductor over the first insulator, and a second conductor and a third conductor over the second oxide, where the second conductor includes a first region and a second region, where the third conductor includes a third region and a fourth region, where the second region is positioned above the first region, where the fourth region is positioned above the third region, where each of the second conductor and the third conductor contains tantalum and nitrogen, where the atomic ratio of nitrogen to tantalum in the first region is higher than the atomic ratio of nitrogen to tantalum in the second region, and where the atomic ratio of nitrogen to tantalum in the third region is higher than the atomic ratio of nitrogen to tantalum in the fourth region.

In the above semiconductor device, it is preferable that the second conductor include a fifth region in addition to the first region and the second region, that the third conductor include a sixth region in addition to the third region and the fourth region, that the fifth region be positioned above the second region, that the sixth region be positioned above the fourth region, that the atomic ratio of nitrogen to tantalum in the fifth region be higher than the atomic ratio of nitrogen to tantalum in the second region, and that the atomic ratio of nitrogen to tantalum in the sixth region be higher than the atomic ratio of nitrogen to tantalum in the fourth region.

The above semiconductor device preferably includes a second insulator over the second conductor and the third conductor.

Another embodiment of the present invention is a semiconductor device including a first oxide, a second oxide over the first oxide, a first insulator over the second oxide, a first conductor over the first insulator, a second conductor and a third conductor over the second oxide, a fourth conductor over the second conductor, and a fifth conductor over the third conductor, the second conductor and the third conductor are formed using a conductive material having physical properties of extracting hydrogen and having difficulty in being oxidized, and the conductivity of the fourth conductor and the fifth conductor is higher than the conductivity of the second conductor and the third conductor.

In the above semiconductor device, each of the second conductor and the third conductor preferably contains tantalum and nitrogen.

The above semiconductor device preferably includes a second insulator over the fourth conductor and the fifth conductor.

In the above semiconductor device, it is preferable that a sixth conductor be provided over the fourth conductor, that a seventh conductor be provided over the fifth conductor, and that the sixth conductor and the seventh conductor are formed using a conductive material having physical properties of extracting hydrogen and having difficulty in being oxidized.

In the above semiconductor device, each of the second conductor, the third conductor, the sixth conductor, and the seventh conductor preferably contains tantalum and nitrogen.

The above semiconductor device preferably includes the second insulator over the sixth conductor and the seventh conductor.

In the above semiconductor device, the first oxide preferably contains indium, an element M (M is aluminum, gallium, yttrium, or tin), and zinc.

Another embodiment of the present invention is a method for manufacturing a semiconductor device including an oxide, an insulator, and a conductor; the oxide includes a first oxide; the insulator includes a first insulator in contact with the first oxide; and the conductor includes a first conductor in contact with the insulator, a second conductor in contact with the first oxide, and a third conductor in contact with the first oxide. The manufacturing method includes a first step of forming the first oxide, a second step of depositing a conductive film over the first oxide, a third step of processing the conductive film to form the second conductor and the third conductor, and a fourth step of forming the first insulator and the first conductor over the first oxide, the second conductor, and the third conductor. In the second step, a first conductive film and a second conductive film are deposited in this order to be the conductive film in a nitrogen atmosphere, and the proportion of a nitrogen flow rate in the total gas flow rate at the time of depositing the first conductive film is higher than the proportion of a nitrogen flow rate in the total gas flow rate at the time of depositing the second conductive film.

In the method for manufacturing a semiconductor device, the conductive film is preferably deposited by a sputtering method.

In the method for manufacturing a semiconductor device, the conductive film is preferably deposited by an ionization sputtering method.

In the method for manufacturing a semiconductor device, the conductive film is preferably deposited using a tantalum target.

Effect of the Invention

According to one embodiment of the present invention, a semiconductor device with favorable reliability can be provided. According to another embodiment of the present invention, a semiconductor device having favorable electrical characteristics can be provided. According to another embodiment of the present invention, a semiconductor device with high on-state current can be provided. According to another embodiment of the present invention, a semiconductor device that can be miniaturized or highly integrated can be provided. According to one embodiment of the present invention, a semiconductor device with low power consumption can be provided.

Note that the description of the effects does not preclude the existence of other effects. Note that one embodiment of the present invention does not necessarily achieve all of these effects. Other effects are apparent from the description of the specification, the drawings, the claims, and the like, and other effects can be derived from the description of the specification, the drawings, the claims, and the like.

BRIEF DESCRIPTION OF THE DRAWINGS

FIG. 19A to FIG. 19E are graphs showing results of XRD spectra of samples in Example.

MODE FOR CARRYING OUT THE INVENTION

Figure 1A:
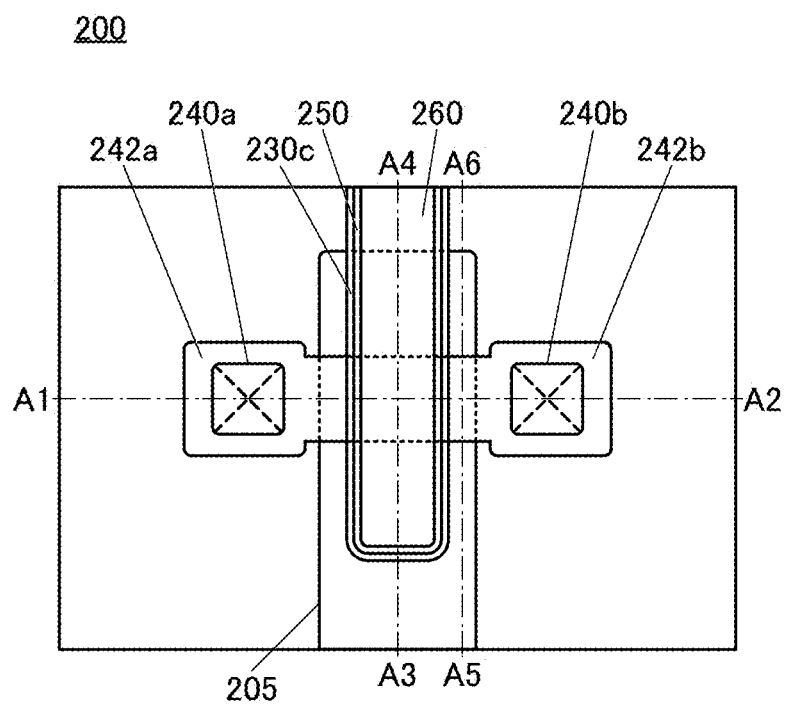
FIG. 1A is a top view of a semiconductor device of one embodiment of the present invention.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Thus, they are not limited to the illustrated scale. Note that the drawings schematically illustrate ideal examples, and embodiments of the present invention are not limited to shapes, values, or the like shown in the drawings. For example, in the actual manufacturing process, a layer, a resist mask, or the like might be unintentionally reduced in size by treatment such as etching, which might not reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, the description of some hidden lines and the like might be omitted.

In this specification and the like, the ordinal numbers such as first and second are used for convenience and do not denote the order of steps or the stacking order of layers. Thus, for example, description can be made when "first" is replaced with "second", "third", or the like, as appropriate. In addition, the ordinal numbers in this specification and the like do not correspond to the ordinal numbers that are used to specify one embodiment of the present invention in some cases.

In this specification and the like, terms for describing arrangement, such as "over" and "under", are used for convenience in describing a positional relationship between components with reference to drawings. Furthermore, the positional relationship between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relationship other than one shown in drawings or texts is disclosed in the drawings or the texts. Here, X and Y denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter, also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Functions of a source and a drain might be switched when a transistor of opposite polarity is employed or when a direction of current flow is changed in circuit operation. Therefore, the terms of source and drain can be interchanged in some cases in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other, or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on transistor structures, a channel width in a region where a channel is actually formed (hereinafter, also referred to as an "effective channel width") is different from a channel width shown in a top view of a transistor (hereinafter, also referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refers to, for example, elements other than the main components of the semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. Entry of an impurity may cause oxygen vacancies in an oxide semiconductor, for example.

Note that in this specification and the like, silicon oxynitride is a material that contains more oxygen than nitrogen in its composition. Moreover, silicon nitride oxide is a material that contains more nitrogen than oxygen in its composition.

In addition, in this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

In this specification and the like, "parallel" indicates a state where two straight lines are placed such that the angle formed therebetween is greater than or equal to −10° and less than or equal to 10°. Thus, the case where the angle is greater than or equal to −5° and less than or equal to 5° is also included. Furthermore, "substantially parallel" indicates a state where two straight lines are placed such that the angle formed therebetween is greater than or equal to −30° and less than or equal to 30°. Moreover, "perpendicular" indicates a state where two straight lines are placed such that the angle formed therebetween is greater than or equal to 80° and less than or equal to 100°. Thus, the case where the angle is greater than or equal to 85° and less than or equal to 95° is also included. In addition, "substantially perpendicular" indicates a state where two straight lines are placed such that the angle formed therebetween is greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, in the case where an OS transistor is stated, an OS transistor can also be referred to as a transistor including a metal oxide or an oxide semiconductor.

In this specification and the like, normally off means drain current per micrometer of channel width flowing through a transistor being $1 \times 10^{-20}$ A or less at room temperature, $1 \times 10^{-18}$ A or less at 85° C., or $1 \times 10^{-16}$ A or less at 125° C. when a potential is not applied to a gate or a ground potential is applied to the gate.

Embodiment 1

In this embodiment, an example of a semiconductor device including a transistor 200 of one embodiment of the present invention is described.

Structure Example of Semiconductor Device

Figure 1B:
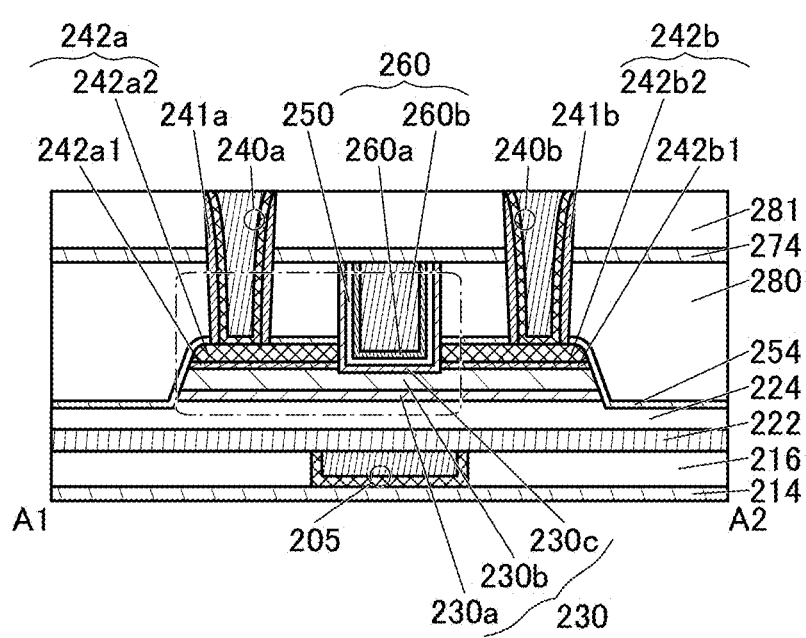
FIG. 1B to FIG. 1D are cross-sectional views of the semiconductor device of one embodiment of the present invention.
Figure 1C:
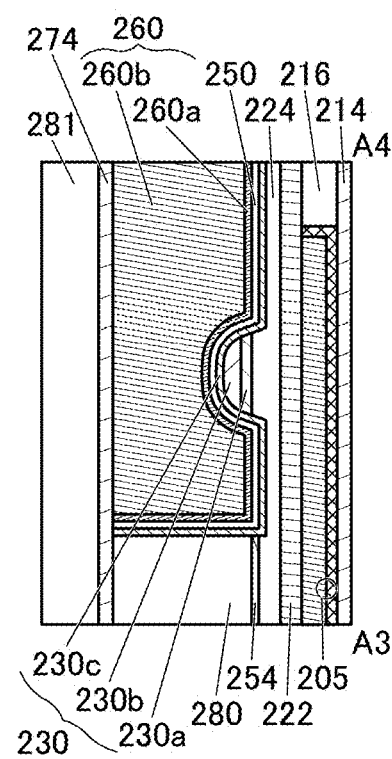
Figure 1D:
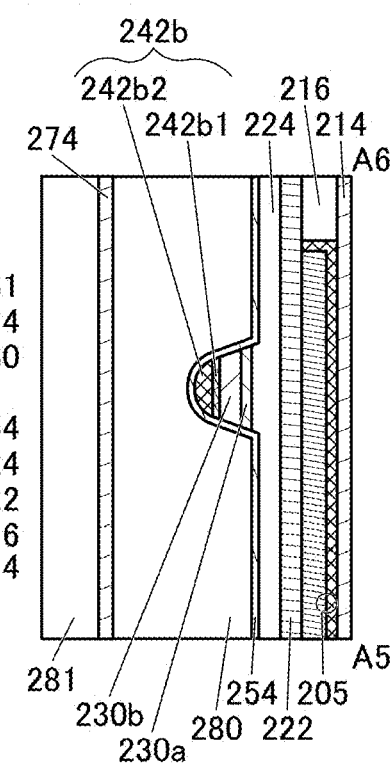

FIG. 1A to FIG. 1D are a top view and cross-sectional views of a semiconductor device including the transistor 200 of one embodiment of the present invention. FIG. 1A is a top view of the semiconductor device. FIG. 1B to FIG. 1D are cross-sectional views of the semiconductor device. Here, FIG. 1B is a cross-sectional view of a portion indicated by a dashed-dotted line A1-A2 in FIG. 1A, and is a cross-sectional view in the channel length direction of the transistor 200. FIG. 1C is a cross-sectional view of a portion indicated by a dashed-dotted line A3-A4 in FIG. 1A, and is a cross-sectional view in the channel width direction of the transistor 200. FIG. 1D is a cross-sectional view of a portion indicated by a dashed-dotted line A5-A6 in FIG. 1A. Note that for clarity of the drawing, some components are not illustrated in the top view of FIG. 1A.

The semiconductor device of one embodiment of the present invention includes the transistor 200, and an insulator 214, an insulator 216, an insulator 280, an insulator 274, and an insulator 281 that function as interlayer films. A conductor 240 (a conductor 240a and a conductor 240b) that is electrically connected to the transistor 200 and functions as a plug is also included. Note that an insulator 241 (an insulator 241a and an insulator 241b) is provided in contact with a side surface of the conductor 240 functioning as a plug.

[Transistor 200]

As illustrated in FIG. 1A to FIG. 1D, the transistor 200 is positioned over a substrate (not illustrated) and includes a conductor 205 to be embedded in the insulator 216; an insulator 222 positioned over the insulator 216 and the conductor 205; an insulator 224 positioned over the insulator 222; an oxide 230 (an oxide 230a, an oxide 230b, and an oxide 230c) positioned over the insulator 224; an insulator 250 positioned over the oxide 230c; a conductor 260 (a conductor 260a and a conductor 260b) positioned over the insulator 250; a conductor 242a (a conductor 242a1 and a conductor 242a2) and a conductor 242b (a conductor 242b1 and a conductor 242b2) in contact with part of the top surface of the oxide 230b; and the insulator 254 positioned in contact with part of the top surface of the insulator 224, a side surface of the oxide 230a, a side surface of the oxide 230b, a side surface and the top surface of the conductor 242a, and a side surface and the top surface of the conductor 242b.

The oxide 230 preferably includes the oxide 230a positioned over the insulator 224, the oxide 230b positioned over the oxide 230a, and the oxide 230c that is positioned over the oxide 230b and is at least partly in contact with the top surface of the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Although a structure in which the oxide 230 has a three-layer stacked structure of the oxide 230a, the oxide 230b, and the oxide 230c in the transistor 200 is described, the present invention is not limited thereto. For example, the oxide 230 may be a single layer of the oxide 230b or has a two-layer structure of the oxide 230a and the oxide 230b, a two-layer structure of the oxide 230b and the oxide 230c, or a stacked-layer structure including four or more layers, and each of the oxide 230a, the oxide 230b, and the oxide 230c may have a stacked-layer structure.

The conductor 242a (the conductor 242a1 and the conductor 242a2) and the conductor 242b (the conductor 242b1 and the conductor 242b2) are provided over the oxide 230b.

The conductor 260 functions as a first gate (also referred to as top gate) electrode of the transistor 200, and the conductor 242a and the conductor 242b function as a source electrode and a drain electrode of the transistor 200.

Figure 2A:
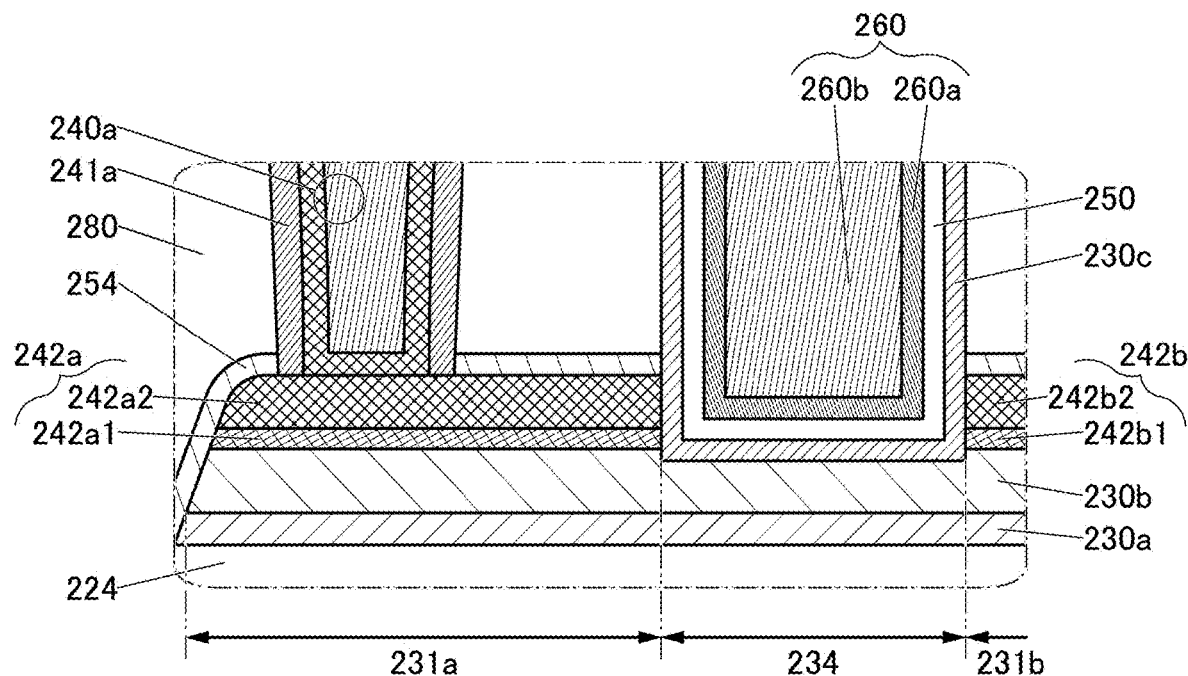
FIG. 2A and FIG. 2B are cross-sectional views of a semiconductor device of one embodiment of the present invention.

An enlarged view of a region surrounded by a dashed dotted line in FIG. 1B is illustrated in FIG. 2A. As illustrated in FIG. 2A, the oxide 230 includes a region 234 functioning as a channel formation region of the transistor 200 and a region 231 (a region 231a and a region 231b) functioning as a source region and a drain region.

Although a structure in which the region 231 and the region 234 are formed in the oxide 230b is illustrated in FIG. 2A, the structure is not limited to this, and for example, the region 231 or the region 234 may be formed in the oxide 230a and the oxide 230b, may be formed in the oxide 230b and the oxide 230c, or may be formed in the oxide 230a, the oxide 230b, and the oxide 230c.

Furthermore, although a boundary between the region 231 and the region 234 is illustrated as being substantially perpendicular to the top surface of the oxide 230b in FIG. 2A, this embodiment is not limited thereto. For example, in some cases, the region 234 extends toward the conductor 240 around the surface of the oxide 230b and is narrowed around the bottom surface of the oxide 230b.

In the transistor 200, a metal oxide functioning as a semiconductor (hereinafter also referred to as an oxide semiconductor) is preferably used in the oxide 230 including the channel formation region. When an oxide semiconductor is used in a channel formation region of a transistor, a transistor having high field-effect mobility can be achieved. In addition, a transistor having high reliability can be achieved.

As the above metal oxide, it is preferable to use a metal oxide having a bandgap of 2.0 eV or more, further preferably 2.5 eV or more. The use of a metal oxide having a wide band gap in the oxide 230 can reduce the off-state current of the transistor. With the use of such a transistor, a semiconductor device with low power consumption can be provided.

The transistor 200 using an oxide semiconductor in the channel formation region has an extremely small leakage current in a non-conduction state; hence, a low-power semiconductor device can be provided. An oxide semiconductor can be deposited by a sputtering method or the like, and thus can be used in the transistor 200 included in a highly integrated semiconductor device.

For example, as the oxide 230, a metal oxide such as an In-M-Zn oxide including indium (In), an element M, and zinc (Zn) (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, an In-M oxide, an In—Zn oxide, or an M-Zn oxide may be used as the oxide 230.

A metal oxide with a low carrier concentration is preferably used as the transistor. In the case where the carrier concentration of the metal oxide is reduced, the impurity concentration in the metal oxide is reduced to reduce the density of defect states. In this specification and the like, a state with a low impurity concentration and a low density of defect states is referred to as a highly purified intrinsic or substantially highly purified intrinsic state. As examples of the impurities in the metal oxide, hydrogen, nitrogen, an alkali metal, an alkaline earth metal, iron, nickel, silicon, and the like are given.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. Moreover, in some cases, a defect that is an oxygen vacancy into which hydrogen enters functions as a donor and generates an electron serving as a carrier. Furthermore, in some cases, bonding of part of hydrogen to oxygen bonded to a metal atom generates electrons serving as carriers. Thus, a transistor using a metal oxide containing much hydrogen is likely to have normally-on characteristics.

Thus, in the case where a metal oxide is used in the oxide 230, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with a sufficiently low concentration of impurities such as hydrogen is used for a channel formation region of a transistor, the transistor can have stable electrical characteristics.

When a metal oxide is used as the oxide 230, contact between the conductor 242 (the conductor 242a and the conductor 242b) and the oxide 230 might make oxygen in the oxide 230 diffuse into the conductor 242, resulting in oxidation of the conductor 242. It is highly possible that oxidation of the conductor 242 lowers the conductivity of the conductor 242. Note that diffusion of oxygen from the oxide 230 into the conductor 242 can be rephrased as absorption of oxygen in the oxide 230 by the conductor 242.

When oxygen in the oxide 230 is diffused into the conductor 242 (the conductor 242a and the conductor 242b), another layer is sometimes formed between the conductor 242a and the oxide 230b, and between the conductor 242b and the oxide 230b. The layer contains more oxygen than the conductor 242 does, and thus the layer is assumed to have an insulating property. In this case, a three-layer structure of the conductor 242, the layer, and the oxide 230b can be regarded as a three-layer structure of a metal, an insulator, and a semiconductor and is sometimes referred to as a MIS (Metal-Insulator-Semiconductor) structure.

Note that the layer is not necessarily formed between the conductor 242 and the oxide 230b; for example, the layer is sometimes formed between the conductor 242 and the oxide 230c, between the conductor 242 and the oxide 230b, and between the conductor 242 and the oxide 230c.

Furthermore, when oxygen in the oxide 230 is diffused into the conductor 242, an oxygen-deficient region is sometimes formed between the layer and the oxide 230b or in the vicinity of the layer of the oxide 230b. The region is a region containing more oxygen vacancies. In this case, a low-resistance region might be formed in part of the region because an impurity (e.g., hydrogen) that has entered oxygen vacancies serves as a donor and accordingly increases the carrier concentration in the region in some cases.

Note that the region 231a and the region 231b each include at least part of the above region. Thus, the region 231 is a low-resistance region with a high carrier concentration. The region 234 has a lower carrier concentration than the region 231.

As the thickness of the layer becomes large, it is highly possible that carrier transfer between the conductor 242 and the oxide 230 is inhibited. In addition, as the thickness of the layer becomes large, the oxygen-deficient region is enlarged. Accordingly, it is highly possible to cause variations in electrical characteristics of transistors, a reduction in reliability of transistors, and the like.

Then, the conductor 242 (the conductor 242a and the conductor 242b) preferably has a stacked-layer structure of two or more layers. For example, the conductor 242 preferably has a stacked-layer structure of two layers in which the conductor 242a1 and the conductor 242b1 are positioned on a side in contact with the oxide 230b, and the conductor 242a2 and the conductor 242b2 are positioned over the conductor 242a1 and the conductor 242b1, respectively, as illustrated in FIG. 1B and FIG. 2A.

A lower layer of the conductor 242 (the conductor 242a1 and the conductor 242b1) is preferably formed using a conductive material having properties of absorbing (extracting) hydrogen easily and having difficulty in being oxidized, for example. In addition, the lower layer of the conductor 242 (the conductor 242a1 and the conductor 242b1) is further preferably formed using a conductive material having properties with which hydrogen in the oxide 230 easily diffuses into the layer and oxygen in the oxide 230 hardly to diffuses into the layer. Thus, when hydrogen in the oxide 230 diffuses into the layer, the hydrogen concentration in the oxide 230 is reduced, and the transistor 200 can have stable electrical characteristics. Furthermore, it is possible to inhibit oxidation of the conductor 242 and a reduction in the conductivity of the conductor 242.

Upper layer of the conductor 242 (the conductor 242a2 and the conductor 242b2) is preferably formed using a conductive material with higher conductivity than that of the lower layer of the conductor 242 (the conductor 242a1 and the conductor 242b1). Alternatively, the upper layer of the conductor 242 is preferably formed using a conductive material with lower resistivity than that of the lower layer of the conductor 242. Thus, a semiconductor device with reduced wiring delay can be fabricated.

Note that the upper layer of the conductor 242 may have a property of absorbing hydrogen easily. Accordingly, hydrogen absorbed by the lower layer of the conductor 242 is diffused into the upper layer of the conductor 242, so that the hydrogen concentration in the oxide 230 can be further reduced. As a result, the transistor 200 can have stable electric characteristics.

Here, for the lower layer of the conductor 242 (the conductor 242a1 and the conductor 242b1) and the upper layer of the conductor 242 (the conductor 242a2 and the conductor 242b2), conductive materials that have the same constituent element and have different chemical compositions are preferably used. In this case, the lower layer of the conductor 242 and the upper layer of the conductor 242 can be deposited successively without being exposed to an atmospheric environment. By the deposition without exposure to the air, impurities or moisture from the atmospheric environment can be prevented from being attached onto surfaces of the lower layer of the conductor 242, so that the vicinity of the interface between the lower layer of the conductor 242 and the upper layer of the conductor 242 can be kept clean.

As the conductive materials, for example, a conductive metal nitride is preferably used. As the metal nitride, a nitride containing tantalum, a nitride containing titanium, a nitride containing molybdenum, a nitride containing tungsten, a nitride containing tantalum and aluminum, a nitride containing titanium and aluminum, or the like can be given, for example. In one embodiment of the present invention, a nitride containing tantalum is particularly preferable. The composition formula of a nitride containing tantalum preferably satisfies TaNx (x is a real number greater than 0 and less than or equal to 1.67). In addition, a nitride containing tantalum may contain oxygen. Thus, examples of the nitride containing tantalum include metal tantalum, tantalum oxide, tantalum nitride, tantalum nitride oxide, and tantalum oxynitride.

When the atomic ratio of nitrogen to tantalum in a nitride containing tantalum is low, the resistivity of the nitride can be reduced. Thus, the nitride is preferably used for the upper layer of the conductor 242. Accordingly, a semiconductor device with reduced wiring delay can be fabricated.

When the atomic ratio of nitrogen to tantalum in a nitride containing tantalum is high, oxidation of the nitride can be inhibited. In addition, oxidation resistance of the nitride can be improved. Moreover, diffusion of oxygen into the nitride can be inhibited. Thus, the nitride is preferably used for the lower layer of the conductor 242. Accordingly, another layer can be prevent from being formed between the lower layer of the conductor 242 and the oxide 230 or can reduce the thickness of the layer. Note that the oxidation resistance of the nitride is described later.

A nitride containing tantalum is a conductive material that easily absorbs hydrogen (making hydrogen diffuse easily) and thus is suitable for the conductor 242. With the use of a nitride containing tantalum for the conductor 242, hydrogen in the oxide 230 can be diffused into the conductor 242 by heat treatment after the step of forming a conductive film to be the conductor 242, whereby the hydrogen concentration in the oxide 230 can be reduced. Furthermore, another layer can be prevented from being formed between the conductor 242 and the oxide 230 or can be prevented from having a large thickness. Oxygen extraction from the oxide 230b can be suppressed even when heat treatment is performed; thus, the transistor 200 is stable with respect to high temperatures in a manufacturing process (what is called thermal budget).

With the use of a nitride containing tantalum for the conductor 242, hydrogen in the oxide 230 can be diffused from the region 231 in the oxide 230 into the conductor 242, whereby the hydrogen concentration in the region 231 can be reduced. The reduction in hydrogen concentration of the region 231 makes hydrogen in the region 234 diffuse into the region 231. In addition, hydrogen in the region 234 sometimes diffuse into the conductor 242 through the oxide 230c. Thus, the hydrogen concentration of the region 234 can be reduced.

The oxygen-deficient region described above is a region containing a large amount of oxygen vacancies. In the oxide 230 containing a metal oxide, hydrogen in an oxygen vacancy is less likely to diffuse than hydrogen bonded to an oxygen atom or hydrogen existing between lattices. Accordingly, the region 231 including an oxygen-deficient region contains a larger amount of hydrogen that is less likely to diffuse than the region 234. That is, hydrogen in the region 234 is more likely to diffuse into the conductor 242 than hydrogen in the region 231. Hence, the hydrogen concentration of the region 234 is lower than the hydrogen concentration of the region 231 in some cases.

Note that hydrogen diffused into the conductor 242 sometimes remains in the conductor 242. That is, hydrogen in the oxide 230 is absorbed by the conductor 242 in some cases. In particular, when hydrogen is diffused into a nitride containing tantalum with a high atomic ratio of nitrogen to tantalum, the hydrogen is bonded to nitrogen, whereby the hydrogen is likely to remain in the nitride in some cases. In other cases, hydrogen in the oxide 230 passes through the conductor 242 and is released to a component provided around the conductor 242 or the outside of the transistor 200.

Accordingly, the hydrogen concentration in the oxide 230 can be lowered. Thus, the transistor 200 can have favorable electrical characteristics and reliability.

Note that in the conductor 242, it is difficult to detect the boundaries between the upper layer and the lower layer clearly in some cases. In the case where a nitride containing tantalum is used for the conductor 242, tantalum concentration and nitrogen concentration detected in each layer may not only gradually change within each layer, but also continuously change (also referred to as a change in a gradation manner) in regions between the upper layer and the lower layer. That is, the region in the conductor 242 closer to the region 231 preferably has a high atomic ratio of nitrogen to tantalum. Thus, the atomic ratio of nitrogen to tantalum in a region positioned below the conductor 242 is preferably higher than the atomic ratio of nitrogen to tantalum in a region positioned above the conductor 242.

Although an example in which the lower layer of the conductor 242 (the conductor 242a1 and the conductor 242b1) and the upper layer of the conductor 242 (the conductor 242a2 and the conductor 242b2) have conductive materials having the same constituent element and having different chemical compositions is shown, one embodiment of the present invention is not limited to this, and the lower layer of the conductor 242 and the upper layer of the conductor 242 may be formed using different conductive materials.

Figure 2B:
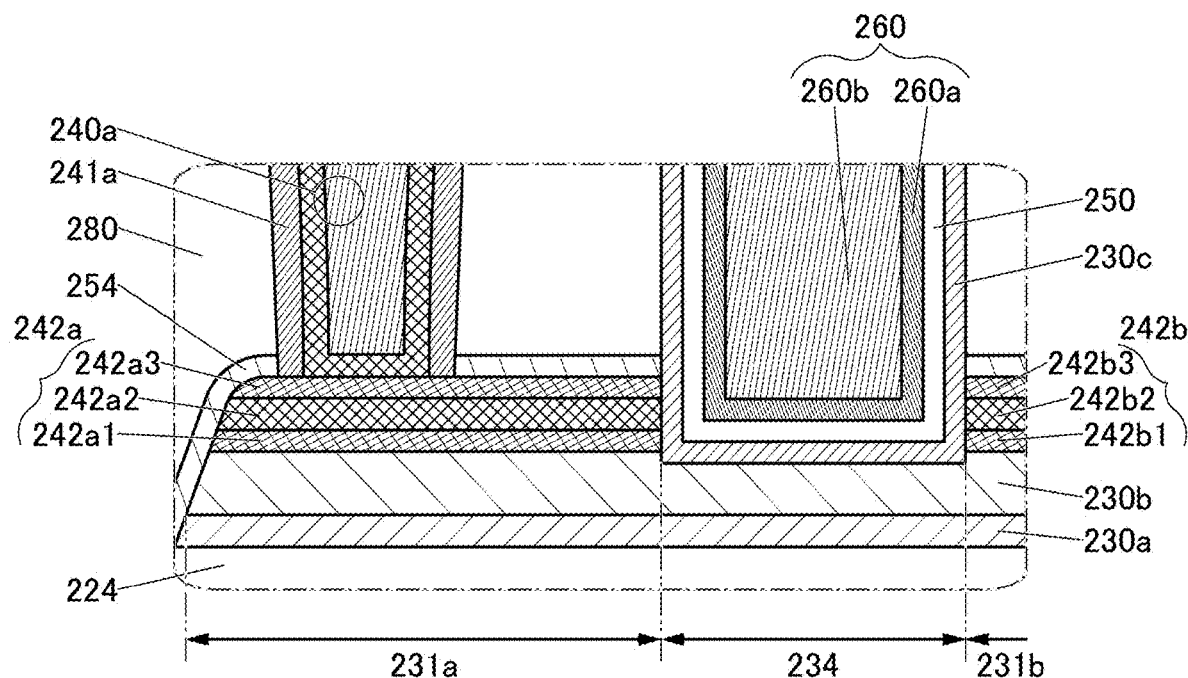

As illustrated in FIG. 2B, the conductor 242 may have a stacked-layer structure of three layers in which the conductor 242a1 and the conductor 242b1 are provided on a side in contact with the oxide 230b, the conductor 242a2 and the conductor 242b2 are provided over the conductor 242a1 and the conductor 242b1, respectively, and a conductor 242a3 and a conductor 242b3 are provided over the conductor 242a2 and the conductor 242b2, respectively.

The conductor 242a3 and the conductor 242b3 are preferably formed using a conductive material having properties of absorbing (extracting) hydrogen easily and having difficulty in being oxidized, like the conductor 242a1 and the conductor 242b1. A nitride containing tantalum, which has higher atomic ratio of nitrogen to tantalum than that of the nitride containing tantalum used for the conductor 242a2 and the conductor 242b2, is preferably used. Accordingly, oxidation of the conductor 242 due to oxygen in an oxide positioned above the conductor 242 can be inhibited.

The conductor 242 may be formed using a conductive material with which hydrogen in the oxide 230 easily diffuses into the conductor 242, and another layer may be formed between the conductor 242 and the oxide 230.

With the use of a nitride containing tantalum in the conductor 242, another layer with a small thickness can be formed. Specifically, the thickness of the layer can be greater than or equal to 0.1 nm and less than or equal to 4 nm, preferably greater than or equal to 0.5 nm and less than or equal to 3 nm. Accordingly, hydrogen in the oxide 230 can be diffused into the conductor 242 through the layer, so that the hydrogen concentration in the region 234 can be reduced.

Note that, for example, the thickness of the layer represents a difference between a position of the interface between the layer and the oxide 230b and a position between the interface between the bottom surface of the conductor 242a (the conductor 242b) and the layer. At this time, the thickness of the layer can sometimes be measured by observing cross-sectional shapes of the layer and its vicinity with a transmission electron microscope (TEM) or the like.

Furthermore, the thickness of the layer can sometimes be calculated by composition line analysis of the layer and its vicinity with energy dispersive X-ray spectroscopy (EDX). To calculate the thickness of the layer, first, the layer and its vicinity are subjected to EDX line analysis, with the direction of stacking the conductor 242, the layer, and the oxide 230b (e.g., the direction perpendicular to the substrate surface) as the depth direction. Next, in the profile of quantitative values of elements in the depth direction, which is obtained from the analysis, the depth (position) of the interface between the layer and the oxide 230b is regarded as a depth at which the quantitative value of a metal that is the main component of the oxide 230b but is not the main component of the conductor 242a (the conductor 242b) becomes half. Moreover, the depth (position) of the interface between the bottom surface of the conductor 242a (the conductor 242b) and the layer is regarded as a depth at which the quantitative value of oxygen of the oxide 230b becomes half. In this manner, the thickness of the layer can be calculated.

Another layer sometimes has an insulating property because it contains tantalum and oxygen. In this case, an MIS structure is configured with the conductor 242, the layer, and the oxide 230. Such a structure prevents the conductor 242 and the oxide 230 from being in contact with each other and thus can inhibit deterioration of the interface between the conductor 242 and the oxide 230 by heat treatment. Moreover, the small thickness of the layer makes current flow easily between the conductor 242 and the oxide 230, so that the reliability of the transistor can be improved.

When another layer has low hydrogen permeability, for example, hydrogen in the region 234 might diffuse into the conductor 242 through the oxide 230c and the insulator 254 or through the oxide 230c, the insulator 280, and the insulator 254. That is, the above conductive material forming the conductor 242 is not limited to having the physical property of extracting hydrogen in the oxide 230; the physical property of extracting hydrogen from at least one of the components provided around the conductor 242 is preferably included. Thus, the hydrogen concentration of the region 234 can be reduced in some cases.

In order to reduce the hydrogen concentration of the oxide 230 and to inhibit formation of another layer between the conductor 242 and the oxide 230, it is preferable that the conductor 242 be formed using a conductive material with which hydrogen in the oxide 230 diffuses easily into the conductor 242, and that a layer having a function of inhibiting oxidation of the conductor 242 be provided between the conductor 242 and the oxide 230. By providing the layer, the conductor 242 and the oxide 230 are not in contact with each other, so that the conductor 242 can be inhibited from absorbing oxygen in the oxide 230.

For example, an oxide having a function of inhibiting passage of oxygen may be provided between the conductor 242 (the conductor 242a and the conductor 242b) and the oxide 230b. It is preferable to provide an oxide having a function of inhibiting passage of oxygen between the conductor 242 that functions as a source electrode or a drain electrode, and the oxide 230b, in which case the electrical resistance between the conductor 242 and the oxide 230b is reduced. Such a structure improves the electrical characteristics of the transistor 200 and the reliability of the transistor 200.

A metal oxide containing the element M may be used as the oxide. In particular, aluminum, gallium, yttrium, or tin is preferably used as the element M. The concentration of the element M in the oxide is preferably higher than that in the oxide 230b. Alternatively, gallium oxide may be used as the oxide. A metal oxide such as an In-M-Zn oxide may be used as the oxide. Specifically, the atomic ratio of the element M to In in the metal oxide used as the oxide is preferably greater than the atomic ratio of the element M to In in the metal oxide used as the oxide 230b. The thickness of the oxide is preferably greater than or equal to 0.5 nm and less than or equal to 5 nm, further preferably greater than or equal to 1 nm and less than or equal to 3 nm, still further preferably greater than or equal to 1 nm and less than or equal to 2 nm. The oxide preferably has crystallinity. In the case where the oxide has crystallinity, release of oxygen from the oxide 230 can be favorably inhibited. When the oxide has a hexagonal crystal structure, for example, release of oxygen from the oxide 230 can sometimes be inhibited.

In the case where the oxide is provided, the upper layer of the conductor 242 (the conductor 242a2 and the conductor 242b2) may be formed using a conductive material having properties of absorbing hydrogen easily and having difficulty in being oxidized, and the lower layer of the conductor 242 (the conductor 242a1 and the conductor 242b1) may be formed using a conductive material having a higher conductivity than that of the upper layer of the conductor 242.

With the above structure, the hydrogen concentration of the oxide 230 can be reduced. Thus, the transistor 200 can have favorable electrical characteristics and reliability.

According to the above, a semiconductor device with favorable reliability can be provided. In addition, a semiconductor device having favorable electrical characteristics can be provided. A semiconductor device that can be miniaturized or highly integrated can be provided. A semiconductor device with low power consumption can be provided.

<Oxidation Resistance of a Nitride Containing Tantalum>

Oxidation resistance of a nitride containing tantalum ($TaN_x$) depending on the difference of the composition(x) is described below. Here, the oxidation resistance of the nitride is examined by the ease of existence of oxygen atoms in the nitride. Specifically, formation energy is obtained by calculation to examine the ease of the oxygen atoms existing in the nitride.

In this calculation, six calculation models (crystal models of tantalum nitride and a crystal model of metal tantalum (Ta)) shown Table 1 are prepared. Here, tantalum nitride in which the chemical composition of tantalum and nitrogen is A:B is referred to as $Ta_A N_B$. Alternatively, tantalum nitride in which the atomic ratio of nitrogen to tantalum is x is referred to as $TaN_x$. Note that the value of x is the same as the value of B/A.

TABLE 1

| Calculation models | $TaN_x$ x | Number of atoms | | k-point grid |
|---|---|---|---|---|
| | | Ta | N | |
| $Ta_3N_5$ | 1.67 | 36 | 60 | 2 × 2 × 2 |
| $Ta_4N_5$ | 1.25 | 24 | 30 | 4 × 4 × 2 |
| $Ta_5N_6$ | 1.20 | 40 | 48 | 2 × 2 × 2 |
| TaN | 1.00 | 32 | 32 | 3 × 3 × 3 |
| $Ta_2N$ | 0.50 | 54 | 27 | 3 × 3 × 2 |
| Ta | 0 | 54 | 0 | 3 × 3 × 3 |

The number of atoms shown in Table 1 is the number of each element included in the calculation models. K-point grid shown in Table 1 is the number of k-point grids that is set when the calculation using the models is performed.

Next, one oxygen atom is added to an interstitial site of each calculation model shown in Table 1 and first principles calculation is performed, whereby structural optimization is performed on each model. Then, total energies E ($TaN_x:O_{int}$) of the models on which the structural optimization has been performed are derived. Note that the calculation conditions are shown in Table 2. As software, VASP (Vienna Ab initio Simulation Package) is used. In addition, for an exchange-correlation functional, PBE (Perdew-Burke-Ernzerhof) type generalized gradient approximation (GGA) is used, and for a pseudopotential of an ion, a PAW (Projector Augmented Wave) method is used. Cut-off energy is set to 800 eV.

TABLE 2

| Software | VASP |
|---|---|
| Functional | GGA-PBE |
| Pseudopotential | PAW |
| Cut-off energy | 800 eV |
| Charge in the whole system | Neutral |

Formation energy ($E_{form}(O_{int})$) of the calculation models can be calculated using the following Formula (1). Note that as the value of $E_{form}(O_{int})$ is larger, it can be estimated that an oxygen atom is less likely to exist in an interstitial site of the calculation model. That is, as the value of $E_{form}(O_{int})$ is larger, the oxidation resistance is estimated to be high.

[Formula 1]

$$E_{form}(O_{int})=E(TaN_x:O_{int})-E(TaN_x)-\mu(O) \quad (1)$$

In the above formula, $E(TaN_x)$ represents a total energy of a calculation model in which an oxygen atom is not added to an interstitial site, and $\mu(O)$ represents a chemical potential of an oxygen atom. Here, the value of $\mu(O)$ is set to half of the total energy value of oxygen molecules.

The formation energy ($E_{form}(O_{int})$) of each calculation model, which is calculated using Formula (1), is shown in Table 3.

TABLE 3

| Calculation models | TaNx x | $E_{form}(O_{int})$ [eV] |
|---|---|---|
| Ta$_3$N$_5$ | 1.67 | −0.56 |
| Ta$_4$N$_5$ | 1.25 | 1.27 |
| Ta$_5$N$_6$ | 1.20 | 1.26 |
| TaN | 1.00 | 0.35 |
| Ta$_2$N | 0.50 | −2.16 |
| Ta | 0 | −3.60 |

From Table 3, it is found that the $E_{form}(O_{int})$ value of the crystal model of tantalum nitride is larger than the $E_{form}(O_{int})$ value of the crystal model of metal tantalum. Thus, it is estimated that a nitride containing tantalum has oxidation resistance.

Figure 3A:
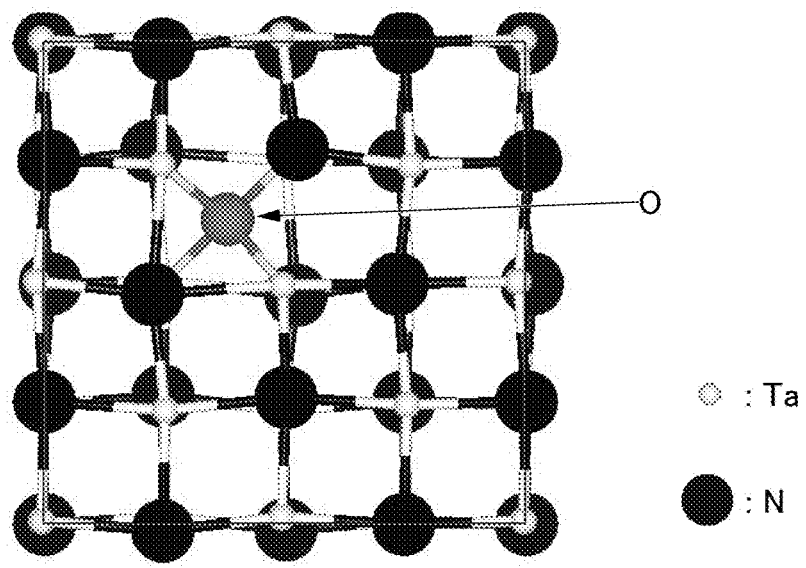
FIG. 3A and FIG. 3B are views illustrating calculation models after structural optimization is performed.
Figure 3B:
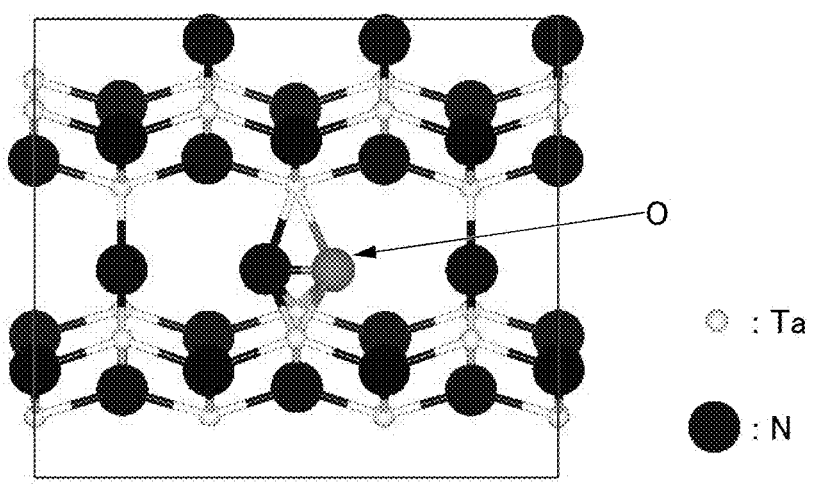

Calculation models after structural optimization is performed are illustrated in FIG. 3A and FIG. 3B. FIG. 3A illustrates arrangement of an oxygen atom and atoms in its vicinity after structural optimization is performed on a crystal model of tantalum nitride (TaN) to which one oxygen atom is added is performed. FIG. 3B illustrates arrangement of an oxygen atom and atoms in its vicinity after structural optimization is performed on a crystal model of tantalum nitride (Ta$_3$N$_5$) to which one oxygen atom is added.

From FIG. 3A, it is observed that the distance between the oxygen atom and tantalum atoms is short and the distance between the oxygen atom and nitrogen atoms is large in the crystal model of tantalum nitride (TaN). That is, it is suggested that a bond between the oxygen atom and the tantalum atoms is formed. According to FIG. 3B, it is suggested that a bond between the oxygen atom and tantalum atoms is formed in the crystal model of tantalum nitride (Ta$_3$N$_5$) as in the crystal model of tantalum nitride (TaN).

The above indicates that an oxygen atom in a nitride containing tantalum is bonded to tantalum atoms.

<Specific Structure of Semiconductor Device>

The detailed structure of the semiconductor device including the transistor 200 according to one embodiment of the present invention is described below.

The insulator 214 preferably functions as an insulating barrier film that inhibits diffusion of impurities such as water and hydrogen into the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule (N$_2$O, NO, NO$_2$, or the like), and a copper atom. Alternatively, it is preferable to use an insulating material having a function of inhibiting diffusion of oxygen (e.g., at least one of an oxygen atom, an oxygen molecule, and the like).

Note that in this specification, a function of inhibiting diffusion of impurities or oxygen means a function of inhibiting diffusion of any one or all of the impurities and the oxygen. A film having a function of inhibiting diffusion of hydrogen or oxygen may be referred to as a film through which hydrogen or oxygen does not pass easily, a film having low permeability of hydrogen or oxygen, a film having a barrier property against hydrogen or oxygen, or a barrier film against hydrogen or oxygen, for example. A barrier film having conductivity is sometimes referred to as a conductive barrier film.

For example, aluminum oxide, silicon nitride, or the like is preferably used for the insulator 214. Accordingly, impurities such as water and hydrogen can be inhibited from being diffused into the transistor 200 side from the side closer to the substrate than the insulator 214. Alternatively, oxygen contained in the insulator 224 and the like can be inhibited from being diffused into the substrate side through the insulator 214. Note that the insulator 214 may have a stacked-layer structure of two or more layers. In that case, without limitation to a stacked-layer structure formed of the same material, a stacked-layer structure formed of different materials may be employed. For example, a stacked layer of aluminum oxide and silicon nitride may be employed.

For example, silicon nitride deposited by a sputtering method is preferably used as the insulator 214. Accordingly, the hydrogen concentration in the insulator 214 can be low, and impurities such as water and hydrogen can be inhibited from being diffused into the transistor 200 side from the side closer to the substrate than the insulator 214.

The permittivity of the insulator 216 functioning as an interlayer film is preferably lower than that of the insulator 214. When a material having a low permittivity is used for an interlayer film, parasitic capacitance generated between wirings can be reduced. For example, as the insulator 216, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The insulator 216 preferably includes a region that has a low hydrogen concentration and contains oxygen in excess of that in the stoichiometric composition (hereinafter also referred to as an excess-oxygen region), or preferably contains oxygen that is released by heating (hereinafter also referred to as excess oxygen). For example, silicon oxide deposited by a sputtering method is preferably used as the insulator 216. This can inhibit entry of hydrogen into the oxide 230 or reduce oxygen vacancies in the oxide 230 by supplying oxygen to the oxide 230. Thus, a transistor that has stable electrical characteristics with a small variation in electrical characteristics and improved reliability can be provided.

Note that the insulator 216 may have a stacked-layer structure. For example, the insulator 216 may have a structure where an insulator similar to the insulator 214 is provided at least in a portion that is in contact with a side surface of the conductor 205. With such a structure, oxidization of the conductor 205 due to oxygen contained in the insulator 216 can be inhibited. Alternatively, reduction in the amount of oxygen contained in the insulator 216 due to the conductor 205 can be inhibited.

The conductor 205 sometimes functions as a second gate (also referred to as bottom gate) electrode. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, drain current when a potential applied to the conductor 260 is 0 V can be lower in the case where a negative potential is applied to the conductor 205 than in the case where the negative potential is not applied to the conductor 205.

The conductor 205 is provided to overlap with the oxide 230 and the conductor 260. Furthermore, the conductor 205 is preferably provided to be embedded in the insulator 214 or the insulator 216.

Note that as illustrated in FIG. 1B, the conductor 205 is preferably provided larger than the channel formation region of the oxide 230. As illustrated in FIG. 1C, it is particularly preferable that the conductor 205 extend to a region outside an end portion of the oxide 230 that intersects with the channel width direction. That is, the conductor 205 and the conductor 260 preferably overlap with each other with the insulators therebetween on an outer side of the side surface of the oxide 230 in the channel width direction. A large conductor 205 can sometimes reduce local charging (referred to as charge up) in treatment using plasma after the formation of the conductor 205 in the manufacturing process. Note that one embodiment of the present invention is not limited thereto. The conductor 205 overlaps with at least the oxide 230 positioned between the conductor 242a and the conductor 242b.

With the above structure, the channel formation region of the oxide 230 can be electrically surrounded by electric field of the conductor 260 functioning as a first gate and electric field of the conductor 205 functioning as a second gate.

As illustrated in FIG. 1D, side surfaces and a periphery of the oxide 230b, which is in contact with the conductor 242a and the conductor 242b functioning as a source electrode and a drain electrode, are in contact with the insulator 254. In the case where an oxide is used for the insulator 254, oxygen in the insulator 254 might be provided to the side surfaces and the periphery of the oxide 230b, or oxygen on the side surfaces and the periphery of the oxide 230b might be prevented from being diffused into the insulator 254. Thus, the side surfaces and the periphery of the oxide 230b can serve as I-type, like the channel formation region. Note that in this specification and the like, "I-type" can be equated with "highly purified intrinsic" described above.

In this specification and the like, a transistor structure, in which a channel formation region is electrically surrounded by electric fields of a first gate and a second gate, and side surfaces and a periphery of the oxide 230b, which are in contact with the conductor 242a and the conductor 242b functioning as a source electrode and a drain electrode, serve as I-type like the channel formation region, is referred to as a surrounded channel (S-channel) structure. Note that the S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as illustrated in FIG. 1C, the conductor 205 is extended to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Note that although the transistor 200 having a structure in which the first conductor of the conductor 205 and the second conductor of the conductor 205 are stacked is illustrated, the present invention is not limited thereto. For example, the conductor 205 may have a single-layer structure or a stacked-layer structure of three or more layers. In the case where a structure body has a stacked-layer structure, layers may be distinguished by ordinal numbers corresponding to the formation order.

Here, for the first conductor of the conductor 205, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When a conductive material having a function of inhibiting oxygen diffusion is used for the first conductor of the conductor 205, a reduction in the conductivity of the second conductor of the conductor 205 due to oxidation can be inhibited. As a conductive material having a function of inhibiting diffusion of oxygen, for example, tantalum, tantalum nitride, ruthenium, or ruthenium oxide is preferably used. Accordingly, the first conductor of the conductor 205 is a single layer or stacked layers of the above conductive materials. For example, the first conductor of the conductor 205 may be a stack of tantalum, tantalum nitride, ruthenium, or ruthenium oxide and titanium or titanium nitride.

A conductive material containing tungsten, copper, or aluminum as its main component is preferably used for the second conductor of the conductor 205. Note that the second conductor of the conductor 205 is a single layer in the drawing but may have a stacked-layer structure, for example, a stacked-layer structure of the above conductive material and titanium or titanium nitride.

The insulator 222 and the insulator 224 each have a function as a gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

As the insulator 222, an insulator containing an oxide of one or both of aluminum and hafnium, which is an insulating material, is preferably used. It is preferable that aluminum oxide, hafnium oxide, an oxide containing aluminum and hafnium (hafnium aluminate), or the like be used for the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used as the insulator 222.

Alternatively, for example, a single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used as the insulator 222. With miniaturization and high integration of transistors, a problem such as leakage current may arise because of a thinner gate insulator. When a high-k material is used for an insulator functioning as the gate insulator, a gate potential during operation of the transistor can be lowered while the physical thickness of the gate insulator is kept.

It is preferable that oxygen be released from the insulator 224 in contact with the oxide 230 by heating. For example, silicon oxide, silicon oxynitride, or the like is used as appropriate for the insulator 224. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide film that releases oxygen by heating is an oxide film in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

The insulator 224 preferably has a low hydrogen concentration and includes an excess-oxygen region or excess oxygen, and may be formed using a material similar to that for the insulator 216, for example.

Note that the insulator 222 and the insulator 224 may each have a stacked-layer structure of two or more layers. In that case, without limitation to a stacked-layer structure formed of the same material, a stacked-layer structure formed of different materials may be employed.

The oxide 230 preferably has a stacked-layer structure using oxides with different chemical compositions. Specifically, the atomic ratio of the element M to metal elements of main components in the metal oxide used as the oxide 230a is preferably greater than the atomic ratio of the element M to metal elements of main components in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

The oxide 230b and the oxide 230c preferably have crystallinity. For example, a CAAC-OS (c-axis aligned crystalline oxide semiconductor) described later is preferably used. An oxide having crystallinity, such as a CAAC-OS, has a dense structure with small amounts of impurities and defects (oxygen vacancies or the like) and high crystallinity. This can inhibit oxygen extraction from the oxide 230b by the source electrode or the drain electrode. Accordingly, oxygen extraction from the oxide 230b can be reduced even when heat treatment is performed; hence, the transistor 200 is stable with respect to high temperatures in a manufacturing process (what is called thermal budget).

In addition, a CAAC-OS is preferably used for the oxide 230c; the c-axis of a crystal included in the oxide 230c preferably aligned in a direction substantially perpendicular to the formation surface or the top surface of the oxide 230c. The CAAC-OS has a property such that oxygen is likely to be moved in a direction perpendicular to the c-axis. Accordingly, oxygen contained in the oxide 230c can be efficiently supplied to the oxide 230b.

The conduction band minimum of each of the oxide 230a and the oxide 230c is preferably closer to the vacuum level than the conduction band minimum of the oxide 230b. In other words, the electron affinity of each of the oxide 230a and the oxide 230c is preferably smaller than the electron affinity of the oxide 230b. In this case, a metal oxide that can be used as the oxide 230a is preferably used as the oxide 230c. At this time, the oxide 230b serves as a main carrier path.

Here, the conduction band minimum gradually changes at a junction portion of the oxide 230a, the oxide 230b, and the oxide 230c. In other words, the conduction band minimum at a junction portion of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, when the oxide 230a and the oxide 230b or the oxide 230b and the oxide 230c contain the same element as a main component in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like may be used as the oxide 230a and the oxide 230c.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=1:1:1 [atomic ratio] or In:Ga:Zn=4:2:3 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used.

In the case where the metal oxide is deposited by a sputtering method, the atomic ratio is not limited to the atomic ratio of the deposited metal oxide and may be the atomic ratio of a sputtering target used for depositing the metal oxide.

When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and high frequency characteristics.

The oxide 230c may have a stacked-layer structure of two or more layers. For example, a first oxide of the oxide 230c and a second oxide of the oxide 230c positioned over the first oxide of the oxide 230c may be included.

The first oxide of the oxide 230c preferably contains at least one of the metal elements contained in the metal oxide used as the oxide 230b, and further preferably contains all of these metal elements. For example, it is preferable that an In—Ga—Zn oxide be used as the first oxide of the oxide 230c, and an In—Ga—Zn oxide, a Ga—Zn oxide, or gallium oxide be used as the second oxide of the oxide 230c. Accordingly, the density of defect states at the interface between the oxide 230b and the first oxide of the oxide 230c can be made low. The second oxide of the oxide 230c is preferably a metal oxide that inhibits diffusion or passage of oxygen, compared to the first oxide of the oxide 230c. Providing the second oxide of the oxide 230c between the insulator 250 and the first oxide of the oxide 230c can inhibit diffusion of oxygen contained in the insulator 280 into the insulator 250. Thus, the oxygen is more likely to be supplied to the oxide 230b through the first oxide of the oxide 230c.

The conduction band minimum of each of the oxide 230a and the second oxide of the oxide 230c is preferably closer to the vacuum level than the conduction band minimum of each of the oxide 230b and the first oxide of the oxide 230c. In other words, the electron affinity of each of the oxide 230a and the second oxide of the oxide 230c is preferably smaller than the electron affinity of each of the oxide 230b and the first oxide of the oxide 230c. In this case, it is preferable that the second oxide of the oxide 230c be formed using a metal oxide that can be used as the oxide 230a, and the first oxide of the oxide 230c be formed using a metal oxide that can be used as the oxide 230b. At this time, the oxide 230b and the first oxide of the oxide 230c serve as main carrier paths in some cases.

Specifically, a metal oxide with In:Ga:Zn=4:2:3 [atomic ratio] is used as the first oxide of the oxide 230c and a metal oxide with In:Ga:Zn=1:3:4 [atomic ratio], Ga:Zn=2:1 [atomic ratio], or Ga:Zn=2:5 [atomic ratio], or gallium oxide is used as the second oxide of the oxide 230c. Accordingly, the density of defect states at the interface between the first oxide of the oxide 230c and the second oxide of the oxide 230c can be made low.

When the atomic ratio of In to the metal element that is the main component in the metal oxide used as the second oxide of the oxide 230c is smaller than the atomic ratio of In to the metal element that is the main component in the metal oxide used as the first oxide of the oxide 230c, diffusion of In into the insulator 250 side can be inhibited. Since the insulator 250 functions as a gate insulator, the transistor exhibits poor characteristics when In enters the insulator 250 and the like. Thus, when the oxide 230c has a stacked-layer structure, a highly reliable semiconductor device can be provided.

The conductive metal nitride described above is preferably used for the conductor 242. As the metal nitride, a nitride containing tantalum, a nitride containing titanium, a nitride containing molybdenum, a nitride containing tungsten, a nitride containing tantalum and aluminum, a nitride containing titanium and aluminum, or the like can be given, for example. In particular, a nitride containing tantalum is preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

As illustrated in FIG. 1B, the insulator 254 is preferably in contact with the top surface and side surface of the conductor 242a, the top surface and side surface of the conductor 242b, the side surfaces of the oxide 230a, the side surfaces of the oxide 230b, and part of the top surface of the insulator 224. With such a structure, the insulator 280 is isolated from the insulator 224, the oxide 230a, and the oxide 230b by the insulator 254.

Like the insulator 222, the insulator 254 preferably has a function of inhibiting diffusion of one or both of hydrogen and oxygen. For example, the insulator 254 preferably has a function of further inhibiting diffusion of one or both of hydrogen and oxygen as compared to the insulator 224 and the insulator 280. Accordingly, hydrogen contained in the insulator 280 can be inhibited from diffusing into the oxide 230a and the oxide 230b. Furthermore, by surrounding the insulator 224, the oxide 230, and the like with the insulator 222 and the insulator 254, diffusion of impurities such as water and hydrogen into the insulator 224 and the oxide 230 from the outside can be inhibited. Thus, the transistor 200 can have favorable electrical characteristics and reliability.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Accordingly, oxygen can be supplied from the region to the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 into the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably deposited as the insulator 254, for example. In this case, the insulator 254 is preferably deposited using an atomic layer deposition (ALD) method. An ALD method is a deposition method providing good coverage, and thus can prevent formation of disconnection or the like due to unevenness of the insulator 254.

An insulator containing aluminum nitride may be used as the insulator 254, for example. Accordingly, a film having an excellent insulating property and high thermal conductivity can be obtained, and thus dissipation of heat generated in driving the transistor 200 can be increased. Alternatively, silicon nitride, silicon nitride oxide, or the like can be used.

Alternatively, an oxide containing gallium may be used as the insulator 254, for example. An oxide containing gallium is preferable because it sometimes has a function of inhibiting diffusion of one or both of hydrogen and oxygen. Note that gallium oxide, a gallium zinc oxide, an indium gallium zinc oxide, or the like can be used as an oxide containing gallium. Note that when an indium gallium zinc oxide is used as the insulator 254, the atomic ratio of gallium to indium is preferably large. When the atomic ratio is increased, the insulating property of the oxide can be high.

The insulator 254 can have a multilayer structure of two or more layers. When the insulator 254 has a stacked-layer structure of two layers, the lower layer of the insulator 254 and the upper layer of the insulator 254 can be deposited by any of the above methods; the lower layer and the upper layer of the insulator 254 may be deposited by the same method or different methods. For example, the insulator 254 may be formed in such a manner that the lower layer of the insulator 254 is deposited by a sputtering method in an oxygen-containing atmosphere and then the upper layer of the insulator 254 is deposited by an ALD method. An ALD method is a deposition method providing good coverage, and thus can prevent formation of disconnection or the like due to unevenness of the first layer.

The lower layer and the upper layer of the insulator 254 can be formed using the above materials, and the lower layer and the upper layer of the insulator 254 may be formed using the same material or different materials. For example, a stacked-layer structure of silicon oxide, silicon oxynitride, silicon nitride oxide, or silicon nitride and an insulator having a function of inhibiting passage of oxygen and impurities such as hydrogen may be employed. As the insulator having a function of inhibiting passage of oxygen and impurities such as hydrogen, an insulator containing an oxide of one or both of aluminum and hafnium can be used, for example.

The insulator 250 functions as a gate insulator. The insulator 250 is preferably positioned in contact with at least part of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Like the insulator 224, the insulator 250 is preferably formed using an insulator from which oxygen is released by heating. When an insulator from which oxygen is released by heating is provided as the insulator 250 in contact with at least part of the oxide 230c, oxygen can be efficiently supplied to the channel formation region of the oxide 230b and oxygen defects in the channel formation region of the oxide 230b can be reduced. Thus, a transistor that has stable electrical characteristics with a small variation in electrical characteristics and improved reliability can be provided. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Provision of the metal oxide that inhibits diffusion of oxygen inhibits diffusion of oxygen from the insulator 250 to the conductor 260. That is, a reduction in the amount of oxygen supplied to the oxide 230 can be inhibited. In addition, oxidation of the conductor 260 due to oxygen from the insulator 250 can be inhibited.

Note that the metal oxide functions as part of the gate insulator in some cases. Thus, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one or more kinds selected from hafnium, aluminum, gallium, yttrium, zirconium, tungsten, titanium, tantalum, nickel, germanium, magnesium, and the like can be used. In particular, an insulator containing an oxide of one or both of aluminum and hafnium is preferably used.

The metal oxide may have a function of part of the first gate electrode. For example, an oxide semiconductor that can be used as the oxide 230 can be used as the metal oxide. In that case, when the conductor 260 is deposited by a sputtering method, the metal oxide can have a reduced electric resistance to be a conductor.

With the metal oxide, the on-state current of the transistor 200 can be increased without a reduction in the influence of the electric fields from the conductor 260. Since the distance between the conductor 260 and the oxide 230 is kept by the physical thicknesses of the insulator 250 and the metal oxide, a leakage current between the conductor 260 and the oxide 230 can be reduced. Moreover, when the stacked-layer structure of the insulator 250 and the metal oxide is provided, the physical distance between the conductor 260 and the oxide 230 and the intensity of electric fields applied to the oxide 230 from the conductor 260 can be easily adjusted as appropriate.

The conductor 260 preferably includes the conductor 260a and the conductor 260b positioned over the conductor 260a. For example, the conductor 260a is preferably positioned to cover the bottom surface and a side surface of the conductor 260b.

Here, for the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule, and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of any of the above conductive materials and titanium or titanium nitride.

Although the conductor 260 has a two-layer structure of the conductor 260a and the conductor 260b in FIG. 1B and FIG. 1C, the conductor 260 may have a single-layer structure or a stacked-layer structure of three or more layers.

In the transistor 200, the conductor 260 is formed in a self-aligned manner to fill an opening formed in the insulator 280 and the like. The formation of the conductor 260 in this manner allows the conductor 260 to be positioned certainly in a region between the conductor 242a and the conductor 242b without alignment.

Moreover, as illustrated in FIG. 1B, the top surface of the conductor 260 is substantially level with the top surface of the insulator 250 and the top surface of the oxide 230c.

As illustrated in FIG. 1C, in the channel width direction of the transistor 200, the level of the bottom surface of the conductor 260 in a region where the conductor 260 and the oxide 230b do not overlap with each other is preferably lower than the level of the bottom surface of the oxide 230b. When the conductor 260 functioning as a gate electrode covers the side surface and the top surface of the channel formation region of the oxide 230b with the insulator 250 and the like therebetween, the electric field of the conductor 260 is likely to affect the entire channel formation region of the oxide 230b. Thus, the on-state current of the transistor 200 can be increased and the frequency characteristics of the transistor 200 can be improved. When the bottom surface of the insulator 222 is a reference and the difference between the level of the bottom surface of the conductor 260 in a region where the conductor 260, the oxide 230a, and the oxide 230b do not overlap with each other and the level of the bottom surface of the oxide 230b is T1, T1 is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 224, the oxide 230a, the oxide 230b, and the conductor 242 with the insulator 254 therebetween. In addition, the top surface of the insulator 280 may be planarized.

The permittivity of the insulator 280 functioning as an interlayer film is preferably low. When a material with a low permittivity is used for an interlayer film, the parasitic capacitance generated between wirings can be reduced. The insulator 280 is preferably formed using a material similar to that of the insulator 216, for example. In particular, silicon oxide and silicon oxynitride, which have thermal stability, are preferable. Materials such as silicon oxide, silicon oxynitride, and porous silicon oxide, in each of which a region containing oxygen that is released by heating can be easily formed, are particularly preferable.

The concentration of impurities such as water and hydrogen in the insulator 280 is preferably reduced. Moreover, the insulator 280 preferably has a low hydrogen concentration and includes an excess-oxygen region or excess oxygen, and may be formed using a material similar to that for the insulator 216, for example. Note that the insulator 280 may have a stacked-layer structure of two or more layers.

Like the insulator 214 and the like, the insulator 274 preferably functions as an insulating barrier film that inhibits diffusion of impurities such as water and hydrogen into the insulator 280 from above. In addition, like the insulator 214 and the like, the insulator 274 preferably has a low hydrogen concentration and has a function of inhibiting diffusion of hydrogen.

As illustrated in FIG. 1B, the insulator 274 is preferably in contact with each of the top surfaces of the conductor 260, the insulator 250, and the oxide 230c. Thus, impurities such as hydrogen contained in the insulator 281 and the like can be inhibited from entering the insulator 250. Thus, adverse effects on the electrical characteristics of the transistor and the reliability of the transistor can be suppressed.

The insulator 281 functioning as an interlayer film is preferably provided over the insulator 274. Like the insulator 216 or the like, the insulator 281 preferably has a low permittivity. Furthermore, as in the insulator 224 and the like, the concentration of impurities such as water and hydrogen in the insulator 281 is preferably reduced.

The conductor 240a and the conductor 240b are provided in openings formed in the insulator 281, the insulator 274, the insulator 280, and the insulator 254. The conductor 240a and the conductor 240b are provided to face each other with the conductor 260 interposed therebetween. Note that the top surfaces of the conductor 240a and the conductor 240b may be on the same plane as the top surface of the insulator 281.

Note that the insulator 241a is provided in contact with a side wall of the opening in the insulator 281, the insulator 274, the insulator 280, and the insulator 254, and the conductor 240a is formed in contact with a side surface of the insulator 241a. The conductor 242a is positioned on at least part of the bottom portion of the opening, and thus the conductor 240a is in contact with the conductor 242a. Similarly, the insulator 241b is provided in contact with a side wall of the opening in the insulator 281, the insulator 274, the insulator 280, and the insulator 254, and the conductor 240b is formed in contact with a side surface of the insulator 241b. The conductor 242b is positioned on at least part of the bottom portion of the opening, and thus the conductor 240b is in contact with the conductor 242b.

A conductive material containing tungsten, copper, or aluminum as its main component is preferably used for the conductor 240a and the conductor 240b.

The conductor 240a and the conductor 240b may each have a stacked-layer structure. Note that although the conductor 240a and the conductor 240b have a stacked-layer structure of two layers in the transistor 200, the present invention is not limited thereto. For example, the conductor 240 may have a single-layer structure or a stacked-layer structure of three or more layers.

In the case where the conductor 240a and the conductor 240b each have a stacked-layer structure, a conductive material having a function of inhibiting passage of impurities such as water and hydrogen is preferably used as a conductor in contact with the conductor 242 and in contact with the insulator 254, the insulator 280, the insulator 274, and the insulator 281 with the insulator 241 therebetween. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. The use of the conductive material can prevent oxygen added to the insulator 280 from being absorbed by the conductor 240a and the conductor 240b. Moreover, impurities such as water and hydrogen contained in a layer above the insulator 281 can be inhibited from diffusing into the oxide 230 through the conductor 240a and the conductor 240b.

An insulator that can be used as the insulator 214, the insulator 254, and the like is used as the insulator 241a and the insulator 241b, for example. Since the insulator 241a and the insulator 241b are provided in contact with the insulator 254, impurities such as water and hydrogen contained in the insulator 280 or the like can be inhibited from diffusing into the oxide 230 through the conductor 240a and the conductor 240b. In addition, oxygen contained in the insulator 280 can be prevented from being absorbed by the conductor 240a and the conductor 240b.

Moreover, although not illustrated, a conductor functioning as a wiring may be provided in contact with the top surface of the conductor 240a and the top surface of the conductor 240b. A conductive material containing tungsten, copper, or aluminum as its main component is preferably used as the conductor functioning as a wiring. Furthermore, the conductor may have a stacked-layer structure, for example, a stacked-layer structure of any of the above conductive materials and titanium or titanium nitride. Note that the conductor may be formed to fill an opening provided in an insulator.

In addition, although not illustrated, an insulator having resistivity higher than or equal to $1.0 \times 10^{13}$ Ωcm and lower than or equal to $1.0 \times 10^{15}$ Ωcm, preferably higher than or equal to $5.0 \times 10^{13}$ Ωcm and lower than or equal to $5.0 \times 10^{14}$ Ωcm is preferably provided to cover the above conductor. It is preferable that an insulator having the above resistivity be provided over the conductor, in which case the insulator can disperse electric charge accumulated in the transistor 200 or between wirings of the conductor or the like and can inhibit defects in characteristics and electrostatic breakdown of the transistor and an electronic device including the transistor due to the electric charge, while maintaining the insulating property.

<Constituent Material of Semiconductor Device>

Constituent materials that can be used for the semiconductor device are described below.

<<Substrate>>

As a substrate over which the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, any of these substrates provided with an element may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

For example, with miniaturization and high integration of a transistor, a problem such as leakage current may arise because of a thinner gate insulator. When a high-k material is used for an insulator functioning as the gate insulator, the voltage during operation of the transistor can be lowered while the physical thickness of the gate insulator is kept. By contrast, when a material with a low relative permittivity is used for the insulator functioning as an interlayer film, the parasitic capacitance generated between wirings can be reduced. Thus, a material is preferably selected depending on the function of an insulator.

Examples of the insulator with high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by an insulator having a function of inhibiting passage of oxygen and impurities such as hydrogen (e.g., the insulator 214, the insulator 222, the insulator 254, the insulator 274, and the like), the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, silicon nitride oxide or silicon nitride; or the like can be used.

In addition, the insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be compensated for.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that in the case where an oxide is used as the channel formation region of the transistor, a stacked-layer structure in which a material containing the above metal element and a conductive material containing oxygen are combined is preferably used as the conductor functioning as the gate electrode. In this case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is particularly preferable to use a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon is added may be used. Furthermore, an indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<<Metal Oxide>>

As the oxide 230, a metal oxide functioning as an oxide semiconductor is preferably used. A metal oxide that can be applied to the oxide 230 of the present invention is described below.

The metal oxide preferably contains at least indium or zinc. In particular, indium and zinc are preferably contained. Furthermore, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, or tin. Examples of other elements that can be applied to the element M include boron, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide including few impurities and defects (e.g., oxygen vacancies). Thus, a metal oxide including a CAAC-OS is physically stable. Accordingly, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS contains a void or a low-density region. That is, the a-like OS has low crystallinity compared with the nc-OS and the CAAC-OS.

An oxide semiconductor (metal oxide) can have various structures that show different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of each impurity in the metal oxide is described.

Entry of the impurities into an oxide semiconductor forms defect states or oxygen vacancies in some cases. Thus, when impurities enter a channel formation region of the oxide semiconductor, the electrical characteristics of a transistor using the oxide semiconductor tend to vary and its reliability is decreased in some cases. Moreover, when the channel formation region includes oxygen vacancies, the transistor tends to have normally-on characteristics.

The above-described defect states might include a trap state. Charges trapped by the trap states in the metal oxide take a long time to disappear and might behave like fixed charges. Thus, a transistor whose channel formation region includes a metal oxide having a high density of trap states has unstable electrical characteristics in some cases.

If impurities exist in the channel formation region of the oxide semiconductor, the crystallinity of the channel formation region might decrease, and the crystallinity of an oxide in contact with the channel formation region might decrease. Low crystallinity of the channel formation region tends to result in deterioration in stability or reliability of the transistor. Moreover, when the crystallinity of the oxide in contact with the channel formation region is low, an interface state might be formed and the stability or reliability of the transistor might deteriorate.

Thus, the reduction in concentration of impurities in the channel formation region and the vicinity thereof of the oxide semiconductor is effective in improving the stability or reliability of the transistor. As an impurity, hydrogen, nitrogen, an alkali metal, an alkaline earth metal, iron, nickel, silicon, and the like are given.

Specifically, the concentration of the above impurities obtained by SIMS is lower than or equal to $1\times10^{18}$ atoms/$cm^3$, preferably lower than or equal to $2\times10^{16}$ atoms/$cm^3$ in and around the channel formation region of the oxide semiconductor. Alternatively, the concentration of the above impurities obtained by element analysis using EDX is lower than or equal to 1.0 atomic % in and around the channel formation region of the oxide semiconductor. In the case where an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concertation of the impurities is calculated or may be a concentration in the oxide semiconductor.

A metal oxide with a low impurity concentration has a low density of defect states and thus has a low density of trap states in some cases.

<Method for Manufacturing Semiconductor Device>

Next, a method for manufacturing a semiconductor device including the transistor 200 according to one embodiment of the present invention, which is illustrated in FIG. 1A to FIG. 1D, is described with reference to FIG. 4A to FIG. 11C.

FIG. 4A, FIG. 5A, FIG. 6A, FIG. 7A, FIG. 8A, FIG. 9A, FIG. 10A, and FIG. 11A are top views. FIG. 4B, FIG. 5B, FIG. 6B, FIG. 7B, FIG. 8B, FIG. 9B, FIG. 10B, and FIG. 11B are cross-sectional views of a portion along the dashed-dotted line A1-A2 in FIG. 4A, FIG. 5A, FIG. 6A, FIG. 7A, FIG. 8A, FIG. 9A, FIG. 10A, and FIG. 11A and cross-sectional views of the transistor 200 in the channel length direction. FIG. 4C, FIG. 5C, FIG. 6C, FIG. 7C, FIG. 8C, FIG. 9C, FIG. 10C, and FIG. 11C are cross-sectional views of a portion along the dashed-dotted line A3-A4 in FIG. 4A, FIG. 5A, FIG. 6A, FIG. 7A, FIG. 8A, FIG. 9A, FIG. 10A, and FIG. 11A and cross-sectional views of the transistor 200 in the channel width direction. Note that for simplification, some components are not illustrated in the top views of FIG. 4A, FIG. 5A, FIG. 6A, FIG. 7A, FIG. 8A, FIG. 9A, FIG. 10A, and FIG. 11A.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an ALD method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (e.g., a transistor or a capacitor), or the like included in a semiconductor device might be charged up by receiving electric charge from plasma. In this case, accumulated electric charge might break the wiring, the electrode, the element, or the like included in the semiconductor device. By contrast, in the case of a thermal CVD method that does not use plasma, such plasma damage is not caused and the yield of the semiconductor device can be increased. In addition, a thermal CVD method does not cause plasma damage during deposition, so that a film with few defects can be obtained.

In an ALD method, one atomic layer can be deposited at a time using self-regulating characteristics of atoms. Thus, an ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a PEALD (plasma enhanced ALD) method using plasma. The use of plasma is sometimes preferable because deposition at a lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the flow rate ratio of the source gases. For example, by a CVD method or an ALD method, a film with a certain composition can be deposited depending on the flow rate ratio of the source gases. Moreover, with a CVD method or an ALD method, by changing the flow rate ratio of the source gases during the deposition, a film whose composition is continuously changed can be deposited. In the case of depositing while changing the flow rate ratio of source gases, as compared with the case of depositing with the use of a plurality of deposition chambers, time taken for the deposition can be shortened because time taken for transfer and pressure adjustment is omitted. Thus, the productivity of the semiconductor device can be increased in some cases.

In this embodiment, for the insulator 214, aluminum oxide is deposited by a sputtering method. In addition, the insulator 214 may have a multilayer structure.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxynitride is deposited by a CVD method.

Then, an opening reaching the insulator 214 is formed in the insulator 216. Examples of the opening include a groove and a slit. A region where the opening is formed is referred to as an opening portion. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where a silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus, or the like can be used, for example.

After the formation of the opening, a conductive film to be the first conductor of the conductor 205 is deposited. The conductive film preferably includes a conductor that has a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be deposited by a sputtering method, a CVD method, an MBE method, a PLD method, an ALD method, or the like.

In this embodiment, as the conductive film to be the first conductor of the conductor 205, a tantalum nitride film or a film in which titanium nitride is stacked over tantalum nitride is deposited by a sputtering method. With the use of such a metal nitride as the first conductor of the conductor 205, even when a metal that easily diffused, such as copper, is used for the second conductor of the conductor 205 described later, the metal can be prevented from diffusing outward through the first conductor of the conductor 205.

Next, a conductive film to be the second conductor of the conductor 205 is deposited over the conductive film to be the first conductor of the conductor 205. The conductive film can be deposited by a plating method, a sputtering method, a CVD method, an MBE method, a PLD method, an ALD method, or the like. In this embodiment, tungsten is deposited for the conductive film.

Next, chemical mechanical polishing (CMP) treatment is performed to remove part of the conductive film to be the first conductor of the conductor 205 and part of the conductive film to be the second conductor of the conductor 205 to expose the insulator 216. As a result, the conductive film to be the first conductor of the conductor 205 and the conductive film to be the second conductor of the conductor 205 remain only in the opening portion. Thus, the conductor 205 including the first conductor of the conductor 205 and the second conductor of the conductor 205, which has a flat top surface, can be formed (see FIG. 4A to FIG. 4C).

Note that after the conductor 205 is formed, the following steps may be performed: part of the second conductor of the conductor 205 is removed, a groove is formed in the second conductor of the conductor 205, a conductive film is deposited over the conductor 205 and the insulator 216 to be embedded in the groove, and then CMP treatment is performed. By the CMP treatment, part of the conductive film is removed to expose the insulator 216. Note that part of the second conductor of the conductor 205 is preferably removed by a dry etching method or the like.

Through the above steps, the conductor 205 including the conductive film, which has a flat top surface, can be formed. The improvement in planarity of the top surfaces of the insulator 216 and the conductor 205 can improved crystallinity of the oxide 230$a$, the oxide 230$b$, and the oxide 230$c$. Note that the conductive film is preferably formed using a material similar to that for the first conductor of the conductor 205 or the second conductor of the conductor 205.

Here, a method for forming the conductor 205 which is different from the above is described below.

A conductive film to be the conductor 205 is deposited over the insulator 214. The conductive film can be deposited by a sputtering method, a CVD method, an MBE method, a PLD method, an ALD method, or the like. In addition, the conductive film can be a multilayer film. For example, tungsten is deposited as the conductive film.

Next, the conductive film to be the conductor 205 is processed by a lithography method, so that the conductor 205 is formed.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 205, forming a resist mask thereover, and then etching the hard mask material. The etching of the conductive film to be the conductor 205 may be performed after removing the resist mask or with the resist mask remaining. In the latter case, the resist mask sometimes disappears during the etching. The hard mask may be removed by etching after the etching of the conductive film to be the conductor 205. Meanwhile, the hard mask does not need to be removed in the case where the material of the hard mask does not affect a later process or can be utilized in a later process.

Next, an insulating film to be the insulator 216 is deposited over the insulator 214 and the conductor 205. The insulating film is formed to be in contact with the top surface and side surface of the conductor 205. The insulating film can be deposited by a sputtering method, a CVD method, an MBE method, a PLD method, an ALD method, or the like.

Here, the thickness of the insulating film to be the insulator 216 is preferably greater than or equal to the thickness of the conductor 205. For example, when the thickness of the conductor 205 is 1, the thickness of the insulating film is greater than or equal to 1 and less than or equal to 3.

Next, CMP treatment is performed on the insulating film to be the insulator 216, so that part of the insulating film is removed and a surface of the conductor 205 is exposed. Thus, the conductor 205 and the insulator 216 whose top surfaces are flat can be formed. The above is the different formation method of the conductor 205.

Next, the insulator 222 is deposited over the insulator 216 and the conductor 205. The insulator 222 can be deposited by a sputtering method, a CVD method, an MBE method, a PLD method, an ALD method, or the like. In this embodiment, hafnium oxide or aluminum oxide is deposited by an ALD method for the insulator 222.

Next, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

In this embodiment, the heat treatment is performed in such a manner that treatment is performed at 400° C. in a nitrogen atmosphere for one hour after the deposition of the insulator 222, and then another treatment is successively performed at 400° C. in an oxygen atmosphere for one hour. By the heat treatment, impurities such as water and hydrogen contained in the insulator 222 can be removed. The heat treatment can also be performed after the deposition of the insulator 224, for example.

Next, the insulator 224 is deposited over the insulator 222. The insulator 224 can be deposited by a sputtering method, a CVD method, an MBE method, a PLD method, an ALD method, or the like. In this embodiment, for the insulator 224, a silicon oxynitride film is deposited by a CVD method.

Here, plasma treatment with oxygen may be performed under reduced pressure so that an excess-oxygen region can be formed in the insulator 224. For the plasma treatment with oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment with an inert gas is performed using this apparatus, plasma treatment with oxygen may be performed to compensate for released oxygen. Note that impurities such as water and hydrogen contained in the insulator 224 can be removed by selecting the conditions for the plasma treatment as appropriate. In that case, the heat treatment does not need to be performed.

Here, after aluminum oxide is deposited over the insulator 224 by a sputtering method, for example, CMP treatment may be performed until the insulator 224 is reached. The CMP treatment can planarize and smooth the surface of the insulator 224. When the CMP treatment is performed on the aluminum oxide placed over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can improve the coverage with an oxide deposited later and a decrease in the yield of the semiconductor device in some cases. The deposition of aluminum oxide over the insulator 224 by a sputtering method is preferred because oxygen can be added to the insulator 224.

Figure 4A:
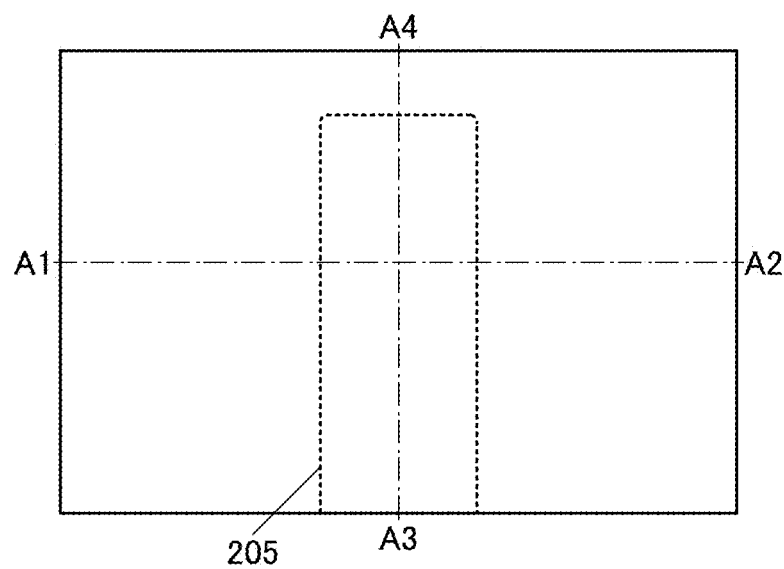
FIG. 4A is a top view illustrating a method for manufacturing a semiconductor device of one embodiment of the present invention.
Figure 4C:
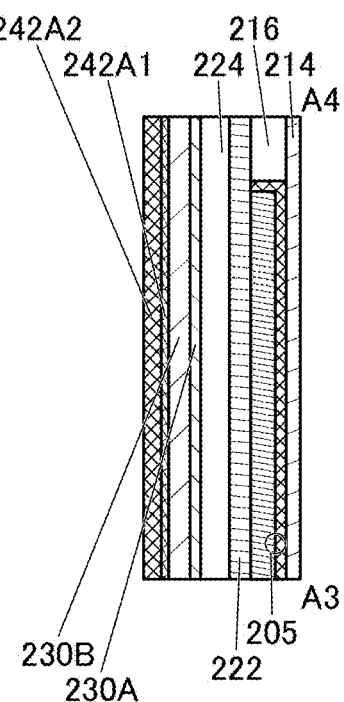
FIG. 4B and FIG. 4C are cross-sectional views illustrating the method for manufacturing a semiconductor device of one embodiment of the present invention.
Figure 4B:
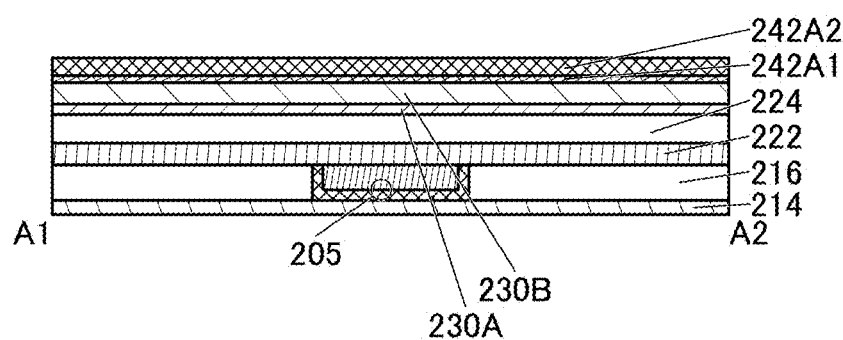
Figure 5A:
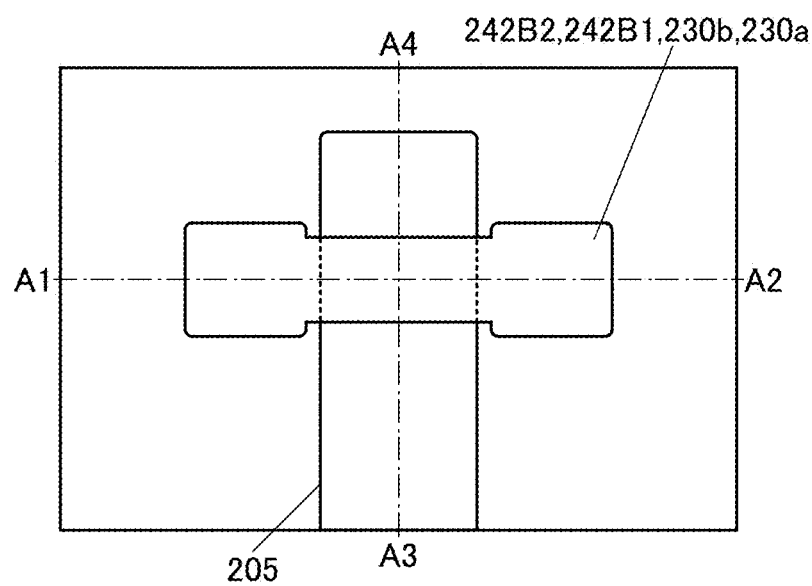
FIG. 5A is a top view illustrating a method for manufacturing a semiconductor device of one embodiment of the present invention.
Figure 5C:
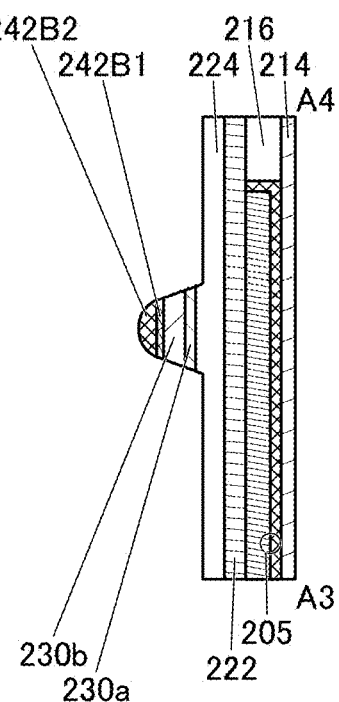
FIG. 5B and FIG. 5C are cross-sectional views illustrating the method for manufacturing a semiconductor device of one embodiment of the present invention.
Figure 5B:
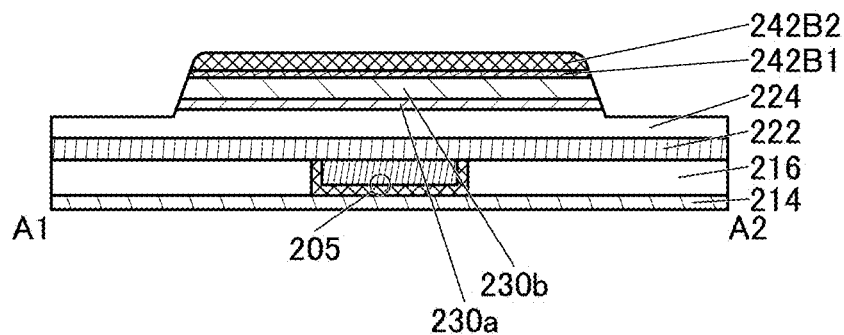

Next, an oxide film 230A and an oxide film 230B are deposited in this order over the insulator 224 (see FIG. 4B and FIG. 4C). Note that it is preferable to deposit the oxide film 230A and the oxide film 230B successively without exposure to the air atmosphere. By the deposition without exposure to the air, impurities or moisture from the atmospheric environment can be prevented from being attached onto the oxide film 230A, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are deposited by a sputtering method, the above In-M-Zn oxide target and the like can be used.

In particular, part of oxygen contained in the sputtering gas is supplied to the insulator 224 during the deposition of the oxide film 230A in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is more than 30% and less than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen in the sputtering gas for deposition is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when deposition is performed while the substrate is heated, the crystallinity of the oxide film can be improved.

In this embodiment, the oxide film 230A is deposited by a sputtering method using an In—Ga—Zn oxide target with In:Ga:Zn=1:3:4 [atomic ratio]. The oxide film 230B is deposited by a sputtering method using an In—Ga—Zn oxide target with In:Ga:Zn=4:2:4.1 [atomic ratio]. Note that each of the oxide films is formed to have characteristics required for the oxide 230 by selecting the deposition condition and the atomic ratio as appropriate.

Note that the insulator 222, the insulator 224, the oxide film 230A, and the oxide film 230B are preferably deposited without exposure to the air. For example, a multi-chamber deposition apparatus may be used.

Next, heat treatment may be performed. For the heat treatment, the conditions for the above-described heat treatment can be used. Through the heat treatment, impurities such as water and hydrogen in the oxide film 230A and the oxide film 230B can be removed, for example. In this embodiment, treatment is performed at 400° C. in a nitrogen atmosphere for one hour, and successively another treatment is performed at 400° C. in an oxygen atmosphere for one hour.

Next, a conductive film 242A1 and a conductive film 242A2 are deposited in this order over the oxide film 230B. The conductive film 242A1 and the conductive film 242A2 can be formed by a sputtering method, a CVD method, an MBE method, a PLD method, an ALD method, or the like (see FIG. 4B and FIG. 4C).

The conductive film 242A1 and the conductive film 242A2 are further preferably formed by an ionization sputtering method. Note that in the ionization sputtering method, by forming high-density plasma between a target and a substrate and making a sputtered particle that has ejected from the target collide with electrons in the region of the high-density plasma, the sputtered particle can be positively ionized. When a negative bias is applied to the substrate side, the particle positively ionized can be extracted to the substrate side, so that an interface between the oxide film 230B and the conductive film 242A1 can be in a favorable state. For example, the conductive film 242A1 and the conductive film 242A2 are deposited by an ionization sputtering method, whereby contact resistance to the oxide film 230B can be reduced. Alternatively, even in the case where unevenness is formed on the surface of the oxide film 230B, the conductive film 242A1 and the conductive film 242A2 are deposited by an ionization sputtering method, whereby the unevenness can be filled; in other word, coverage can be improved.

Heat treatment may be performed before the deposition of the conductive film 242A1. The heat treatment may be performed under reduced pressure, and the conductive film 242A1 and the conductive film 242A2 may be successively deposited without exposure to the air. Such treatment can remove moisture and hydrogen adsorbed onto the surface of the oxide film 230B and the like, and further can reduce the moisture concentration and the hydrogen concentration of the oxide film 230A and the oxide film 230B. The heat treatment is preferably performed at a temperature higher than or equal to 100° C. and lower than or equal to 400° C. In this embodiment, the heat treatment is performed at 200° C.

In this embodiment, the conductive film 242A1 and the conductive film 242A2 are deposited using a sputtering apparatus under a nitrogen atmosphere in the following manner: the proportion of nitrogen flow rate in the total gas flow rate during the deposition of the conductive film 242A1 is higher than the proportion of nitrogen flow rate in the total gas flow rate during the deposition of the conductive film 242A2. Note that examples of a gas that can be used at the time of depositing the conductive film 242A1 and the conductive film 242A2 include nitrogen, helium, argon, xenon, and krypton. In particular, the conductive film 242A1 and the conductive film 242A2 are preferably deposited using a deposition gas of nitrogen and argon.

The substrate at the time of depositing the conductive film 242A1 and the conductive film 242A2 may be kept at room temperature or may be heated. For example, the substrate temperature at the time of depositing the conductive film 242A1 and the conductive film 242A2 may be higher than or equal to room temperature and lower than or equal to 350° C.

In the case of depositing tantalum nitride films having different compositions as the conductive film 242A1 and the conductive film 242A2, the conductive film 242A1 and the conductive film 242A2 can be successively deposited without exposure to the air when the common deposition conditions other than the deposition gas are employed. By the deposition without exposure to the air, impurities or moisture from the atmospheric environment can be prevented from being attached onto the conductive film 242A1, so that the vicinity of the interface between the conductive film 242A1 and the conductive film 242A2 can be kept clean. Note that in the case of depositing the tantalum nitride films having different compositions as the conductive film 242A1 and the conductive film 242A2, deposition conditions other than the deposition gas (e.g., pressure, electric power, time, or substrate temperature) can be arbitrarily changed by a practitioner. Note that it is preferable to deposit the tantalum nitride films successively in vacuum in order to keep the interface between the conductive film 242A1 and the conductive film 242A2 clean.

Next, the oxide film 230A, the oxide film 230B, and the conductive film 242A1, and the conductive film 242A2 are processed into island shapes to form the oxide 230a, the oxide 230b, a conductive layer 242B1, and a conductive layer 242B2. Note that in this step, the thickness of the insulator 224 in a region that does not overlap with the oxide 230a is reduced in some cases (see FIG. 5A to FIG. 5C).

Here, the oxide 230a, the oxide 230b, and the conductive layer 242B (the conductive layer 242B1 and the conductive layer 242B2) are formed to at least partly overlap with the conductor 205. It is preferable that the side surfaces of the oxide 230a, the oxide 230b, and the conductive layer 242B be substantially perpendicular to the top surface of the insulator 224. When the side surfaces of the oxide 230a, the oxide 230b, and the conductive layer 242B are substantially perpendicular to the top surface of the insulator 224, the plurality of transistors 200 can be provided in a smaller area and at a higher density. Alternatively, a structure may be employed in which an angle formed by the side surfaces of the oxide 230a, the oxide 230b, and the conductive layer 242B and the top surface of the insulator 224 is a small angle. In that case, the angle formed by the side surfaces of the oxide 230a, the oxide 230b, and the conductive layer 242B and the top surface of the insulator 224 is preferably greater than or equal to 60° and less than 70°. With such a shape, coverage with the insulator 254 and the like can be improved in a later step, so that defects such as voids can be reduced.

There is a curved surface between the side surface of the conductive layer 242B (the conductive layer 242B1 and the conductive layer 242B2) and the top surface of the conductive layer 242B. That is, an end portion of the side surface and an end portion of the top surface are preferably curved. The radius of curvature of the curved surface at the end portion of the conductive layer 242B is greater than or equal to 3 nm and less than or equal to 10 nm, preferably greater than or equal to 5 nm and less than or equal to 6 nm, for example. When the end portions are not angular, coverage with films in later deposition steps is improved.

Note that the oxide film 230A, the oxide film 230B, and the conductive film 242A (the conductive film 242A1 and the conductive film 242A2) may be processed by a lithography method. A dry etching method or a wet etching method can be used for the processing. Processing by a dry etching method is suitable for microfabrication. The oxide film 230A, the oxide film 230B, and the conductive film 242A may be processed under different conditions.

Figure 6A:
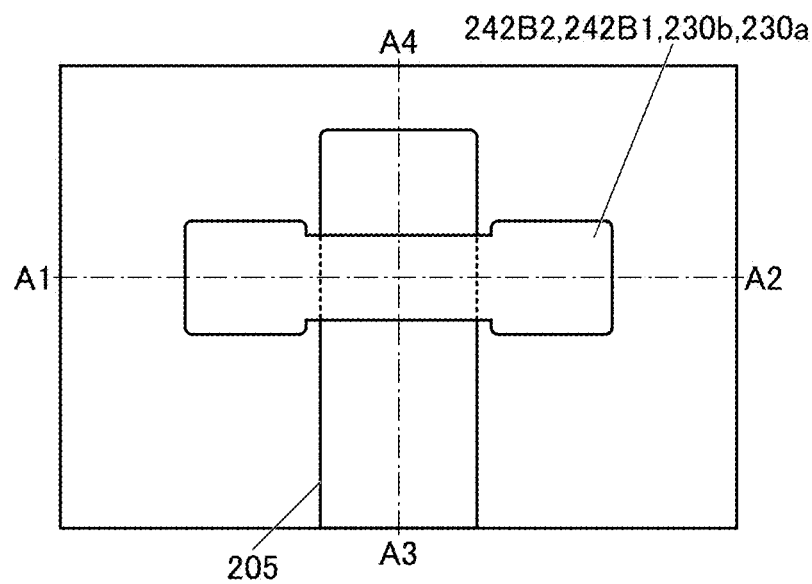
FIG. 6A is a top view illustrating a method for manufacturing a semiconductor device of one embodiment of the present invention.
Figure 6C:
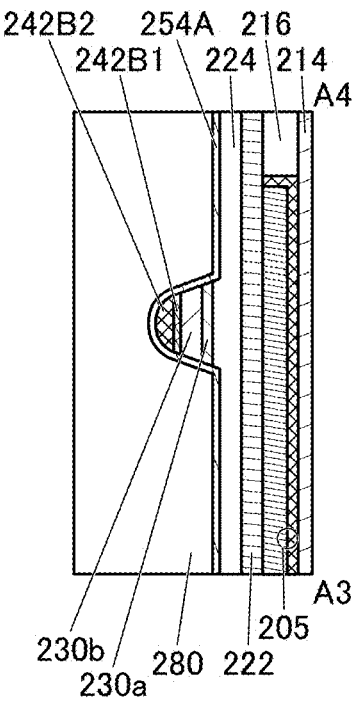
FIG. 6B and FIG. 6C are cross-sectional views illustrating the method for manufacturing a semiconductor device of one embodiment of the present invention.
Figure 6B:
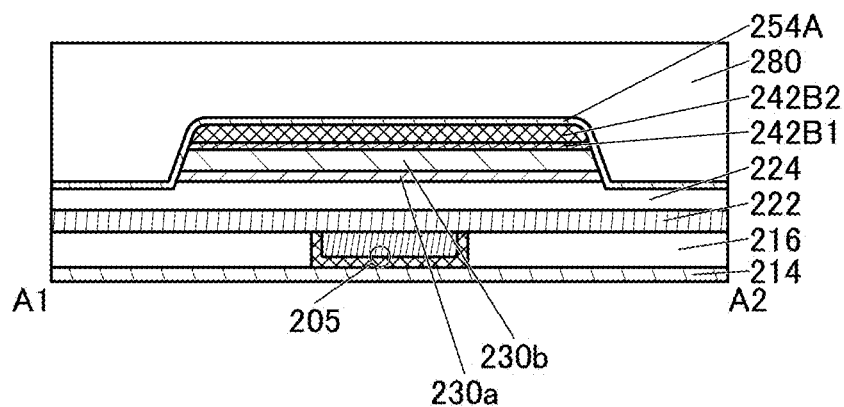
Figure 7A:
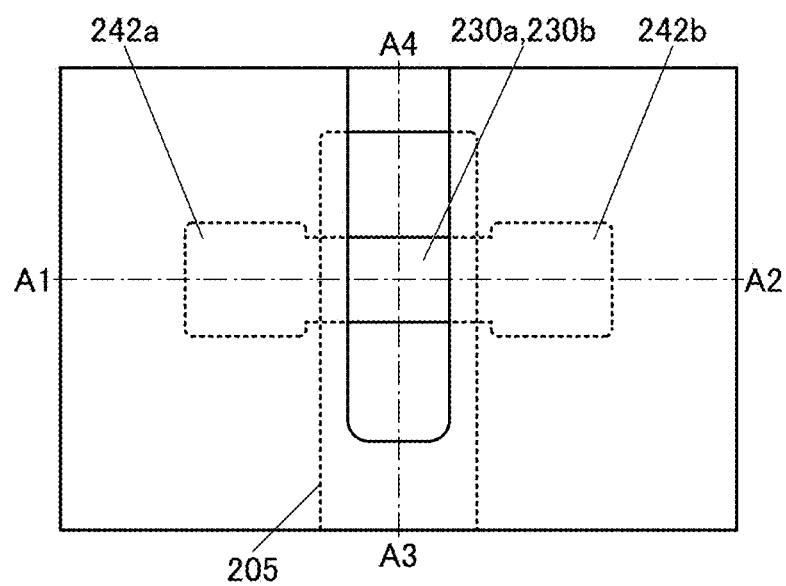
FIG. 7A is a top view illustrating a method for manufacturing a semiconductor device of one embodiment of the present invention.
Figure 7C:
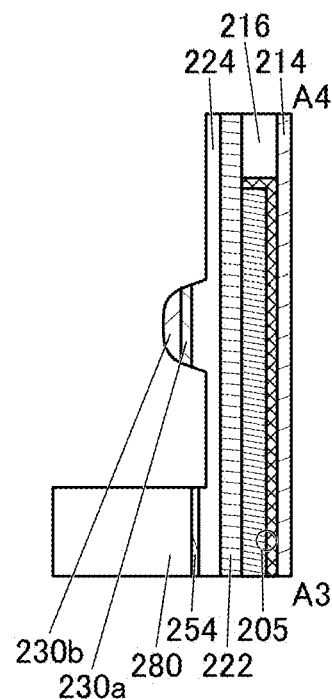
FIG. 7B and FIG. 7C are cross-sectional views illustrating the method for manufacturing a semiconductor device of one embodiment of the present invention.
Figure 7B:
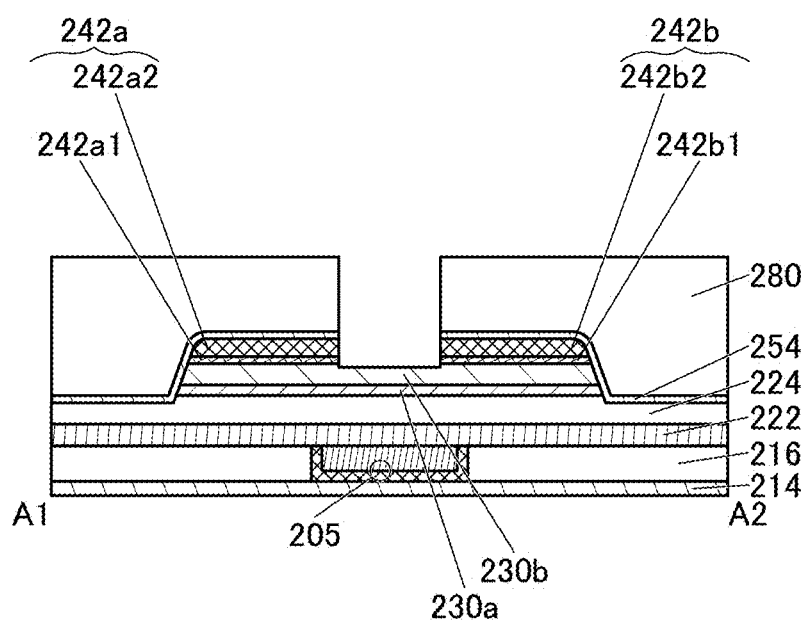
Figure 8A:
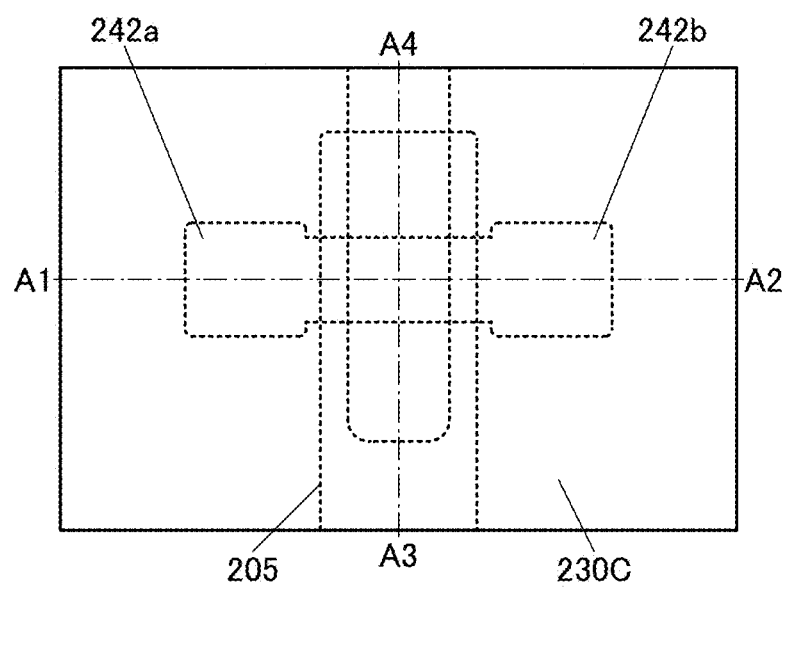
FIG. 8A is a top view illustrating a method for manufacturing a semiconductor device of one embodiment of the present invention.
Figure 8C:
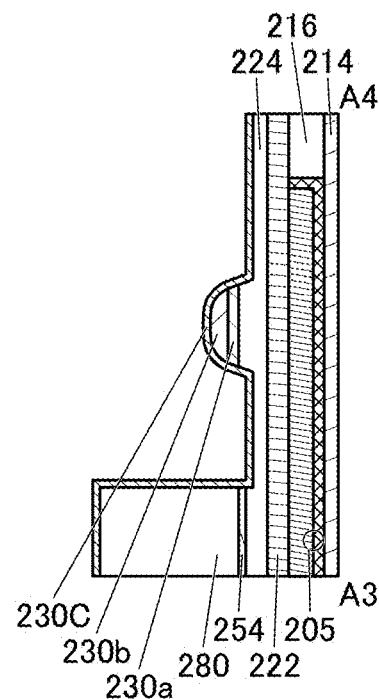
FIG. 8B and FIG. 8C are cross-sectional views illustrating the method for manufacturing a semiconductor device of one embodiment of the present invention.
Figure 8B:
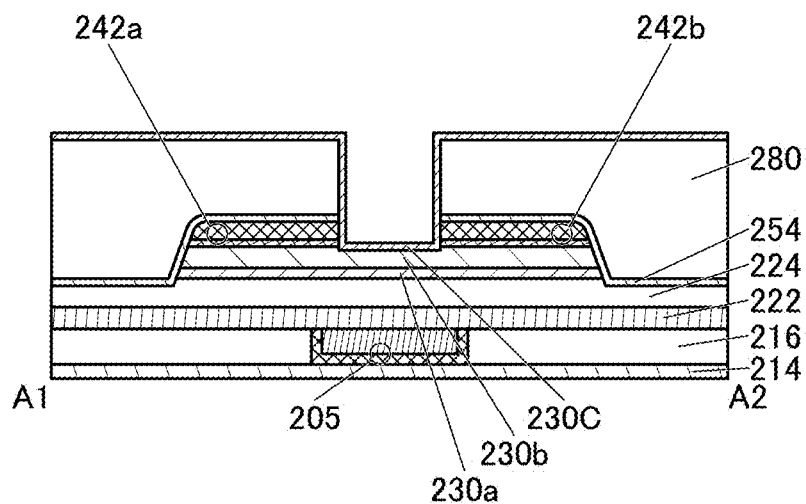
Figure 9A:
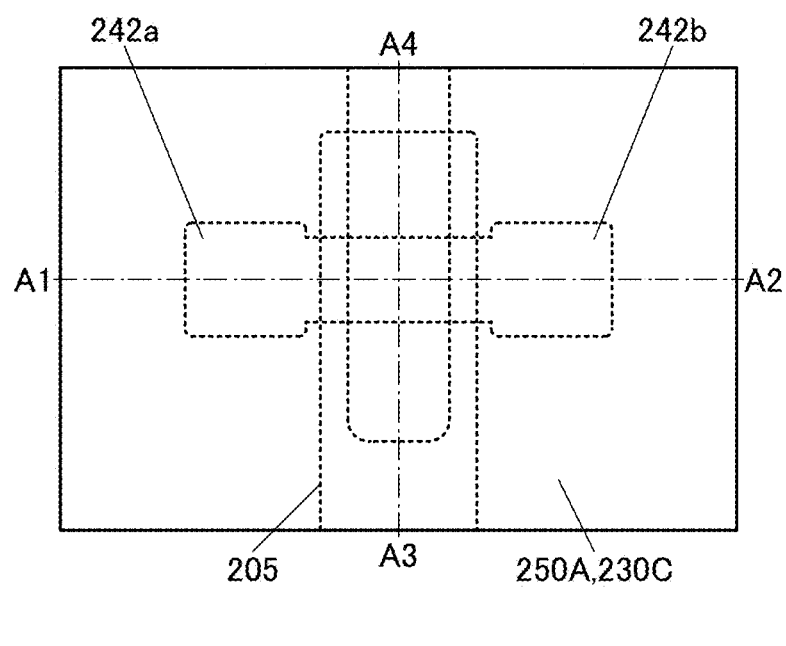
FIG. 9A is a top view illustrating a method for manufacturing a semiconductor device of one embodiment of the present invention.
Figure 9C:
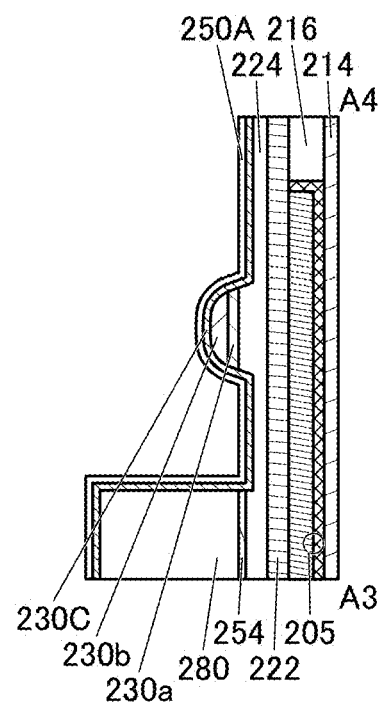
FIG. 9B and FIG. 9C are cross-sectional views illustrating the method for manufacturing a semiconductor device of one embodiment of the present invention.
Figure 9B:
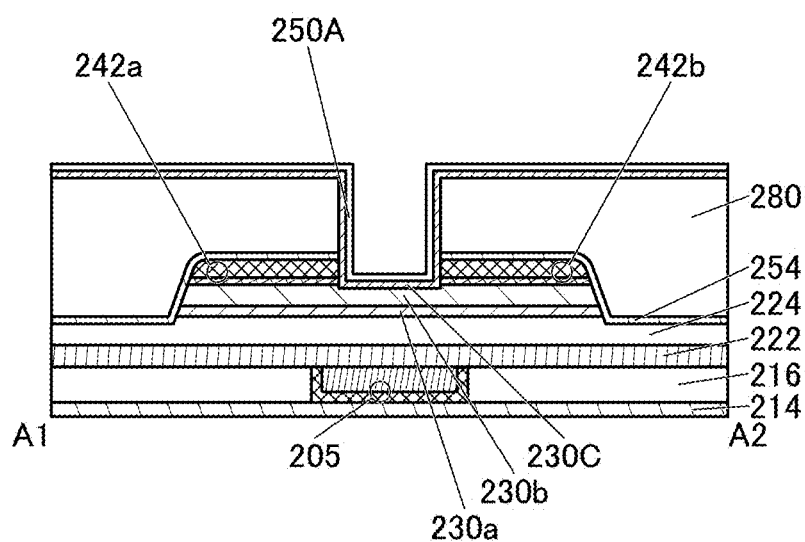
Figure 10A:
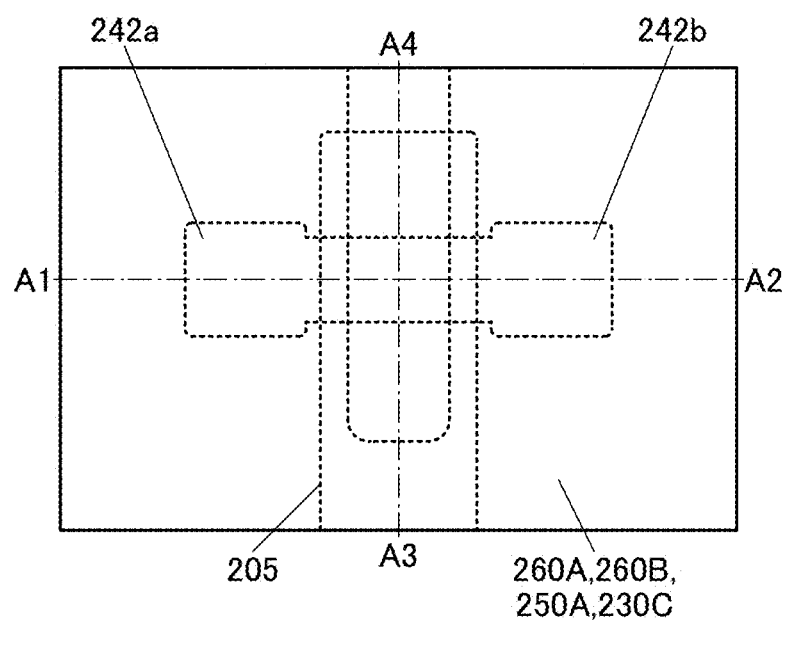
FIG. 10A is a top view illustrating a method for manufacturing a semiconductor device of one embodiment of the present invention.
Figure 10C:
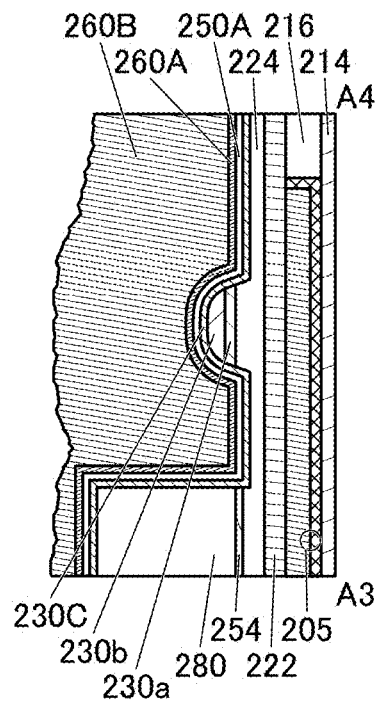
FIG. 10B and FIG. 10C are cross-sectional views illustrating the method for manufacturing a semiconductor device of one embodiment of the present invention.
Figure 10B:
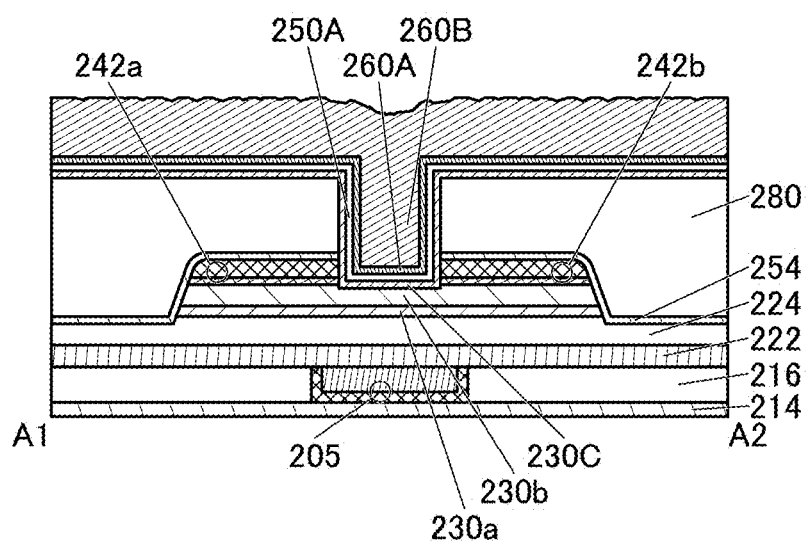

Next, an insulating film 254A is deposited over the insulator 224, the oxide 230a, the oxide 230b, and the conductive layer 242B (the conductive layer 242B1 and the conductive layer 242B2) (see FIG. 6B and FIG. 6C).

The insulating film 254A can be deposited by a sputtering method, a CVD method, an MBE method, a PLD method, an ALD method, or the like. As the insulating film 254A, an insulating film having a function of inhibiting passage of oxygen is preferably used. For example, silicon nitride, silicon oxide, or aluminum oxide is deposited by a sputtering method.

Next, an insulating film to be the insulator 280 is deposited over the insulating film 254A. The insulating film can be deposited by a sputtering method, a CVD method, an MBE method, a PLD method, an ALD method, or the like. In this embodiment, as the insulating film, a silicon oxide film is deposited by a CVD method or a sputtering method. Note that heat treatment may be performed before the insulating film is deposited. The heat treatment may be performed under reduced pressure, and the insulating films may be successively deposited without exposure to the air. Such treatment can remove moisture and hydrogen adsorbed onto the surface of the insulating film 254A and the like, and further can reduce the moisture concentration and the hydrogen concentration of the oxide 230a, the oxide 230b, and the insulating film 254A. The conditions for the above-described heat treatment can be used.

The insulating film to be the insulator 280 may have a multilayer structure. For example, a structure in which a silicon oxide film is deposited by a sputtering method and another silicon oxide film is deposited over the silicon oxide film by a CVD method may be employed.

Next, the insulating film to be the insulator 280 is subjected to CMP treatment, so that the insulator 280 having a flat top surface is formed (see FIG. 6B and FIG. 6C).

Then, part of the insulator 280, part of the insulating film 254A, and part of the conductive layer 242B (the conductive layer 242B1 and the conductive layer 242B2) are processed to form an opening reaching the oxide 230b. The opening is preferably formed to overlap with the conductor 205. The conductor 242a (the conductor 242a1 and the conductor 242b2), the conductor 242b (the conductor 242b1 and the conductor 242b2), and the insulator 254 are formed by the formation of the opening. At this time, the thickness of the oxide 230b in a region overlapping with the opening might be reduced (see FIG. 7A to FIG. 7C).

Part of the insulator 280, part of the insulating film 254A, and part of the conductive layer 242B may be processed under different conditions. For example, part of the insulator 280 may be processed by a dry etching method, part of the insulating film 254A may be processed by a wet etching method, and part of the conductive layer 242B may be processed by a dry etching method.

Here, it is preferable to remove impurities that are attached onto the surfaces of the oxide 230a, the oxide 230b, and the like or diffused into the oxide 230a, the oxide 230b, and the like. The impurities result from components contained in the insulator 280, the insulating film 254A, and the conductive layer 242B; components contained in a member of an apparatus used to form the opening; and components contained in a gas or a liquid used for etching, for instance. Examples of the impurities include aluminum, silicon, tantalum, fluorine, and chlorine.

In order to remove the above impurities and the like, cleaning treatment may be performed. Examples of the cleaning method include wet cleaning using a cleaning solution and the like, plasma treatment using plasma, and cleaning by heat treatment, and any of these cleanings may be performed in appropriate combination.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

Next, heat treatment may be performed. The heat treatment is preferably performed in an atmosphere containing oxygen. Heat treatment may be performed under reduced pressure, and an oxide film 230C may be successively deposited without exposure to the air (see FIG. 8A to FIG. 8C). Such treatment can remove moisture and hydrogen adsorbed onto the surface of the oxide 230b and the like, and further can reduce the moisture concentration and the hydrogen concentration of the oxide 230a and the oxide 230b. The heat treatment is preferably performed at a temperature higher than or equal to 100° C. and lower than or equal to 400° C. In this embodiment, the heat treatment is performed at 200° C.

The oxide film 230C can be deposited by a sputtering method, a CVD method, an MBE method, a PLD method, an ALD method, or the like. The oxide film 230C is deposited by a deposition method similar to that for the oxide film 230A or the oxide film 230B depending on characteristics required for the oxide film 230C. In this embodiment, the oxide film 230C is deposited by a sputtering method using an In—Ga—Zn oxide target with In:Ga:Zn=1:3:4 [atomic ratio] or 4:2:4.1 [atomic ratio]. Alternatively, the oxide film 230C is deposited by a sputtering method in the following manner: a film is deposited using an In—Ga—Zn oxide target having an atomic ratio of In:Ga:Zn=4:2:4.1 [atomic ratio], and another film is deposited thereover using an In—Ga—Zn oxide target having an atomic ratio of In:Ga:Zn=1:3:4 [atomic ratio].

In particular, part of oxygen contained in the sputtering gas is supplied to the oxide 230a and the oxide 230b during the deposition of the oxide film 230C in some cases. Thus, the proportion of oxygen contained in the sputtering gas for the oxide film 230C is higher than or equal to 70%, preferably higher than or equal to 80%, further preferably 100%.

Next, heat treatment may be performed. Heat treatment may be performed under reduced pressure, and the insulating film 250A may be successively deposited without exposure to the air (see FIG. 9A to FIG. 9C). Such treatment can remove moisture and hydrogen adsorbed onto the surface of the oxide film 230C and the like, and further can reduce the moisture concentration and the hydrogen concentration of the oxide 230a, the oxide 230b, and the oxide film 230C. The heat treatment is preferably performed at a temperature higher than or equal to 100° C. and lower than or equal to 400° C.

The insulating film 250A can be deposited by a sputtering method, a CVD method, an MBE method, a PLD method, an ALD method, or the like. In this embodiment, for the insulating film 250A, silicon oxynitride is deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulating film having few impurities can be deposited.

Next, a conductive film 260A and a conductive film 260B are deposited in this order. The conductive film 260A and the conductive film 260B can be deposited by a sputtering method, a CVD method, an MBE method, a PLD method, an ALD method, or the like. In this embodiment, the conductive film 260A is deposited by an ALD method, and the conductive film 260B is deposited by a CVD method (see FIG. 10A to FIG. 10C).

Figure 11A:
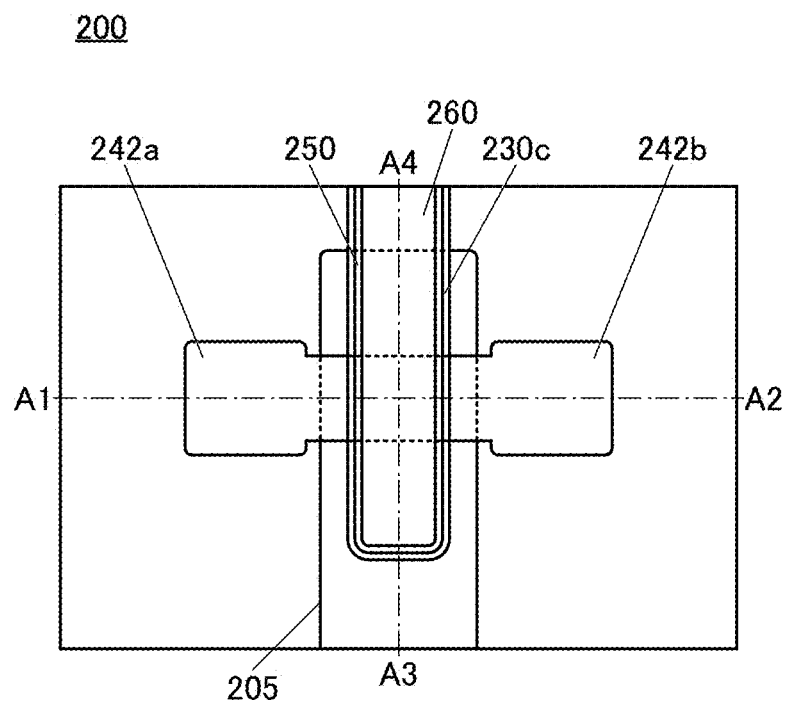
FIG. 11A is a top view illustrating a method for manufacturing a semiconductor device of one embodiment of the present invention.
Figure 11C:
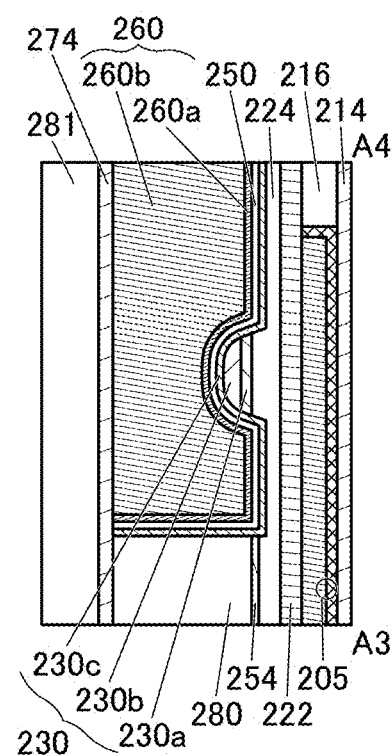
FIG. 11B and FIG. 11C are cross-sectional views illustrating the method for manufacturing a semiconductor device of one embodiment of the present invention.
Figure 11B:
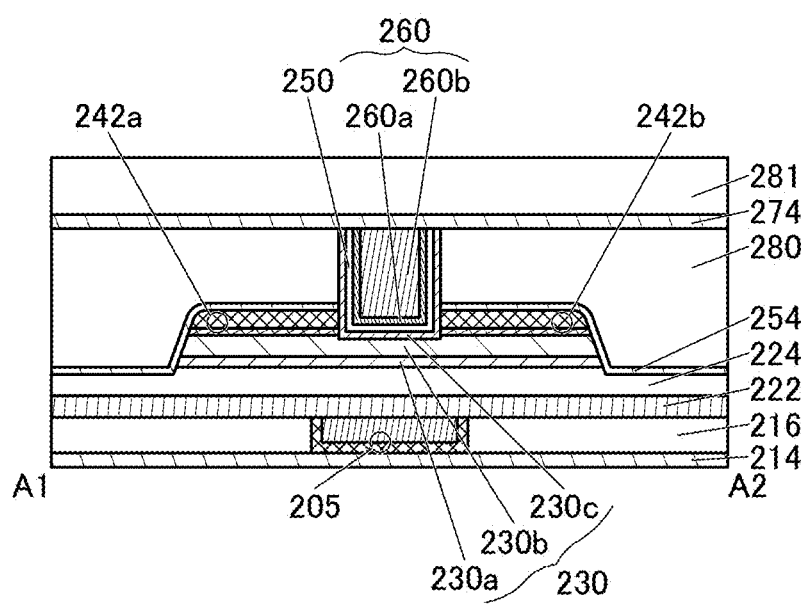

Then, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIG. 11A to FIG. 11C). Accordingly, the oxide 230c is positioned to cover the inner wall (the side wall and bottom surface) of the opening that reaches the oxide 230b. The insulator 250 is positioned to cover the inner wall of the opening with the oxide 230c therebetween. The conductor 260 is positioned to fill the opening with the oxide 230c and the insulator 250 therebetween.

Next, heat treatment may be performed. In this embodiment, treatment is performed at 400° C. in a nitrogen atmosphere for one hour. The heat treatment can reduce the moisture concentration and the hydrogen concentration of the insulator 250 and the insulator 280.

Next, the insulator 274 is deposited over the oxide 230c, the insulator 250, the conductor 260, and the insulator 280. The insulator 274 can be deposited by a sputtering method, a CVD method, an MBE method, a PLD method, an ALD method, or the like. An aluminum oxide film or a silicon nitride film is preferably deposited as the insulator 274 by a sputtering method, for example. When an aluminum oxide film or a silicon nitride film is deposited by a sputtering method, diffusion of hydrogen contained in the insulator 281 into the oxide 230 can be inhibited. Forming the insulator 274 to be in contact with the conductor 260 is preferable, in which case oxidation of the conductor 260 can be inhibited.

When an aluminum oxide film is formed as the insulator 274 by a sputtering method, oxygen can be supplied to the insulator 280. Oxygen supplied to the insulator 280 is sometimes supplied to the channel formation region included in the oxide 230b through the oxide 230c. Furthermore, when oxygen is supplied to the insulator 280, oxygen that is contained in the insulator 280 before the formation of the insulator 274 might be supplied to the channel formation region included in the oxide 230b through the oxide 230c.

In addition, the insulator 274 may have a multilayer structure. For example, a structure may be employed in which an aluminum oxide film is deposited by a sputtering method and a silicon nitride film is deposited over the aluminum oxide film by a sputtering method.

Next, heat treatment may be performed. For the heat treatment, the conditions for the above-described heat treatment can be used. The heat treatment can reduce the moisture concentration and the hydrogen concentration of the insulator 280. Moreover, oxygen contained in the insulator 274 can be injected into the insulator 280.

Before the insulator 274 is deposited, the following steps may be performed: first, an aluminum oxide film is deposited over the insulator 280 and the like by a sputtering method, heat treatment is performed under the above heat treatment conditions, and then the aluminum oxide film is removed by CMP treatment. Through these steps, a larger number of excess-oxygen regions can be formed in the insulator 280. Note that in these steps, part of the insulator 280, part of the conductor 260, part of the insulator 250, and part of the oxide 230c are removed in some cases.

An insulator may be provided between the insulator 280 and the insulator 274. As the insulator, silicon oxide deposited by a sputtering method can be used, for example. Providing the insulator can form an excess-oxygen region in the insulator 280.

Next, the insulator 281 may be deposited over the insulator 274. The insulator 281 can be deposited by a sputtering method, a CVD method, an MBE method, a PLD method, an ALD method, or the like (see FIG. 11B and FIG. 11C).

Next, openings reaching the conductor 242a (the conductor 242a1 and the conductor 242a2) and the conductor 242b (the conductor 242b1 and the conductor 242b2) are formed in the insulator 254, the insulator 280, the insulator 274, and the insulator 281. The openings are formed by a lithography method.

Next, an insulating film to be the insulator 241 is deposited and the insulating film is subjected to anisotropic etching, so that the insulator 241 is formed. The insulating film can be deposited by a sputtering method, a CVD method, an MBE method, a PLD method, an ALD method, or the like. As the insulating film, an insulating film having a function of inhibiting passage of oxygen is preferably used. For example, an aluminum oxide film is preferably deposited by an ALD method. Alternatively, a silicon nitride film may be deposited by an ALD method or a CVD method. For the anisotropic etching, a dry etching method or the like may be employed, for example. When the side wall portions of the openings have such a structure, passage of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, a conductive film to be the conductor 240a and the conductor 240b is deposited. The conductive film desirably has a stacked-layer structure that includes a conductor having a function of inhibiting diffusion of impurities such as water and hydrogen. For example, a stacked layer of tantalum nitride, titanium nitride, or the like and tungsten, molybdenum, copper, or the like can be employed. The conductive film can be deposited by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 1A and FIG. 1B). Note that the insulator 281 is partly removed by the CMP treatment in some cases.

Through the above steps, the semiconductor device including the transistor 200 illustrated in FIG. 1A to FIG. 1D can be manufactured.

According to one embodiment of the present invention, a semiconductor device with favorable reliability can be provided. According to another embodiment of the present invention, a semiconductor device having favorable electrical characteristics can be provided. According to one embodiment of the present invention, a semiconductor device with a high on-state current can be provided. According to another embodiment of the present invention, a semiconductor device that can be miniaturized or highly integrated can be provided. According to one embodiment of the present invention, a semiconductor device with low power consumption can be provided.

The structure, method, and the like described above in this embodiment can be used in appropriate combination with structures, methods, and the like described in the other embodiments and the examples.

Embodiment 2

Figure 12:
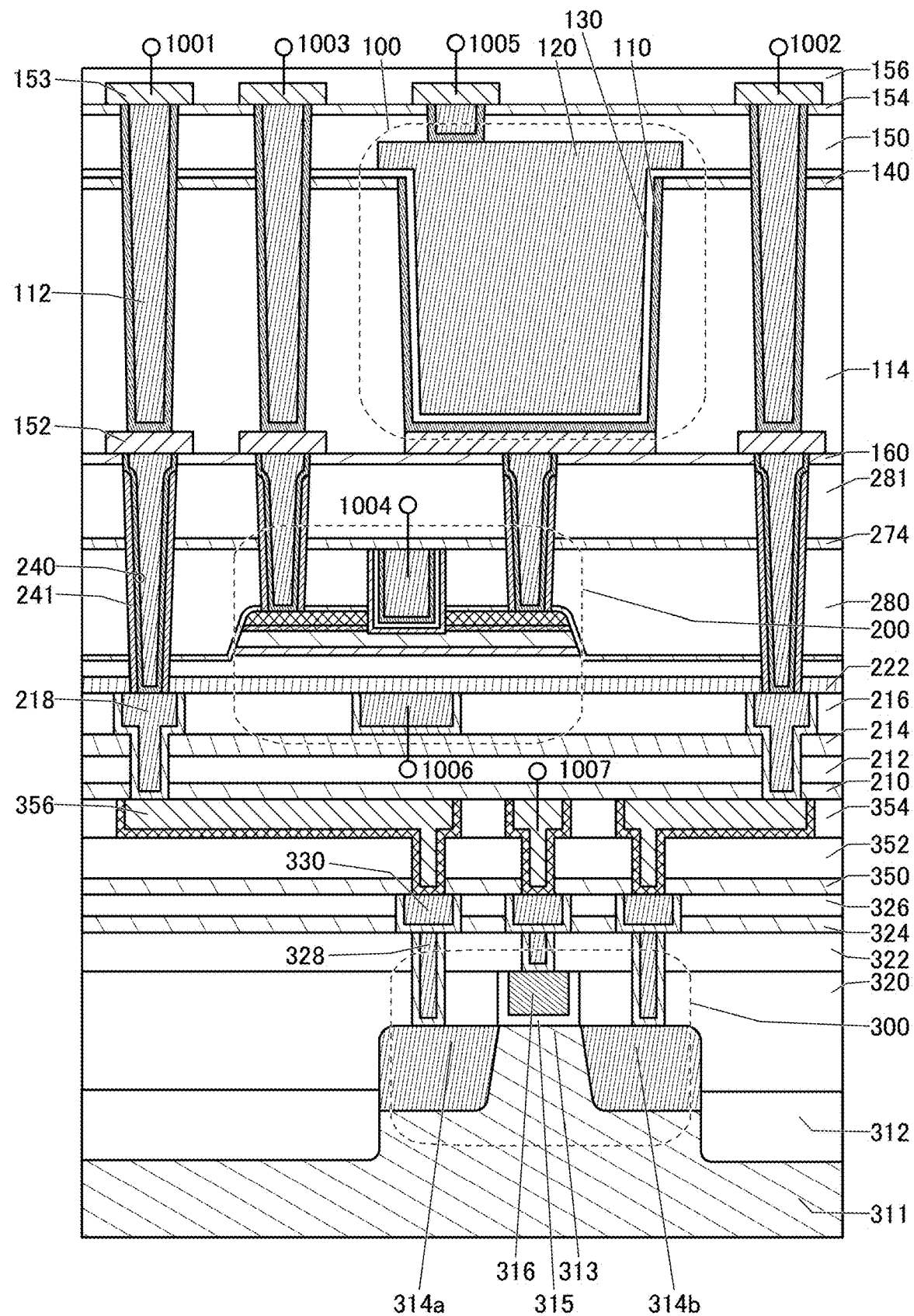
FIG. 12 is a cross-sectional view illustrating a structure of a memory device of one embodiment of the present invention.

In this embodiment, one embodiment of a semiconductor device is described with reference to FIG. 12 and FIG. 13.
[Memory Device 1]
FIG. 12 illustrates an example of a semiconductor device (memory device) using the semiconductor device of one embodiment of the present invention. In the semiconductor device of one embodiment of the present invention, the transistor 200 is provided above a transistor 300, and a capacitor 100 is provided above the transistor 200. Preferably, at least part of the capacitor 100 or the transistor 300 overlaps with the transistor 200. Accordingly, the area occupied by the capacitor 100, the transistor 200, and the transistor 300 in a top view can be reduced, so that the semiconductor device of this embodiment can achieve miniaturization or higher integration. Note that the semiconductor device in this embodiment can be applied to logic circuits typified by a CPU (Central Processing Unit) and a GPU (Graphics Processing Unit) and memory circuits typified by a DRAM (Dynamic Random Access Memory) and an NVM (Non-Volatile Memory), for example.

Note that the transistor 200 described in the above embodiment can be used as the transistor 200. Accordingly, for the transistor 200 and layers including the transistor 200, the description in the above embodiment can be referred to.

The transistor 200 is a transistor whose channel is formed in a semiconductor layer including an oxide semiconductor. Since the transistor 200 has a low off-state current, a memory device using the transistor 200 can retain stored data for a long time. In other words, such a memory device does not require refresh operation or has an extremely low frequency of the refresh operation, which leads to a sufficient reduction in power consumption of the memory device. The transistor 200 exhibits favorable electrical characteristics at high temperatures, in comparison with a transistor using silicon in a semiconductor layer. For example, the transistor 200 has favorable electrical characteristics even within the temperature range of 125° C. to 150° C. Moreover, the transistor 200 has an on/off ratio of 10 digits or larger within the temperature range of 125° C. to 150° C. In other words, in comparison with a transistor including silicon in a semiconductor layer, the transistor 200 excels in characteristics such as on-state current and frequency characteristics at higher temperatures.

In the semiconductor device illustrated in FIG. 12, a wiring 1001 is electrically connected to a source of the transistor 300, a wiring 1002 is electrically connected to a drain of the transistor 300, and a wiring 1007 is electrically connected to a gate of the transistor 300. A wiring 1003 is electrically connected to one of a source and a drain of the transistor 200, a wiring 1004 is electrically connected to a first gate of the transistor 200, and a wiring 1006 is electrically connected to a second gate of the transistor 200. The other of the source and the drain of the transistor 200 is electrically connected to one electrode of the capacitor 100, and a wiring 1005 is electrically connected to the other electrode of the capacitor 100.

The semiconductor device illustrated in FIG. 12 has characteristics of being able to retain charge stored in the one electrode of the capacitor 100 by switching of the transistor 200; thus, writing, retention, and reading of data can be performed. The transistor 200 is an element to which the back gate is provided in addition to the source, the gate (top gate), and the drain. That is, the transistor 200 is a four-terminal element; hence, its input and output can be controlled independently of each other in a simpler manner than that in two-terminal elements typified by MRAM (Magnetoresistive Random Access Memory) utilizing MTJ (Magnetic Tunnel Junction) properties, ReRAM (Resistive Random Access Memory), and phase-change memory. In addition, the structure of MRAM, ReRAM, and phase-change memory may change at the atomic level when data is rewritten. By contrast, in the semiconductor device illustrated in FIG. 12, data rewriting is performed by charging or discharging of electrons with the transistor and the capacitor; thus, the semiconductor device has characteristics such as high write endurance and a few structure changes.

Furthermore, by arranging the semiconductor devices illustrated in FIG. 12 in a matrix, a memory cell array can be formed. In this case, the transistor 300 can be used for a read circuit, a driver circuit, or the like that is connected to the memory cell array. As described above, the semiconductor device illustrated in FIG. 12 constitutes a memory cell array. In the case where the semiconductor device illustrated in FIG. 12 is used as a memory element, for example, an operation frequency of 200 MHz or higher can be achieved at a driving voltage of 2.5 V and an evaluation environment temperature within the range of −40° C. to 85° C.

<Transistor 300>

The transistor 300 is provided on a substrate 311 and includes a conductor 316 functioning as a gate electrode, an insulator 315 functioning as a gate insulator, a semiconductor region 313 that is formed of part of the substrate 311, and a low-resistance region 314a and a low-resistance region 314b functioning as a source region and a drain region.

Here, the insulator 315 is positioned over the semiconductor region 313, and the conductor 316 is positioned over the insulator 315. The transistors 300 formed in the same layer are electrically isolated from each other by an insulator 312 functioning as an element isolation insulating layer. The insulator 312 can be formed using an insulator similar to that used as an insulator 326 or the like described later. The transistor 300 may be a p-channel type or an n-channel type.

In the substrate 311, it is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor; and it is also preferable that single crystal silicon is included therein. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Here, in the transistor 300 illustrated in FIG. 12, the semiconductor region 313 (part of the substrate 311) in which a channel is formed has a convex shape. Furthermore, the conductor 316 is provided so as to cover a side surface and the top surface of the semiconductor region 313 with the insulator 315 positioned therebetween. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 12 is just an example and the structure is not limited thereto; an appropriate transistor may be used in accordance with a circuit structure or a driving method.

As illustrated in FIG. 12, the semiconductor device includes a stack of the transistor 300 and the transistor 200. For example, the transistor 300 can be formed using a silicon-based semiconductor material, and the transistor 200 can be formed using an oxide semiconductor. That is, in the semiconductor device illustrated in FIG. 12, a silicon-based semiconductor material and an oxide semiconductor can be used in different layers. The semiconductor device illustrated in FIG. 12 can be manufactured in a process similar to that employing an apparatus for manufacturing a semiconductor device containing a silicon-based semiconductor material, and can be highly integrated.

<Capacitor>

The capacitor 100 includes an insulator 114 over an insulator 160, an insulator 140 over the insulator 114, a conductor 110 positioned in an opening formed in the insulator 114 and the insulator 140, an insulator 130 over the conductor 110 and the insulator 140, a conductor 120 over the insulator 130, and an insulator 150 over the conductor 120 and the insulator 130. Here, at least parts of the conductor 110, the insulator 130, and the conductor 120 are positioned in the opening formed in the insulator 114 and the insulator 140.

The conductor 110 functions as a lower electrode of the capacitor 100, the conductor 120 functions as an upper electrode of the capacitor 100, and the insulator 130 functions as a dielectric of the capacitor 100. The capacitor 100 has a structure in which the upper electrode and the lower electrode face each other with the dielectric positioned therebetween on a side surface as well as the bottom surface of the opening in the insulator 114 and the insulator 140; thus, the capacitance per unit area can be increased. Accordingly, the deeper the opening is, the larger the capacitance of the capacitor 100 can be. Increasing the capacitance per unit area of the capacitor 100 in this manner can promote miniaturization or higher integration of a semiconductor device.

An insulator that can be used as the insulator 280 can be used as the insulator 114 and the insulator 150. The insulator 140 preferably functions as an etching stopper at the time of forming the opening in the insulator 114 and is formed using an insulator that can be used as the insulator 214.

The shape of the opening formed in the insulator 114 and the insulator 140 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 110 is positioned in contact with the opening formed in the insulator 140 and the insulator 114. The top surface of the conductor 110 is preferably substantially level with the top surface of the insulator 140. A conductor 152 provided over the insulator 160 is in contact with the bottom surface of the conductor 110. The conductor 110 is preferably deposited by an ALD method, a CVD method, or the like and is formed using a conductor that can be used as the conductor 205, for example.

The insulator 130 is positioned to cover the conductor 110 and the insulator 140. The insulator 130 is preferably deposited by an ALD method or a CVD method, for example. The insulator 130 can be provided to have a stacked-layer structure or a single-layer structure using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in this order can be used, for example.

For the insulator 130, a material with high dielectric strength, such as silicon oxynitride, or a high-permittivity (high-k) material is preferably used. Alternatively, a stacked-layer structure using a material with high dielectric strength and a high-permittivity (high-k) material may be employed.

Note that examples of the insulator with a high-permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material can secure sufficient capacitance of the capacitor 100 even when the insulator 130 has a large thickness. When the insulator 130 has a large thickness, leakage current generated between the conductor 110 and the conductor 120 can be inhibited.

Meanwhile, examples of the material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride deposited by an ALD method, silicon oxide deposited by a PEALD method, and silicon nitride deposited by an ALD method are stacked in this order. The use of such an insulator having high dielectric strength can increase the dielectric strength and inhibit electrostatic breakdown of the capacitor 100.

The conductor 120 is positioned to fill the opening formed in the insulator 140 and the insulator 114. The conductor 120 is electrically connected to the wiring 1005 through a conductor 112 and a conductor 153. The conductor 120 is preferably deposited by an ALD method, a CVD method, or the like and is formed using a conductor that can be used as the conductor 205, for example.

Since the transistor 200 has a structure in which an oxide semiconductor is used, the transistor 200 is highly compatible with the capacitor 100. Specifically, since the transistor 200 including an oxide semiconductor has a low off-state current, a combination of the transistor 200 and the capacitor 100 enables stored data to be retained for a long time.

<Wiring Layer>

Wiring layers provided with an interlayer film, a wiring, a plug, and the like may be provided between the components. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and the insulator 326 are stacked in this order over the transistor 300 as interlayer films. Moreover, a conductor 328, a conductor 330, and the like that are electrically connected to the conductor 153 functioning as a terminal are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 12, an insulator 350, an insulator 352, and an insulator 354 are provided to be stacked in this order. Furthermore, a conductor 356 is formed in the insulator 350, the insulator 352, and the insulator 354. The conductor 356 functions as a plug or a wiring.

An insulator 210, an insulator 212, the insulator 214, and the insulator 216 are stacked in this order over the insulator 354 and the conductor 356. In addition, a conductor 218, a conductor (the conductor 205) included in the transistor 200, and the like are embedded in the insulator 210, the insulator 212, the insulator 214, and the insulator 216. Note that the conductor 218 functions as a plug or a wiring that is electrically connected to the transistor 300.

The conductor 112, conductors included in the capacitor 100 (the conductor 120 and the conductor 110), and the like are embedded in the insulator 114, the insulator 140, the insulator 130, the insulator 150, and an insulator 154. Note that the conductor 112 functions as a plug or a wiring that electrically connects the capacitor 100, the transistor 200, or the transistor 300 to the conductor 153 functioning as a terminal.

The conductor 153 is provided over the insulator 154, and the conductor 153 is covered with an insulator 156. Here, the conductor 153 is in contact with the top surface of the conductor 112 and functions as a terminal of the capacitor 100, the transistor 200, or the transistor 300.

Examples of an insulator that can be used for an interlayer film include an oxide, a nitride, an oxynitride, a nitride oxide, a metal oxide, a metal oxynitride, and a metal nitride oxide, each of which has an insulating property. For example, when a material with a low relative permittivity is used for the insulator functioning as an interlayer film, the parasitic capacitance generated between wirings can be reduced. Thus, a material is preferably selected depending on the function of an insulator.

For example, for the insulator 320, the insulator 322, the insulator 326, the insulator 352, the insulator 354, the insulator 212, the insulator 114, the insulator 150, the insulator 156, and the like, an insulator with a low relative permittivity is preferably used. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

It is preferable that the resistivity of an insulator provided over or under the conductor 152 or the conductor 153 be higher than or equal to $1.0 \times 10^{12}$ Ωcm and lower than or equal to $1.0 \times 10^{15}$ Ωcm, preferably higher than or equal to $5.0 \times 10^{12}$ Ωcm and lower than or equal to $1.0 \times 10^{14}$ Ωcm, further preferably higher than or equal to $1.0 \times 10^{13}$ Ωcm and lower than or equal to $5.0 \times 10^{13}$ Ωcm. When the resistivity of the insulator provided over or under the conductor 152 or the conductor 153 is within the above range, the insulator can disperse charge accumulated between the transistor 200, the transistor 300, the capacitor 100, the conductor 152, and the like and can inhibit poor characteristics and electrostatic breakdown of the transistor and a semiconductor device including the transistor due to the charge, while maintaining the insulating property, which is preferable. For such an insulator, silicon nitride or silicon nitride oxide can be used. For example, the resistivity of the insulator 160 or the insulator 154 can be set within the above range.

Furthermore, when a transistor using an oxide semiconductor is surrounded by an insulator having a function of inhibiting passage of oxygen and impurities such as hydrogen, the electrical characteristics of the transistor can be stable. Thus, an insulator having a function of inhibiting passage of oxygen and impurities such as hydrogen is used as the insulator 324, the insulator 350, the insulator 210, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

As the conductors that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, the conductor 152, the conductor 153, and the like, a single layer or stacked layers of a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

<Wiring or Plug in Layer Provided with Oxide Semiconductor>

Note that in the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and a conductor provided in the insulator including the excess oxygen region.

For example, the insulator 241 is preferably provided between the insulator 280 including excess oxygen and the conductor 240 in FIG. 12. Since the insulator 241 is provided in contact with the insulator 274, the conductor 240 and the transistor 200 can be sealed by the insulators having a barrier property.

That is, when the insulator 241 is provided, absorption of excess oxygen contained in the insulator 280 by the conductor 240 can be inhibited. In addition, when the insulator 241 is included, diffusion of hydrogen, which is an impurity, into the transistor 200 through the conductor 240 can be inhibited.

Here, the conductor 240 functions as a plug or a wiring that is electrically connected to the transistor 200 or the transistor 300.

The above is the description of the structure example. With the use of this structure, the semiconductor device using the transistor including an oxide semiconductor can be miniaturized or highly integrated. Furthermore, a change in electrical characteristics can be reduced and reliability can be improved in a semiconductor device using a transistor including an oxide semiconductor. A transistor including an oxide semiconductor with a high on-state current can be provided. A transistor including an oxide semiconductor with low off-state current can be provided. A semiconductor device with low power consumption can be provided.

[Memory Device 2]

Figure 13:
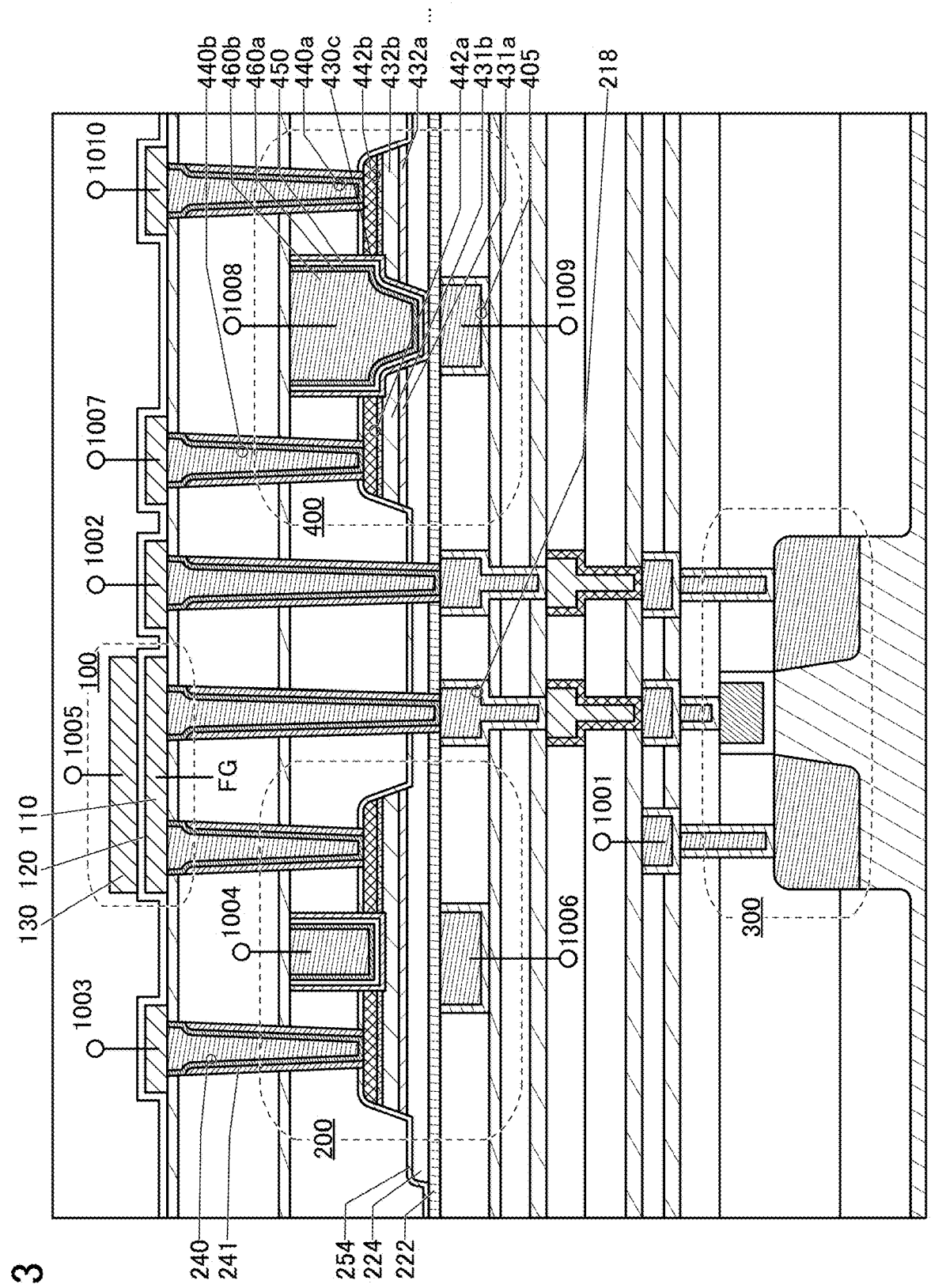
FIG. 13 is a cross-sectional view illustrating a structure of a memory device of one embodiment of the present invention.

FIG. 13 illustrates an example of a memory device using the semiconductor device of one embodiment of the present invention. The memory device illustrated in FIG. 13 includes a transistor 400 in addition to the semiconductor device including the transistor 200, the transistor 300, and the capacitor 100 illustrated in FIG. 12. The memory device illustrated in FIG. 13 differs from the memory device illustrated in FIG. 12 in that the capacitor 100 is a planar capacitor and that the transistor 200 is electrically connected to the transistor 300.

In the memory device of one embodiment of the present invention, the transistor 200 is provided above the transistor 300, and the capacitor 100 is provided above the transistor 300 and the transistor 200. Preferably, at least part of the capacitor 100 or the transistor 300 overlaps with the transistor 200. Accordingly, the area occupied by the capacitor 100, the transistor 200, and the transistor 300 in a top view can be reduced, so that the memory device of this embodiment can achieve miniaturization or higher integration.

The transistor 400 can control a second gate voltage of the transistor 200. For example, a first gate and a second gate of the transistor 400 are diode-connected to a source, and the source of the transistor 400 is connected to the second gate of the transistor 200. When a negative potential of the second gate of the transistor 200 is held in this structure, a first gate-source voltage and a second gate-source voltage of the transistor 400 are 0 V. In the transistor 400, a drain current when a second gate voltage and a first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

Hence, in FIG. 13, the wiring 1001 is electrically connected to the source of the transistor 300, and the wiring 1002 is electrically connected to the drain of the transistor 300. A wiring 1003 is electrically connected to one of the source and the drain of the transistor 200, the wiring 1004 is electrically connected to the first gate of the transistor 200, and the wiring 1006 is electrically connected to the second gate of the transistor 200. The gate of the transistor 300 and the other of the source and the drain of the transistor 200 are electrically connected to one electrode of the capacitor 100, and the wiring 1005 is electrically connected to the other electrode of the capacitor 100. The wiring 1007 is electrically connected to the source of the transistor 400, a wiring 1008 is electrically connected to the first gate of the transistor 400, a wiring 1009 is electrically connected to the second gate of the transistor 400, and a wiring 1010 is electrically connected to a drain of the transistor 400. Here, the wiring 1006, the wiring 1007, the wiring 1008, and the wiring 1009 are electrically connected to each other.

A node where the gate of the transistor 300, the other of the source and the drain of the transistor 200, and the one electrode of the capacitor 100 are connected to one another is referred to as a node FG in some cases. The semiconductor device illustrated in FIG. 13 has characteristics of being able to retain the potential of the gate (node FG) of the transistor 300 by switching of the transistor 200; thus, writing, retention, and reading of data can be performed.

Furthermore, by arranging the memory devices illustrated in FIG. 13 in a matrix like the memory devices illustrated in FIG. 12, a memory cell array can be formed. Note that one transistor 400 can control the second gate voltages of a plurality of transistors 200. For this reason, the number of transistors 400 is preferably smaller than the number of transistors 200.

Note that the transistor 200 and the transistor 300 described above in Memory device 1 can be used as the transistor 200 and the transistor 300, respectively. Accordingly, the description of Memory device 1 described above can be referred to for the transistor 200, the transistor 300, and the layers including these transistors.

The conductor 218 is embedded in the insulator 210, the insulator 212, the insulator 214, and the insulator 216. The conductor 218 functions as a plug or a wiring that is electrically connected to the capacitor 100, the transistor 200, the transistor 300, or the transistor 400. For example, the conductor 218 is electrically connected to the conductor 316 functioning as the gate electrode of the transistor 300.

The conductor 240 functions as a plug or a wiring that is electrically connected to the capacitor 100, the transistor 200, the transistor 300, or the transistor 400. For example, the conductor 240 electrically connects the conductor 242b functioning as the other of the source and the drain of the transistor 200 and the conductor 110 functioning as the one electrode of the capacitor 100.

The planar capacitor 100 is provided above the transistor 200. The capacitor 100 includes the conductor 110 functioning as a first electrode, the conductor 120 functioning as a second electrode, and the insulator 130 functioning as a dielectric. Note that as the conductor 110, the conductor 120, and the insulator 130, those described above in Memory device 1 can be used.

Although FIG. 13 illustrates an example in which a planar capacitor is used as the capacitor 100, the semiconductor device of this embodiment is not limited thereto. For example, the capacitor 100 may be a cylinder capacitor 100 like that illustrated in FIG. 12.

<Transistor 400>

The transistor 400 and the transistors 200 are formed in the same layer and thus can be fabricated in parallel. The transistor 400 includes a conductor 460 (a conductor 460a and a conductor 460b) functioning as a first gate; a conductor 405 functioning as a second gate; the insulator 222 and an insulator 450 each functioning as a gate insulator; an oxide 430c including a channel formation region; a conductor 442a, an oxide 431b, and an oxide 431a each functioning as a source; a conductor 442b, an oxide 432b, and an oxide 432a each functioning as a drain; and a conductor 440 (a conductor 440a and a conductor 440b) functioning as a plug.

The conductor 405 is formed in the same layer as the conductor 205. The oxide 431a and the oxide 432a are formed in the same layer as the oxide 230a, and the oxide 431b and the oxide 432b are formed in the same layer as the oxide 230b. The conductor 442a and the conductor 442b are formed in the same layer as the conductor 242. The oxide 430c is formed in the same layer as the oxide 230c. The insulator 450 is formed in the same layer as the insulator 250. The conductor 460 is formed in the same layer as the conductor 260.

Note that the components formed in the same layer can be formed at the same time. For example, the oxide 430c can be formed by processing an oxide film to be the oxide 230c.

In the oxide 430c functioning as an active layer of the transistor 400, oxygen vacancies are reduced and impurities such as hydrogen and water are reduced, as in the oxide 230 or the like. Accordingly, the threshold voltage of the transistor 400 can be further increased, the off-state current can be reduced, and the drain current when the second gate voltage and the first gate voltage are 0 V can be extremely low.

<Dicing Line>

A dicing line (referred to as a scribe line, a dividing line, or a cutting line in some cases) that is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 13, it is preferable to perform design so that a region in which the insulator 254 and the insulator 222 are in contact with each other is the dicing line. That is, an opening is provided in the insulator 224 in the vicinity of the region to be the dicing line that is provided in an outer edge of the transistor 400 and the memory cell including a plurality of transistors 200. The insulator 254 is provided to cover the side surface of the insulator 224.

That is, in the opening provided in the insulator 224, the insulator 222 is in contact with the insulator 254. For example, in this instance, the insulator 222 and the insulator 254 may be formed using the same material and the same method. When the insulator 222 and the insulator 254 are formed using the same material and the same method, the adhesion therebetween can be increased. For example, aluminum oxide is preferably used.

With this structure, the insulator 224, the transistor 200, and the transistor 400 can be enclosed with the insulator 222 and the insulator 254. Since the insulator 222 and the insulator 254 have a function of inhibiting diffusion of oxygen, hydrogen, and water even when the substrate is divided into circuit regions each of which is provided with the semiconductor elements in this embodiment to form a plurality of chips, the mixing and diffusion of impurities such as hydrogen or water from the direction of a side surface of the divided substrate to the transistor 200 or the transistor 400 can be inhibited.

Furthermore, with this structure, excess oxygen in the insulator 224 can be prevented from diffusing to the outside through the insulator 254 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in electrical characteristics of the transistors 200 or the transistor 400 can be inhibited and reliability can be improved.

This embodiment can be implemented in an appropriate combination with the structures described in the other embodiments, the examples, and the like.

Embodiment 3

In this embodiment, a memory device according to one embodiment of the present invention including a transistor in which an oxide is used for a semiconductor (hereinafter referred to as an OS transistor in some cases) and a capacitor (hereinafter referred to as an OS memory device in some cases), is described with reference to FIG. 14A, FIG. 14B and FIG. 15A to FIG. 15H. The OS memory device is a memory device including at least a capacitor and an OS transistor that controls the charging and discharging of the capacitor. Since the OS transistor has an extremely low off-state current, the OS memory device has excellent retention characteristics and thus can function as a nonvolatile memory.

Structure Example of Memory Device

Figure 14A:
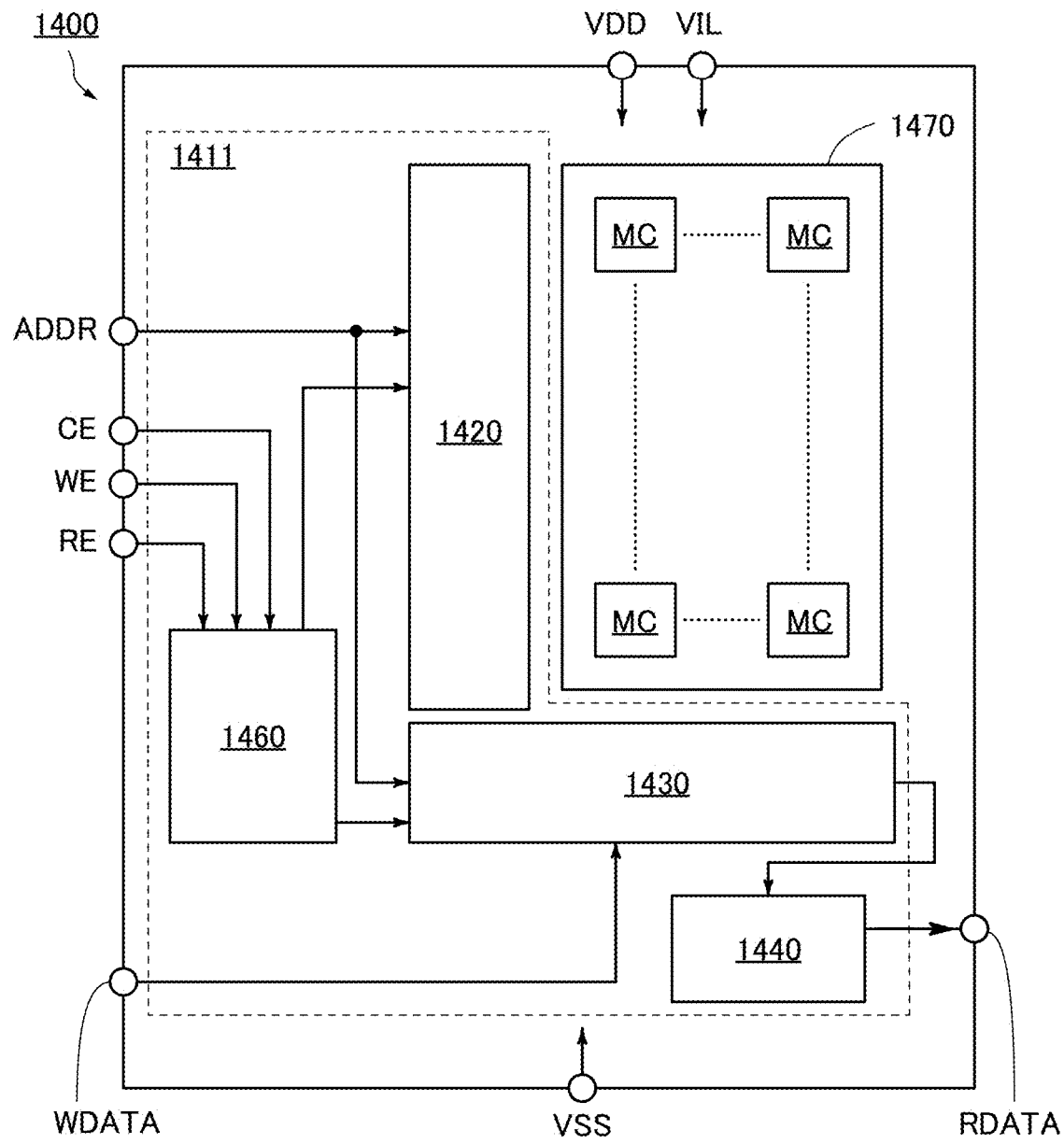
FIG. 14A and FIG. 14B are block diagrams illustrating a structure example of a memory device of one embodiment of the present invention.

FIG. 14A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are wirings connected to memory cells included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in one column, and the like. The number of the wirings that connect the memory cell array 1470 to the column circuit 1430 depends on the structure of the memory cell MC, the number of the memory cells MC in one row, and the like.

Figure 14B:
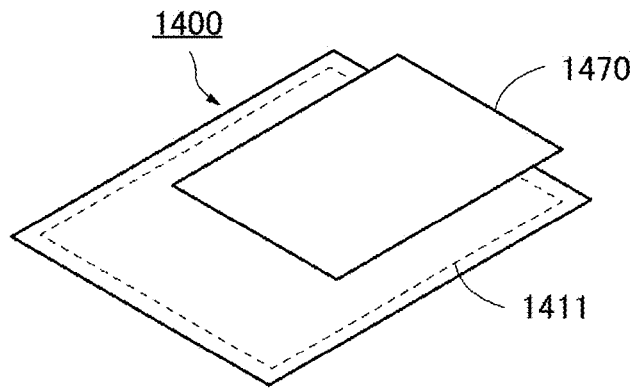

Note that FIG. 14A illustrates an example in which the peripheral circuit 1411 and the memory cell array 1470 are formed on the same plane; however, this embodiment is not limited thereto. For example, as illustrated in FIG. 14B, the memory cell array 1470 may be provided to overlap part of the peripheral circuit 1411. For example, the sense amplifier may be provided below the memory cell array 1470 so that they overlap with each other.

FIG. 15A to FIG. 15H illustrate structure examples of a memory cell that can be applied to the memory cell MC.

[DOSRAM]

Figure 15A:
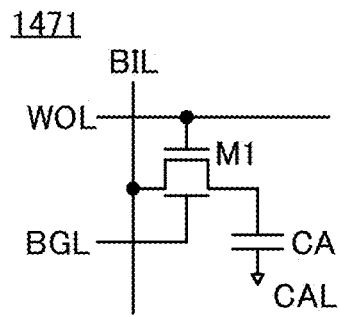
FIG. 15A to FIG. 15H are circuit diagrams illustrating structure examples of a memory device of one embodiment of the present invention.
Figure 15B:
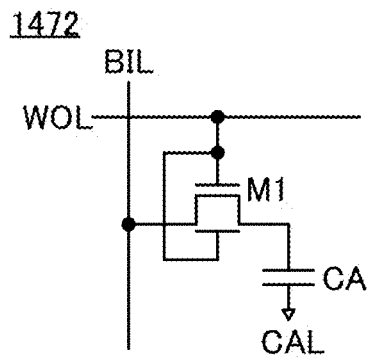
Figure 15C:
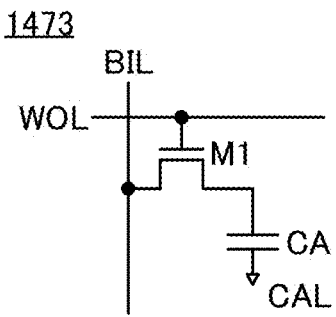

FIG. 15A to FIG. 15C each illustrate a circuit structure example of a memory cell of a DRAM. In this specification and the like, a DRAM using a memory cell including one OS transistor and one capacitor is referred to as DOSRAM (Dynamic Oxide Semiconductor Random Access Memory) in some cases. A memory cell 1471 illustrated in FIG. 15A includes a transistor M1 and a capacitor CA. Note that the transistor M1 includes a gate (also referred to as a top gate in some cases) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. At the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 illustrated in FIG. 15A corresponds to the memory device illustrated in FIG. 12. That is, the transistor M1, the capacitor CA, the wiring BIL, the wiring WOL, the wiring BGL, and the wiring CAL correspond to the transistor 200, the capacitor 100, the wiring 1003, the wiring 1004, the wiring 1006, and the wiring 1005, respectively. Note that the transistor 300 illustrated in FIG. 12 corresponds to a transistor provided in the peripheral circuit 1411 of the memory device 1400 illustrated in FIG. 14B.

The memory cell MC is not limited to the memory cell 1471, and the circuit structure can be changed. For example, as in a memory cell 1472 illustrated in FIG. 15B, the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 15C.

In the case where the semiconductor device described in the above embodiment is used in the memory cell 1471 or the like, the transistor 200 can be used as the transistor M1, and the capacitor 100 can be used as the capacitor CA. When an OS transistor is used as the transistor M1, the leakage current of the transistor M1 can be extremely low. That is, written data can be retained for a long time with the transistor M1; thus, the frequency of refresh of the memory cell can be reduced. Alternatively, the refresh operation of the memory cell can be omitted. In addition, since the transistor M1 has an extremely low leakage current, multi-level data or analog data can be retained in the memory cell 1471, the memory cell 1472, and the memory cell 1473.

In addition, in the DOSRAM, when the sense amplifier is provided below the memory cell array 1470 so that they overlap each other as described above, the bit line can be shortened. This reduces bit line capacity, which reduces the storage capacity of the memory cell.

[NOSRAM]

FIG. 15D to FIG. 15G each illustrate a circuit structure example of a gain-cell memory cell including two transistors and one capacitor. A memory cell 1474 illustrated in FIG. 15D includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB, a second terminal of the transistor M2 is connected to a wiring WBL, the gate of the transistor M2 is connected to the wiring WOL, and the back gate of the transistor M2 is connected to the wiring BGL. A second terminal of the capacitor CB is connected to the wiring CAL. A first terminal of the transistor M3 is connected to the wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 15D:
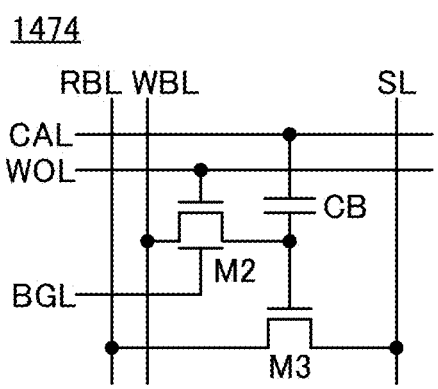
Figure 15E:
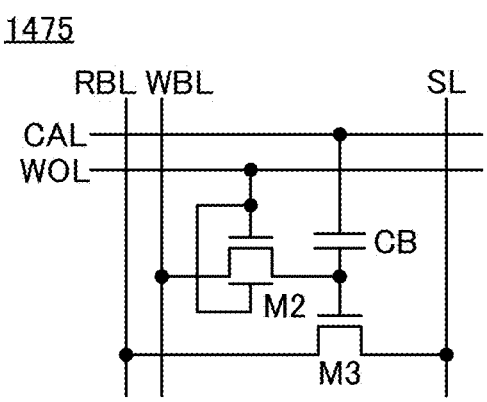
Figure 15F:
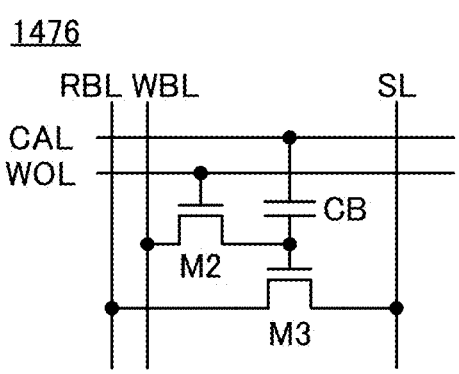
Figure 15G:
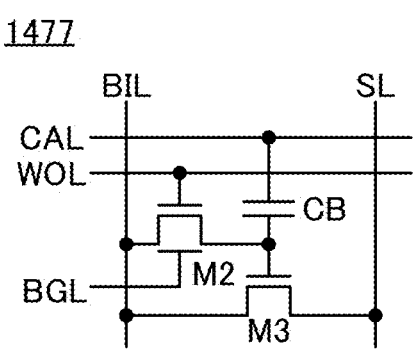

Here, the memory cell 1474 illustrated in FIG. 15D corresponds to the memory device illustrated in FIG. 13. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

In addition, the memory cell MC is not limited to the memory cell 1474, and the circuit structure can be changed as appropriate. For example, as in a memory cell 1475 illustrated in FIG. 15E, the back gate of the transistor M2 may be connected not to the wiring BGL but to the wiring WOL in the memory cell MC. Alternatively, for example, the memory cell MC may be a memory cell including a single-gate transistor, that is, the transistor M2 not including a back gate, as in a memory cell 1476 illustrated in FIG. 15F. Alternatively, for example, the memory cell MC may have a structure in which the wiring WBL and the wiring RBL are combined into one wiring BIL as in a memory cell 1477 illustrated in FIG. 15G.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the transistor M2; thus, the frequency of refresh of the memory cell can be reduced. Alternatively, the refresh operation of the memory cell can be omitted. In addition, since the transistor M2 has an extremely low leakage current, multilevel data or analog data can be retained in the memory cell 1474. The same applies to the memory cell 1475 to the memory cell 1477.

Note that the transistor M3 may be a transistor containing silicon in a channel formation region (hereinafter referred to as a Si transistor in some cases). The conductivity type of the Si transistor may be either an n-channel type or a p-channel type. A Si transistor has higher field-effect mobility than an OS transistor in some cases. Thus, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. In the case where an OS transistor is used as each of the transistor M2 and the transistor M3, the circuit of the memory cell array 1470 can be formed using only n-channel transistors.

Figure 15H:
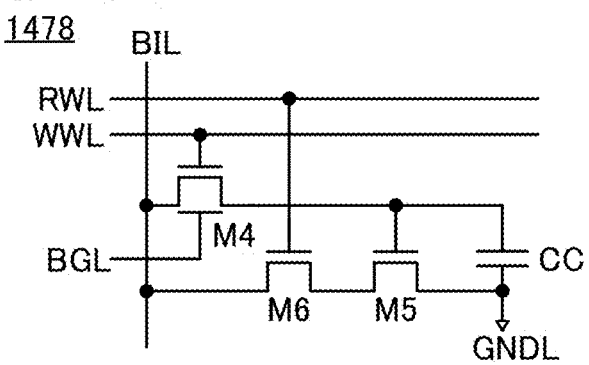

FIG. 15H illustrates an example of a gain-cell memory cell including three transistors and one capacitor. A memory cell 1478 illustrated in FIG. 15H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors. In this case, the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

The structure described in this embodiment can be used in an appropriate combination with the structures described in the other embodiments, examples, and the like.

Embodiment 4

In this embodiment, an example of a chip 1200 on which the semiconductor device of the present invention is mounted is described with reference to FIG. 16A and FIG. 16B. A plurality of circuits (systems) are mounted on the chip 1200. The technique for integrating a plurality of circuits (systems) on one chip is referred to as system on chip (SoC) in some cases.

Figure 16A:
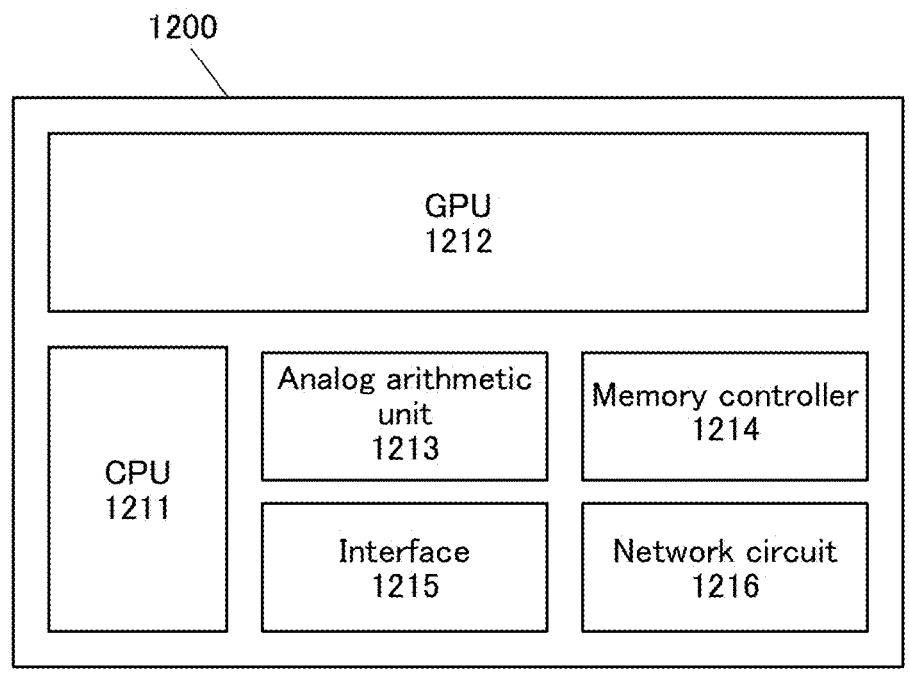
FIG. 16A and FIG. 16B are schematic views of a semiconductor device of one embodiment of the present invention.

As illustrated in FIG. 16A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 16B:
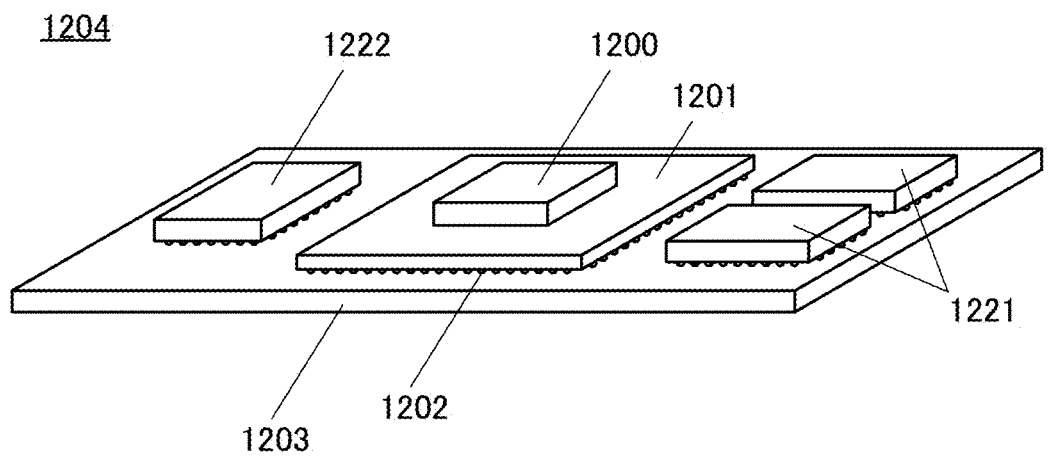

A bump (not illustrated) is provided on the chip 1200, and as illustrated in FIG. 16B, the chip 1200 is connected to a first surface of a printed circuit board (PCB) 1201. In addition, a plurality of bumps 1202 are provided on the rear side of the first surface of the PCB 1201 and are connected to a motherboard 1203.

Memory devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

Since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a circuit for a network such as a LAN (Local Area Network). The network circuit 1216 may further include a circuit for network security.

The circuits (systems) can be formed in the chip 1200 in the same manufacturing process. Therefore, even when the number of circuits needed for the chip 1200 increases, there is no need to increase the number of manufacturing processes; thus, the chip 1200 can be fabricated at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can execute a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments, examples, and the like.

Embodiment 5

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable memory devices such as memory cards (e.g., SD cards), USB memories, and SSDs (solid state drives). FIG. 17A to FIG. 17E schematically illustrate some structure examples of removable memory devices. The semiconductor device described in the above embodiment is processed into a packaged memory chip and used in a variety of storage devices and removable memories, for example.

Figure 17A:
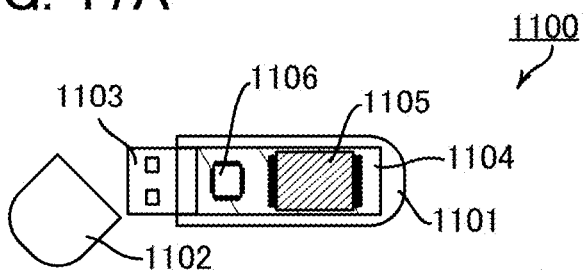
FIG. 17A to FIG. 17E are schematic views of a memory device of one embodiment of the present invention.

FIG. 17A is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like.

Figure 17B:
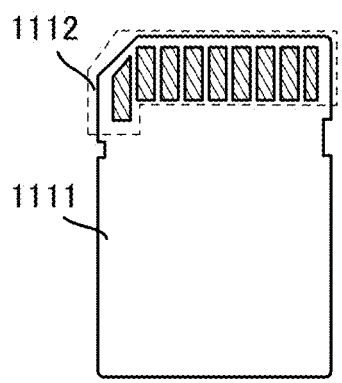
Figure 17C:
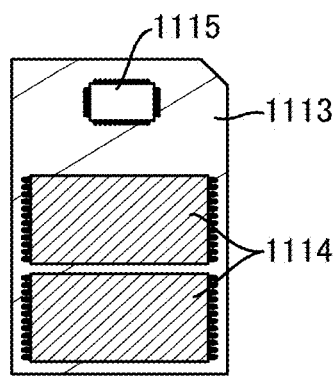

FIG. 17B is a schematic external view of an SD card, and FIG. 17C is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

Figure 17D:
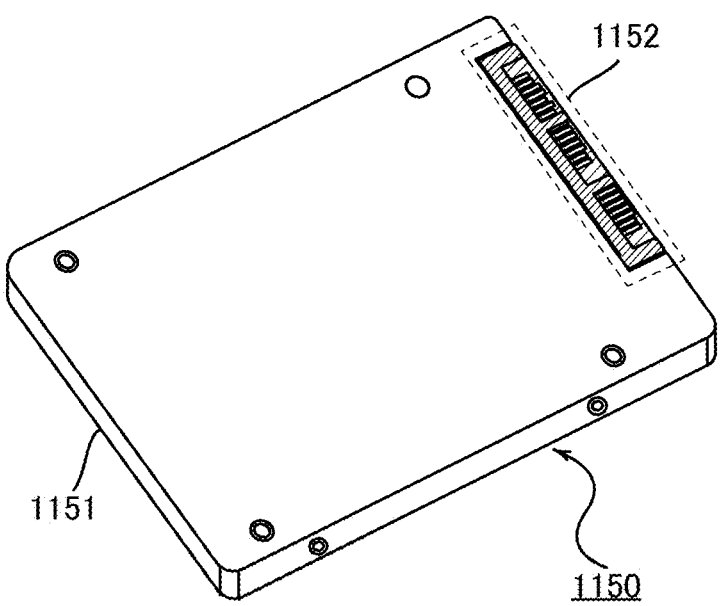
Figure 17E:
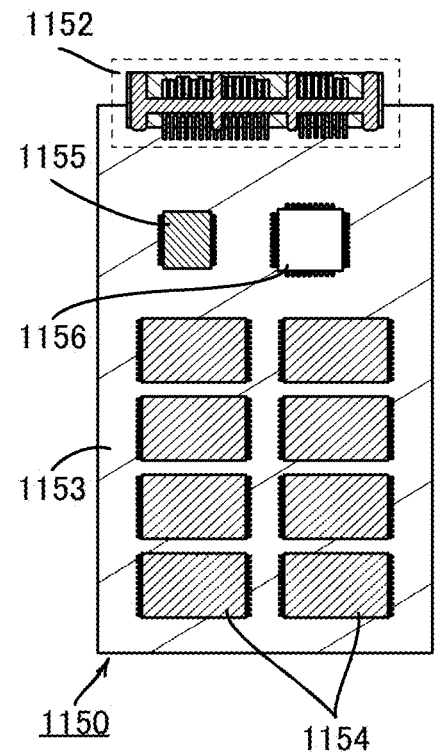

FIG. 17D is a schematic external view of an SSD, and FIG. 17E is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments, examples, and the like.

Embodiment 6

The semiconductor device according to one embodiment of the present invention can be used for a processor such as a CPU and a GPU or a chip. FIG. 18A to FIG. 18H illustrate specific examples of electronic devices including a chip or a processor such as a CPU or a GPU of one embodiment of the present invention.
<Electronic Device and System>

The GPU or the chip according to one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen such as a television device, a monitor for a desktop or notebook information terminal, digital signage, a large game machine like a pachinko machine or the like. When the GPU or the chip of one embodiment of the present invention is provided in the electronic device, an electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, electric power, radioactive rays, flow rate, humidity, gradient, oscillation, smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 18A to FIG. 18H illustrate examples of electronic devices.
[Information Terminal]

Figure 18A:
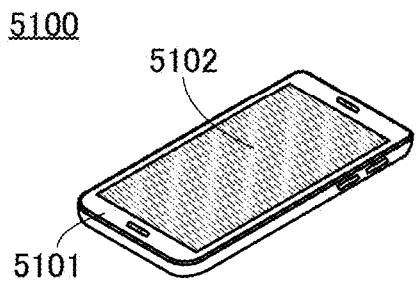
FIG. 18A to FIG. 18H are views illustrating electronic devices of one embodiment of the present invention.

FIG. 18A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

The information terminal 5100 can execute an application utilizing artificial intelligence, with the use of the chip of one embodiment of the present invention. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 18B:
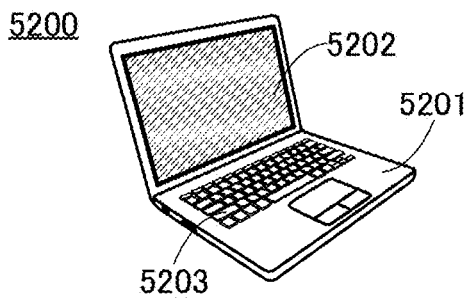

FIG. 18B illustrates a notebook information terminal 5200. The notebook information terminal 5200 includes a main body 5201 of the information terminal, a display portion 5202, and a keyboard 5203.

Like the information terminal 5100 described above, the notebook information terminal 5200 can execute an application utilizing artificial intelligence, with the use of the chip of one embodiment of the present invention. Examples of the application utilizing artificial intelligence include design-support software, text correction software, and software for automatic menu generation. Furthermore, with the use of the notebook information terminal 5200, novel artificial intelligence can be developed.

Note that although the smartphone and the notebook information terminal are respectively illustrated in FIG. 18A and FIG. 18B as examples of the electronic device, one embodiment of the present invention can be applied to an information terminal other than the smartphone and the notebook information terminal. Examples of information terminals other than the smartphone and the notebook information terminal include a PDA (Personal Digital Assistant), a desktop information terminal, and a workstation.

[Game Machines]

Figure 18C:
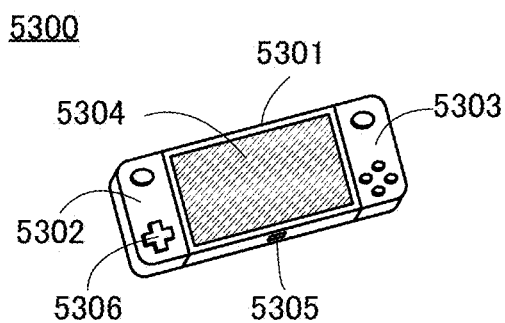

FIG. 18C illustrates a portable game machine 5300, which is an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into a chip provided on a substrate in the housing 5301, the housing 5302 and the housing 5303, for example.

Figure 18D:
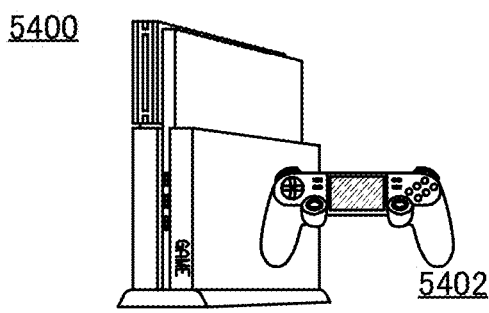

FIG. 18D illustrates a stationary game machine 5400, which is an example of a game machine. A controller 5402 is connected to the stationary game machine 5400 with or without a wire.

Using the GPU or the chip of one embodiment of the present invention in a game machine such as the portable game machine 5300 and the stationary game machine 5400 can achieve a low-power-consumption game machine. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of phenomenon and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

When a game requiring a plurality of players is played on the portable game machine 5300, the artificial intelligence can create a virtual game player; thus, the game can be played alone with the game player created by the artificial intelligence as an opponent.

Although the portable game machine and the stationary game machine are illustrated in FIG. 18C and FIG. 18D as examples of game machines, the game machine using the GPU or the chip of one embodiment of the present invention is not limited thereto. Examples of the game machine to which the GPU or the chip of one embodiment of the present invention is applied include an arcade game machine installed in entertainment facilities (e.g., a game center and an amusement park), and a throwing machine for batting practice installed in sports facilities.

[Large Computer]

The GPU or the chip of one embodiment of the present invention can be used in a large computer.

Figure 18E:
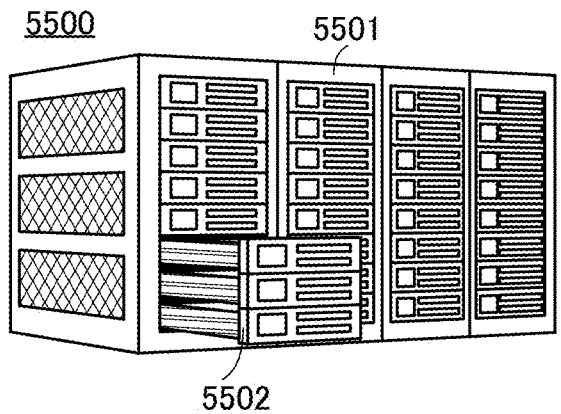
Figure 18F:
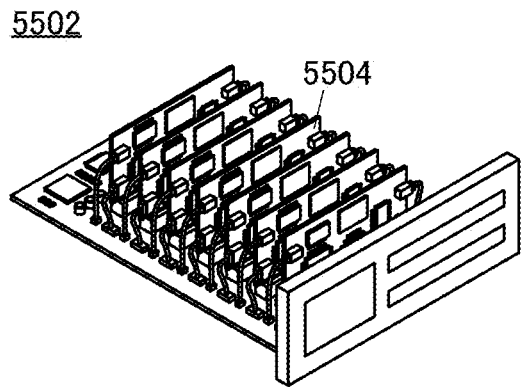

FIG. 18E illustrates a supercomputer 5500, which is an example of a large computer. FIG. 18F illustrates a rack-mount computer 5502 included in the supercomputer 5500.

The supercomputer 5500 includes a rack 5501 and a plurality of rack-mount computers 5502. Note that the plurality of computers 5502 are stored in the rack 5501. The computer 5502 includes a plurality of substrates 5504, and the GPU or the chip described in the above embodiment can be mounted on the substrates.

The supercomputer 5500 is a large computer mainly used for scientific computation. In scientific computation, an enormous amount of arithmetic operation needs to be processed at a high speed; hence, power consumption is high and chips generate a large amount of heat. Using the GPU or the chip of one embodiment of the present invention in the supercomputer 5500 can achieve a low-power-consumption supercomputer. Moreover, heat generation from a circuit can be reduced owing to low power consumption; thus, the influence of heat generation on the circuit, the peripheral circuit, and the module can be reduced.

Although a supercomputer is illustrated as an example of a large computer in FIG. 18E and FIG. 18F, a large computer using the GPU or the chip of one embodiment of the present invention is not limited thereto. Examples of a large computer using the GPU or the chip of one embodiment of the present invention include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 18G:
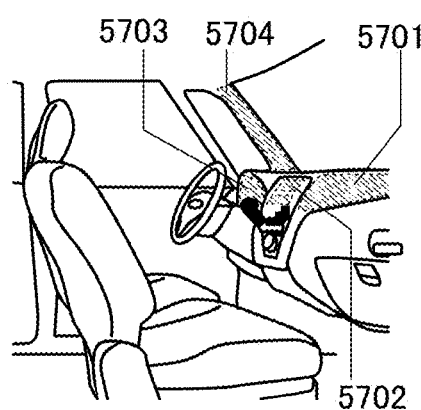

FIG. 18G illustrates the periphery of a windshield inside an automobile, which is an example of a moving vehicle. FIG. 18G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel meter, a gearshift indicator, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile. That is, displaying an image taken by the imaging device provided on the outside of the automobile leads to compensation for the blind spot and enhancement of safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, moving vehicles are not limited to an automobile. Examples of the moving vehicle include a train, a monorail train, a ship, and a flying object (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 18H:
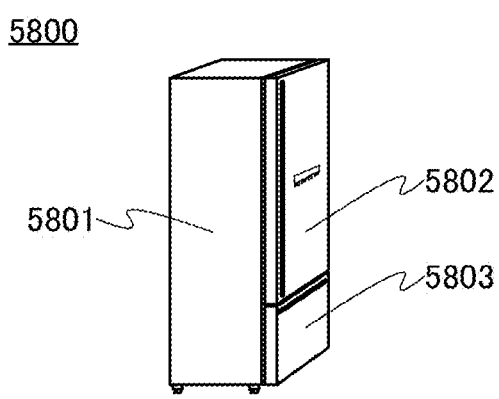

FIG. 18H illustrates an electric refrigerator-freezer 5800, which is an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as an example of a household appliance, other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in an appropriate combination with the structures described in the other embodiments, examples, and the like.

Example

In this example, easiness of formation of another layer at an interface between a metal oxide and a tantalum nitride, an oxidation resistance of the tantalum nitride, conductivity of the tantalum nitride, and the like in the stacked-layer structure of the metal oxide and the tantalum nitride were evaluated. Specifically, Samples (Sample 1A to Sample 5A) in each of which a tantalum nitride film was deposited over a metal oxide film and Samples (Sample 1B to Sample 5B) in each of which a tantalum nitride film was deposited over a metal oxide film and heat treatment was performed were subjected to various analyses, so that the thickness of an oxide film formed on a surface of tantalum nitride film, the thickness of a layer formed at an interface between the metal oxide film and the tantalum nitride film, the resistivity of the tantalum nitride film, and the like were calculated.

A method for fabricating Sample 1A to Sample 5A is described below.

A surface of a substrate containing silicon was subjected to heat treatment in a hydrogen chloride (HCl) atmosphere, and a 100-nm-thick silicon oxide film was formed over the substrate. Next, a 15-nm-thick metal oxide film was deposited over the silicon oxynitride film by a sputtering method. In the deposition of the metal oxide film, an oxide target with In:Ga:Zn=4:2:4.1 [atomic ratio] was used; an oxygen gas at 45 sccm was used as a deposition gas; the deposition pressure was 0.7 Pa; the deposition power was 0.5 kW; the substrate temperature was 200° C.; and the distance between the oxide target and the substrate was 60 mm.

Next, a 100-nm-thick tantalum nitride film was deposited over the metal oxide film by a sputtering method. In the deposition of the tantalum nitride film, a metal tantalum target was used; the deposition pressure was 0.6 Pa; the deposition power was 1 kW; the substrate temperature was room temperature (R.T.); and the distance between the target and the substrate was 60 mm.

Note that the flow rate of deposition gas used to deposit the tantalum nitride film was different between Sample 1A to Sample 5A. Specifically, for Sample 1A, an argon gas at 55 sccm and a nitrogen gas at 5 sccm were used. For Sample 2A, an argon gas at 50 sccm and a nitrogen gas at 10 sccm were used. For Sample 3A, an argon gas at 40 sccm and a nitrogen gas at 20 sccm were used. For Sample 4A, an argon gas at 30 sccm and a nitrogen gas at 30 sccm were used. For Sample 5A, an argon gas at 10 sccm and a nitrogen gas at 50 sccm were used.

Through the above steps, Sample 1A to Sample 5A were fabricated.

Note that the higher the flow rate ratio of the nitrogen gas to the deposition gases is, the higher the atomic ratio of nitrogen to tantalum in the tantalum nitride film is. Accordingly, the atomic ratio of nitrogen to tantalum in the tantalum nitride film is high in the following order: Sample 5A, Sample 4A, Sample 3A, Sample 2A, and Sample 1A.

A method for fabricating Sample 1B to Sample 5B is described below. Note that the steps up to and including the step of depositing the tantalum nitride film in the method for fabricating Sample 1B to Sample 5B are the same as those in the method for fabricating Sample 1A to Sample 5A.

Next, heat treatment was performed. As the heat treatment, treatment was performed at a temperature of 400° C. in an oxygen atmosphere for one hour. Note that Sample 1B is a sample that had the same structure as Sample 1A and was subjected to the heat treatment. Sample 2B is a sample that had the same structure as Sample 2A and was subjected to the heat treatment. Sample 3B is a sample that had the same structure as Sample 3A and was subjected to the heat treatment. Sample 4B is a sample that had the same structure as Sample 4A and was subjected to the heat treatment. Sample 5B is a sample that had the same structure as Sample 5A and was subjected to the heat treatment.

Through the above steps, Sample 1B to Sample 5B were fabricated.

Note that as in the case of Sample 1A to Sample 5A, the atomic ratio of nitrogen to tantalum in the tantalum nitride film is high in the following order: Sample 5B, Sample 4B, Sample 3B, Sample 2B, and Sample 1B.

<Analysis by X-Ray Diffraction>

Results of X-ray diffraction (XRD) measurement performed on Sample 1A to Sample 5A are described.

In this example, as an XRD apparatus, D8 DISCOVER Hybrid manufactured by Bruker Corporation was used. The conditions were as follows: scanning was performed by an out-of-plane method at θ/2θ; the scanning range was 15 deg. to 80 deg.; the step width was 0.02 deg.; and the accumulation time per point was 0.1 second.

FIG. 19A to FIG. 19E show the results of XRD spectra obtained by an out-of-plane measurement. FIG. 19A shows an XRD spectrum of Sample 1A, FIG. 19B shows an XRD spectrum of Sample 2A, FIG. 19C shows an XRD spectrum of Sample 3A, FIG. 19D shows an XRD spectrum of Sample 4A, and FIG. 19E shows an XRD spectrum of Sample 5A. In FIG. 19A to FIG. 19E, the horizontal axis represents 2θ [deg.] and the vertical axis represents intensity [a.u.]. The dashed lines shown around 2θ=35 deg. and 2θ=40 deg. represent peak positions indicating crystallinity of tantalum nitride.

It is found from FIG. 19A to FIG. 19E that all the tantalum nitride films of Sample 1A to Sample 5A include crystallinity.

<Cross-Sectional STEM Images and EDX Analysis>

Next, observation results of Sample 1B to Sample 5B with a scanning transmission electron microscope (STEM) and analysis results of Sample 1B to Sample 5B with energy dispersive X-ray spectroscopy (EDX) are described.

In this example, cross-sectional STEM images were taken and a composition line analysis was performed by EDX at accelerating voltage of 200 kV using "HD-2700" manufactured by Hitachi High-Technologies Corporation.

Note that the composition line analysis by EDX was performed to calculate the thickness of the layer formed at the interface between the metal oxide film and the tantalum nitride film. Here, the thickness of the layer is a difference between the position of the interface between the layer and the metal oxide film and the position of the interface between the bottom surface of the tantalum nitride film and the layer. Specifically, the layer and its vicinity are subjected to EDX line analysis, with the direction perpendicular to the substrate surface as the depth direction. Next, in the profile of quantitative values of elements in the depth direction, which is obtained from the analysis, the depth (position) of the interface between the layer and the metal oxide film is regarded as a depth at which the quantitative value of a metal that is the main component of the metal oxide film but is not the main component of the tantalum nitride film (in this example, gallium) becomes half In addition, the depth (position) of the interface between the bottom surface of the tantalum nitride film and the layer is regarded as a depth at which the quantitative value of oxygen in the metal oxide film becomes half. In this manner, the thickness of the layer can be calculated.

Figures 20A, 20B, 20C, 20D, 20E:
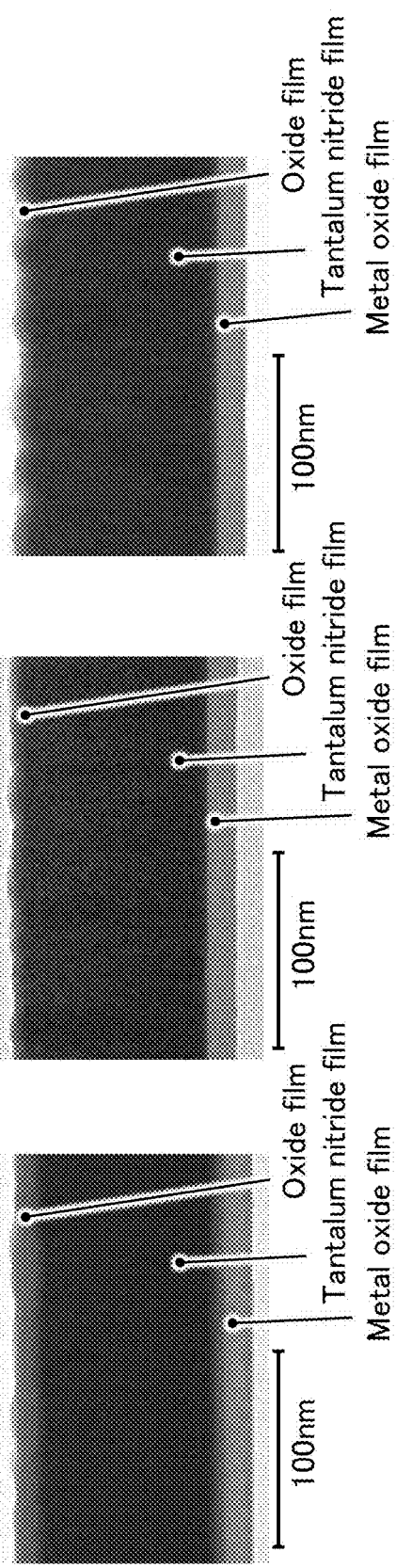
FIG. 20A to FIG. 20E are views showing cross-sectional STEM images of samples in Example.
Figure 21:
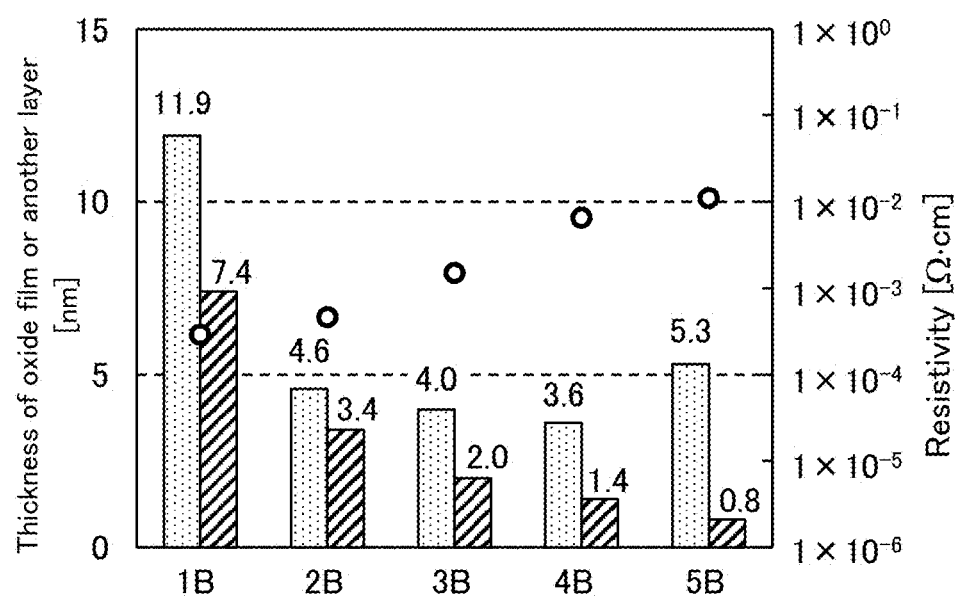
FIG. 21 is a graph showing calculation results of thicknesses of an oxide film and a layer and resistivity of each sample in Example.

FIG. 20A to FIG. 20E show the taken cross-sectional STEM images. FIG. 20A shows a cross-sectional STEM image of Sample 1B, FIG. 20B shows a cross-sectional STEM image of Sample 2B, FIG. 20C shows a cross-sectional STEM image of Sample 3B, FIG. 20D shows a cross-sectional STEM image of Sample 4B, and FIG. 20E shows a cross-sectional STEM image of Sample 5B. Note that the cross-sectional STEM images shown in FIG. 20A to FIG. 20E are phase contrast images (TE images). The thickness of the oxide film formed on the surface of tantalum nitride film was measured using the cross-sectional STAEM images shown in FIG. 20A to FIG. 20E FIG. 21 shows calculation results of the thickness of the oxide film formed on the surface of the tantalum nitride film. In FIG. 21, a bar graph shown on the left side of each sample indicates the thickness [nm] of the oxide film. The thickness of the oxide film in Sample 1B was 11.9 nm, the thickness of the oxide film in Sample 2B was 4.6 nm, the thickness of the oxide film in Sample 3B was 4.0 nm, the thickness of the oxide film in Sample 4B was 3.6 nm, and the thickness of the oxide film in Sample 5B was 5.3 nm.

From the above, it was confirmed that as the atomic ratio of nitrogen to tantalum in the tantalum nitride film is higher, the thickness of the oxide film tends to be small. Thus, in the tantalum nitride film, as the atomic ratio of nitrogen to tantalum is higher, the oxide film is less likely to be formed on the surface of the tantalum nitride film; that is, it is suggested that as the atomic ratio of nitrogen to tantalum is higher, the tantalum nitride film is less likely to be oxidized.

FIG. 21 shows calculation results of the thickness of the layer formed at the interface between the metal oxide film and the tantalum nitride film. In FIG. 21, a bar graph shown on the right side of each sample indicates the thickness [nm] of the layer. The thickness of the layer in Sample 1B was 7.4 nm, the thickness of the layer in Sample 2B was 3.4 nm, the thickness of the layer in Sample 3B was 2.0 nm, the thickness of the layer in Sample 4B was 1.4 nm, and the thickness of the layer in Sample 5B was 0.8 nm.

From the above, it was confirmed that as the atomic ratio of nitrogen to tantalum in the tantalum nitride film is higher, the thickness of the layer tends to be small. Thus, in the tantalum nitride film, it is suggested that as the atomic ratio of nitrogen to tantalum is higher, a layer is less likely to be formed between the tantalum nitride film and the metal oxide.

<Resistivity>

Next, resistivity of the tantalum nitride film of each of Sample 1B to Sample 5B was calculated. Specifically, in each of Sample 1B to Sample 5B, the resistivity of the tantalum nitride film was calculated by measuring sheet resistances at five points in a plate per sample, calculating an average value of the sheet resistances obtained at five points, and converting the calculated average value into 100 nm that is an intended thickness. Note that the resistivity processor (product name: Σ-10) manufactured by NPS, INC. was used for the measurement.

FIG. 21 shows calculation results of the resistivity of the tantalum nitride film. In FIG. 21, a circle mark for each sample indicates resistivity [Ω·cm] of the tantalum nitride film. The resistivity of the tantalum nitride film in Sample 1B was $2.9 \times 10^{-4}$ Ω·cm, the resistivity of the tantalum nitride film in Sample 2B was $4.6 \times 10^{-4}$ Ω·cm, the resistivity of the tantalum nitride film in Sample 3B was $1.5 \times 10^{-3}$ Ω·cm, the resistivity of the tantalum nitride film in Sample 4B was $6.5 \times 10^{-3}$ Ω·cm, and the resistivity of the tantalum nitride film in Sample 5B was $1.1 \times 10^{-2}$ Ω·cm.

From the above, it was confirmed that as the atomic ratio of nitrogen to tantalum in the tantalum nitride film is lower, the resistivity of the tantalum nitride film tends to be small.

Thus, in the tantalum nitride film, it is suggested that as the atomic ratio of nitrogen to tantalum is lower, the conductivity of the tantalum nitride film becomes high.

At least part of the structure, the method, and the like described in this example can be implemented in appropriate combination with other embodiments described in this specification.

REFERENCE NUMERALS

100: capacitor, 110: conductor, 112: conductor, 114: insulator, 120: conductor, 130: insulator, 140: insulator, 150: insulator, 152: conductor, 153: conductor, 154: insulator, 156: insulator, 160: insulator, 200: transistor, 205: conductor, 210: insulator, 212: insulator, 214: insulator, 216: insulator, 218: conductor, 222: insulator, 224: insulator, 230: oxide, 230a: oxide, 230A: oxide film, 230b: oxide, 230B: oxide film, 230c: oxide, 230C: oxide film, 231: region, 231a: region, 231b: region, 234: region, 240: conductor, 240a: conductor, 240b: conductor, 241: insulator, 241a: insulator, 241b: insulator, 242: conductor, 242a: conductor, 242a1: conductor, 242a2: conductor, 242a3: conductor, 242A: conductive film, 242A1: conductive film, 242A2: conductive film, 242b: conductor, 242b1: conductor, 242b2: conductor, 242b3: conductor, 242B: conductive layer, 242B1: conductive layer, 242B2: conductive layer, 250: insulator, 250A: insulating film, 254: insulator, 254A: insulating film, 260: conductor, 260a: conductor, 260A: conductive film, 260b: conductor, 260B: conductive film, 274: insulator, 280: insulator, 281: insulator, 300: transistor, 311: substrate, 312: insulator, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 430c: oxide, 431a: oxide, 431b: oxide, 432a: oxide, 432b: oxide, 440: conductor, 440a: conductor, 440b: conductor, 442a: conductor, 442b: conductor, 450: insulator, 460: conductor, 460a: conductor, 460b: conductor, 1001: wiring, 1002: wiring, 1003: wiring, 1004: wiring, 1005: wiring, 1006: wiring, 1007: wiring, 1008: wiring, 1009: wiring, 1010: wiring.

The invention claimed is:
1. A semiconductor device comprising:
a first oxide;
a second oxide over the first oxide;
a first insulator over the second oxide;
a first conductor over the first insulator; and
a second conductor and a third conductor over the second oxide,
wherein the second conductor comprises a first region and a second region,
wherein the third conductor comprises a third region and a fourth region,
wherein the second region is positioned above the first region,
wherein the fourth region is positioned above the third region,
wherein each of the second conductor and the third conductor comprises tantalum and nitrogen,
wherein an atomic ratio of nitrogen to tantalum in the first region is higher than an atomic ratio of nitrogen to tantalum in the second region,
wherein an atomic ratio of nitrogen to tantalum in the third region is higher than an atomic ratio of nitrogen to tantalum in the fourth region, wherein the second conductor further comprises a fifth region,
wherein the third conductor further comprises a sixth region,
wherein the fifth region is positioned above the second region,
wherein the sixth region is positioned above the fourth region,
wherein an atomic ratio of nitrogen to tantalum in the fifth region is higher than the atomic ratio of nitrogen to tantalum in the second region, and
wherein an atomic ratio of nitrogen to tantalum in the sixth region is higher than the atomic ratio of nitrogen to tantalum in the fourth region.

2. The semiconductor device according to claim 1, wherein a second insulator is provided over the second conductor and the third conductor.

3. The semiconductor device according to claim 1, wherein the first oxide comprises indium, an element M, and zinc, and
wherein M is aluminum, gallium, yttrium, or tin.

4. A semiconductor device comprising:
a first oxide;
a first insulator over the first oxide;
a first conductor over the first insulator; and
a second conductor and a third conductor over the first oxide,
wherein the second conductor comprises a first region and a second region,
wherein the third conductor comprises a third region and a fourth region,
wherein the second region is positioned above the first region,
wherein the fourth region is positioned above the third region,
wherein each of the second conductor and the third conductor comprises tantalum and nitrogen,
wherein an atomic ratio of nitrogen to tantalum in the first region is higher than an atomic ratio of nitrogen to tantalum in the second region,
wherein an atomic ratio of nitrogen to tantalum in the third region is higher than an atomic ratio of nitrogen to tantalum in the fourth region,
wherein the second conductor further comprises a fifth region,
wherein the third conductor further comprises a sixth region,
wherein the fifth region is positioned above the second region,
wherein the sixth region is positioned above the fourth region,
wherein an atomic ratio of nitrogen to tantalum in the fifth region is higher than the atomic ratio of nitrogen to tantalum in the second region, and
wherein an atomic ratio of nitrogen to tantalum in the sixth region is higher than the atomic ratio of nitrogen to tantalum in the fourth region.

* * * * *